United States Patent
Krall et al.

(10) Patent No.: US 9,184,420 B2
(45) Date of Patent: Nov. 10, 2015

(54) DIGITIZED OLED LIGHT SOURCE

(75) Inventors: Emory Krall, Ewing, NJ (US); Huiqing Pang, Ewing, NJ (US); Ruiqing Ma, Ewing, NJ (US); Peter Levermore, Ewing, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 14/346,561

(22) PCT Filed: Sep. 23, 2011

(86) PCT No.: PCT/US2011/053099
§ 371 (c)(1),
(2), (4) Date: Mar. 21, 2014

(87) PCT Pub. No.: WO2013/043197
PCT Pub. Date: Mar. 28, 2013

(65) Prior Publication Data
US 2014/0231788 A1     Aug. 21, 2014

(51) Int. Cl.
*H01L 29/08* (2006.01)
*H01L 51/56* (2006.01)
*H01L 27/32* (2006.01)

(52) U.S. Cl.
CPC ............ *H01L 51/56* (2013.01); *H01L 27/3211* (2013.01); *H01L 27/3239* (2013.01)

(58) Field of Classification Search
CPC .. H01L 27/3239; H01L 27/3211; H01L 51/56
USPC .......................................... 257/81, 40, 98, 99
See application file for complete search history.

(56) References Cited

U.S. PATENT DOCUMENTS

2005/0104508 A1*   5/2005   Ozawa et al. ................. 313/500

FOREIGN PATENT DOCUMENTS

WO      WO2010/019347       *   2/2010

* cited by examiner

*Primary Examiner* — Hung Vu
(74) *Attorney, Agent, or Firm* — Morris & Kamlay LLP

(57) ABSTRACT

Embodiments described herein may provide for devices comprising a digitized OLED light source (900) and/or methods of manufacturing such devices. In some embodiments, a first method may be provided. The first method may include the steps of depositing a first conductive layer (902) over a substrate (901), depositing a first organic layer (904) comprising electroluminescent material over the first conductive layer, and depositing a first patterned image layer (903) over some but not all of the first conductive layer. The first patterned image layer may locally alter the emissive properties of the first organic layer, and the shape of the first patterned image layer may be based on a non-uniform visual image. The first method may further comprise the step of depositing a second conductive layer (905) over the first organic layer.

19 Claims, 27 Drawing Sheets

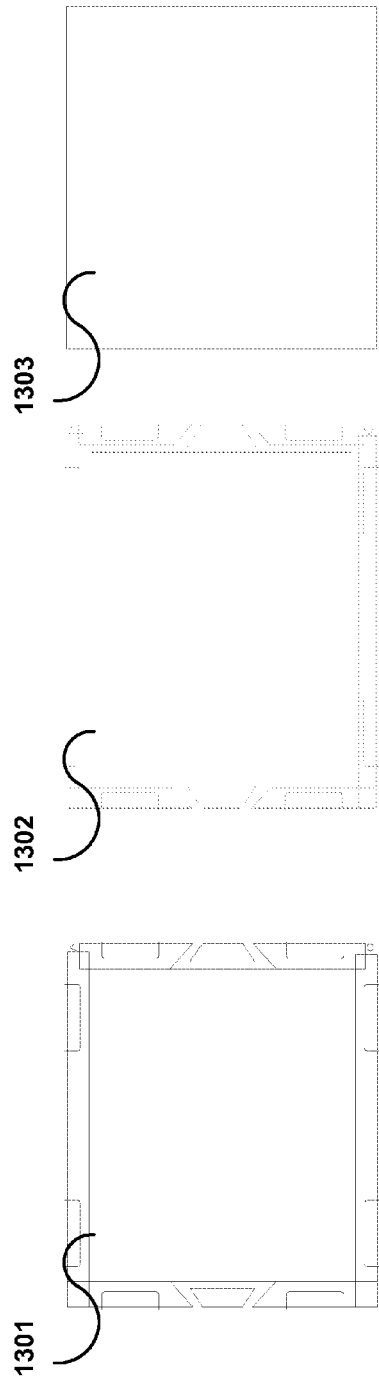
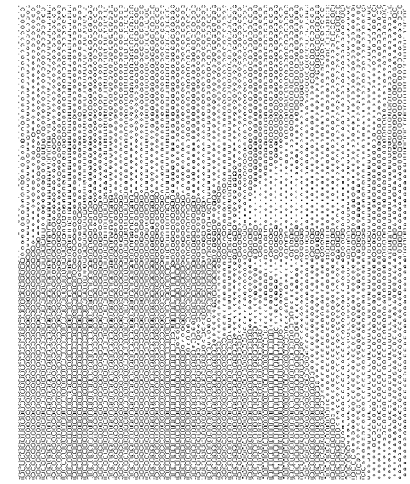
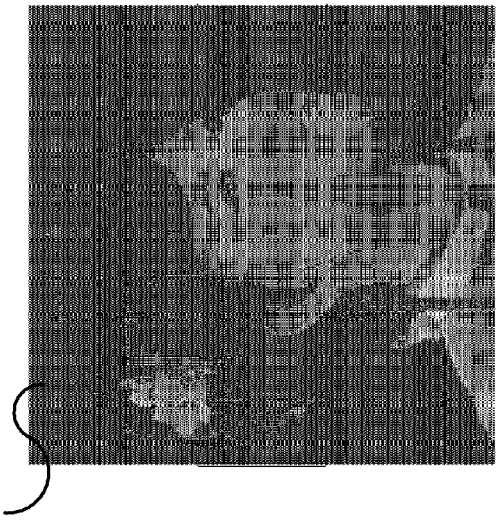
FIG. 13 (a)
FIG. 13 (b)
FIG. 13 (c)
FIG. 13 (d)
FIG. 13 (e)

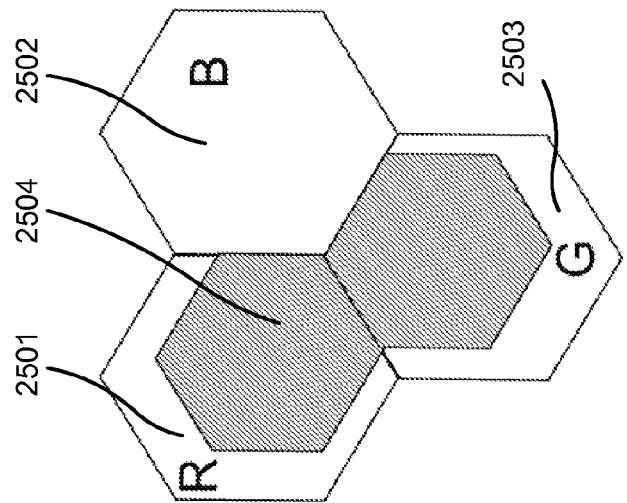
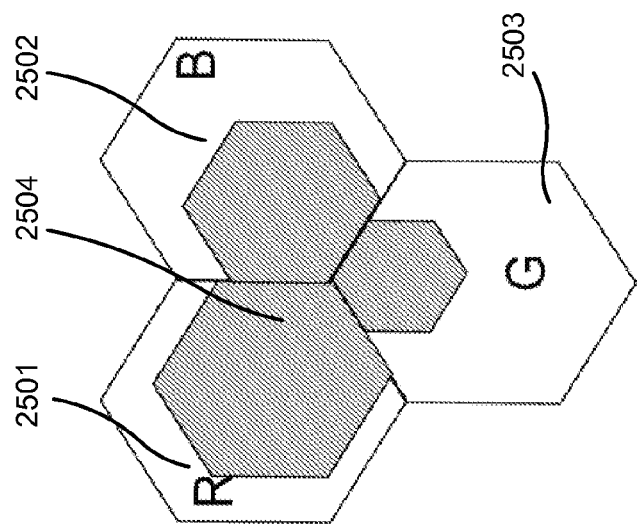
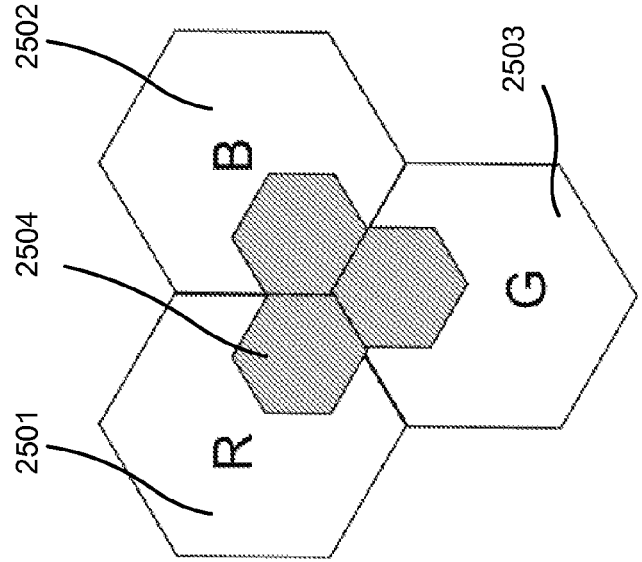
FIG. 25 (c)
FIG. 25 (b)
FIG. 25 (a)

DIGITIZED OLED LIGHT SOURCE

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)$_3$, which has the structure of Formula I:

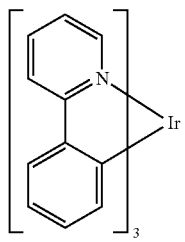

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments described herein may provide for devices comprising a digitized OLED light source and/or methods of manufacturing such devices. In some embodiments, a first method may be provided. The first method may include the steps of depositing a first conductive layer over a substrate, depositing a first organic layer comprising electroluminescent material over the first conductive layer, and depositing a first patterned image layer over some but not all of the first conductive layer. The first patterned image layer may locally alter the emissive properties of the first organic layer, and the shape of the first patterned image layer may be based on a non-uniform visual image. The first method may further comprise the step of depositing a second conductive layer over the first organic layer.

In some embodiments, in the first method as described above comprising the steps of depositing a first organic layer, depositing first and second conductive layers, and depositing a first patterned image layer over some but not all of the first conductive layer, the first patterned image layer may be deposited through a mask. In some embodiments, the first patterned image layer may be deposited by ink jet deposition. In some embodiments, depositing the first patterned image layer may include any one of: vacuum thermal evaporation (VTE), e-beam evaporation, plasma enhanced chemical vapor deposition (PECVD), low-pressure chemical vapor deposition (LPCVD), photolithography, or laser etching.

In some embodiments, in the first method as described above comprising the steps of depositing a first organic layer, depositing first and second conductive layers, and depositing a first patterned image layer over some but not all of the first conductive layer, the first patterned image layer may comprise an insulating material. In some embodiments, the first patterned image layer may comprise a down conversion material. In some embodiments, the first patterned image layer may comprise an emissive material. In some embodiments, the first patterned image layer may comprise a resistive material.

In some embodiments, in the first method as described above comprising the steps of depositing a first organic layer, depositing first and second conductive layers, and depositing a first patterned image layer over some but not all of the first conductive layer, the first patterned image layer may be transparent or semi-transparent. In some embodiments, the first patterned image layer may be opaque.

In some embodiments, in the first method as described above comprising the steps of depositing a first organic layer, depositing first and second conductive layers, and depositing a first patterned image layer over some but not all of the first conductive layer, the first method may further include the step of patterning the first conductive layer or the second conductive layer so as to define a plurality of organic light emitting devices (OLEDs). In some embodiments, the first method may further include the step of electrically connecting each OLED of the plurality of OLEDs to a fuse. In some embodiments, the plurality of OLEDs may be commonly addressable.

In some embodiments, in the first method as described above comprising the steps of depositing a first organic layer, depositing first and second conductive layers, and depositing a first patterned image layer over some but not all of the first conductive layer, the first and the second conductive layers may each be deposited as blanket layers.

In some embodiments, in the first method as described above comprising the steps of depositing a first organic layer, depositing first and second conductive layers, and depositing a first patterned image layer over some but not all of the first conductive layer, the first patterned image layer may be deposited over the first organic layer. In some embodiments, the first organic layer may be deposited over the first patterned image layer.

In some embodiments, in the first method as described above comprising the steps of depositing a first organic layer, depositing first and second conductive layers, and depositing a first patterned image layer over some but not all of the first conductive layer, the first method may further include the step of obtaining the non-uniform visual image in a digitized form. In some embodiments, the step of obtaining the non-uniform visual image may further comprise obtaining a continuous-tone image and simulating the continuous-tone image through digitized dots varying in size, geometric shape, and/or spacing. In some embodiments, the first method as described above may further include the steps of obtaining a patterned mask layout based on the digitized image and depositing the first patterned image layer through the patterned mask layout. In some embodiments, the first method as described above may further include the steps of fabricating a mask layout for a first conductive layer, fabricating a mask layout for a first organic layer, and fabricating a mask layout for a second conductive layer.

In some embodiments, in the first method as described above comprising the steps of depositing a first organic layer, depositing first and second conductive layers, and depositing a first patterned image layer over some but not all of the first conductive layer, the first organic layer may be deposited so as to define a plurality of pixels. In some embodiments, in the first method as described above where the first organic layer is deposited so as to define a plurality of pixels, each of the plurality of pixels may comprise at least two sub-pixels. Each sub-pixel may include an emitting material having an emissive spectrum with a peak wavelength. In some embodiments, for at least one of the plurality of pixels, the peak wavelength of the emissive spectrum of the emitting material of each sub-pixel may be different.

In some embodiments, in the first method as described above where the first organic layer is deposited so as to define a plurality of pixels, each of the plurality of pixels may comprise a first sub-pixel, a second sub-pixel, and a third sub-pixel. The first sub-pixel may include an emitting material having an emissive spectrum with a peak wavelength between approximately 400 and 500 nm, the second sub-pixel may include an emitting material having an emissive spectrum with a peak wavelength between approximately 500 and 580 nm, and the third sub-pixel may include an emitting material having an emissive spectrum with a peak wavelength between approximately 580 and 750 nm.

In some embodiments, in the first method as described above where the first organic layer is deposited so as to define a plurality of pixels, and where each of the plurality of pixels includes a first sub-pixel, a second sub-pixel, and a third sub-pixel, each of the first, the second, and the third sub-pixels may have a device footprint. The device footprint of the first sub-pixel of each of the plurality of pixels may be substantially the same, the device footprint of the second sub-pixel of each of the plurality of pixels may be substantially the same, and the device footprint of the third sub-pixel of each of the plurality of pixels may be substantially the same. In some embodiments, the device footprint of the first, the second, and the third sub-pixels of each of the plurality of pixels may be substantially the same. In some embodiments, the device footprints of the first, the second, and the third sub-pixels for at least one of the pixels of the plurality of pixels may be different from at least one other pixel.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area. The unmodified emitting areas of the first sub-pixel of at least two of the pixels may be different, the unmodified emitting areas of the second sub-pixel of at least two of the pixels may be different, and the unmodified emitting areas of the third sub-pixel of at least two of the pixels may be different.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area. In some embodiments, for at least one of the plurality of pixels, the unmodified emitting area of the first sub pixel may be different from the unmodified emitting area of each of the second sub-pixel and the third sub-pixel, and the unmodified emitting area of the second sub-pixel may be different from the unmodified emitting area of the third sub-pixel. In some embodiments, each of the first, the second, and the third sub-pixel may have a device footprint, and the device footprint of the first, the second, and the third sub-pixels may be the same. In some embodiments, where each of the first, the second, and the third sub-pixel has a device footprint, the device footprint of the first, the second, and the third sub-pixels may be different.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. The modified emitting areas of the first sub-pixel of at least two of the pixels may be different, the modified emitting areas of the second sub-pixel of at least two of the pixels may be different, and the modified emitting areas of the third sub-pixel of at least two of the pixels may be different.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. In some embodiments, for at least one of the plurality of pixels, the modified emitting area of the first sub-pixel may be different from the modified emitting area of each of the second sub-pixel and the third sub-pixel, and the modified emitting area of the second sub-pixel may be different from the modified emitting area of the third sub-pixel.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each have a modified emitting area. In some embodiments, each of the pixels may include a total modified emitting area that comprises the modified emitting areas of the first, the second, and the third sub-pixels of the pixel, and the total modified emitting area of at least one pixel may be different than the total modified emitting area of at least one other pixel.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each may have an unmodified emitting area. In some embodiments, each of the pixels may have a total unmodified emitting area that comprises the unmodified emitting areas of the first, the second, and the third sub-pixels of the pixel, and the total unmodified emitting area of at least one pixel may be different than the total unmodified emitting area of at least one other pixel.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first method may further include the steps of determining a working condition of the first device and obtaining CIE coordinates and voltage-luminance relationship at the determined working condition of the first, the second, and the third sub-pixels. In some embodiments, the first method as described above may further include the steps of determining a target white point for the first device.

In some embodiments, in the first method as described above comprising the steps of depositing a first organic layer, depositing first and second conductive layers, and depositing a first patterned image layer over some but not all of the first conductive layer, the first method may further include the steps of depositing a third conductive layer, depositing a second organic layer comprising electroluminescent material over the third conductive layer, and depositing a second patterned image layer over some but not all of the third conductive layer. The second patterned image layer may locally alter the emissive properties of the second organic layer, and the shape of the second patterned image layer may be based on a non-uniform visual image. The first method may further include the step of depositing a fourth conductive layer over the second organic layer.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the steps of depositing the second conductive layer and depositing the third conductive layer may comprise the same step.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the second and the third conductive layers may be the same. In some embodiments, at least one of the first and the fourth conductive layers may be transparent or semi-transparent. In some embodiments, where at least one of the first and the fourth conductive layers is transparent or semi-transparent, the second and the third conductive layers may be transparent or semi-transparent. In some embodiments, where least one of the first and the fourth conductive layers is transparent or semi-transparent, the second and the third conductive layers may be reflective.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the first conductive layer, the first organic layer, the first patterned image layer, and the second conductive layer may comprise a first OLED light source. The third conductive layer, the second organic layer, the second patterned image layer, and the fourth conductive layer may comprise a second OLED light source. In some embodiments, the second and the third conductive layers may be the same and/or at least one of the first and the fourth conductive layers is transparent or semi-transparent. In some embodiments, the first OLED light source and the second OLED light source may be individually addressable. In some embodiments, the first OLED light source and the second OLED light source may be commonly addressable.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the first organic layer and the second organic layer may be optically coupled. In some embodiments, the first organic layer and the second organic layer may comprise the same organic EL material.

A first device comprising a digitized OLED light source may also be provided. The first device may include a substrate and a first light source disposed on the substrate. The first light source may include a first electrode, a second electrode disposed over the first electrode, and a first organic layer that includes an organic electroluminescent (EL) material disposed between the first and the second electrodes. The first device may further include a first patterned image layer disposed between the first and the second electrode, where the first patterned image layer may comprise a material such that it may locally alter the emissive properties of the first organic EL material. The shape of the first patterned image layer may be generated from a non-uniform visual image.

In some embodiments, in the first device as described above that includes a first light source and a first patterned image layer, the first patterned image layer may be a single continuous layer.

In some embodiments, in the first device as described above that includes a first light source and a first patterned image layer, the first patterned image layer may include a plurality of portions, and each portion may be isolated from each of the other portions.

In some embodiments, in the first device as described above that includes a first light source and a first patterned image layer that includes a plurality of isolated portions, the first device may include a plurality of equally sized regions. In some embodiments, the first patterned image layer may include a plurality of N different patterns, where each of the N different patterns fits within one of the equally sized regions. Each of the N different patterns may correspond to one of N different luminous intensities, and one of the N different patterns may be present in each region. In some embodiments, N may equal two. In some embodiments, N may be equal to at least two. In some embodiments, N may be at least 8. In some embodiments, N may be at least 16.

In some embodiments, in the first device as described above that includes a first light source and a first patterned image layer that includes a plurality of isolated portions, the plurality of portions of the first patterned image layer may be regularly shaped and irregularly spaced. In some embodiments, the plurality of portions of the first patterned image layer may be irregularly shaped and regularly spaced. In some embodiments, the portions of the first patterned image layer may be irregularly shaped and irregularly spaced.

In some embodiments, in the first device as described above that includes a first light source and a first patterned image layer that includes a plurality of isolated portions, the first patterned image layer may form a digitized image. In some embodiments, the shape of the first patterned image layer may be such that light emissions from the first organic layer generate an image that is perceivable by an observer at distance of greater than 10 cm, but the image may not be perceivable by a viewer at distance of less than 1 cm.

In some embodiments, in the first device as described above that includes a first light source and a first patterned image layer that includes a plurality of isolated portions, each of the plurality of portions of the first patterned image layer may have a shape that comprises at least one of: a circle, a rectangle, a triangle, a hexagon, or an irregular polygon.

In some embodiments, in the first device as described above that includes a first light source and a first patterned image layer that includes a plurality of isolated portions, the plurality of portions of the first patterned image layer may include at least two portions that have different sizes. In some embodiments, the size of each portion of the patterned image layer is within the range of approximately 1 to 1000 microns. In some embodiments, the size of each portion of the patterned image layer is within the range of approximately 25 to 500 microns. In some embodiments, the size of each portion of the patterned image layer is within the range of approximately 100 to 500 microns.

In some embodiments, in the first device as described above that includes a first light source and a first patterned image layer that includes a plurality of isolated portions where the plurality of portions include at least two portions that have different sizes, the plurality of portions of the first patterned image layer may include a first group of portions having a first size, and a second group of portions having a second size that is different than the first size.

In some embodiments, in the first device as described above that includes a first light source and a first patterned image layer that includes a plurality of isolated portions, the plurality of portions of the first patterned image layer may comprise a plurality of groups of portions. In some embodiments, the size of the portions of the first patterned image layer within each group may be approximately the same, and the size of the portions of the first patterned image layer that are in different groups may be different. In some embodiments, the first device may include at least eight different groups of portions of the first patterned image layer. In some embodiments, the first device may include at least sixteen different groups of portions of the first patterned image layer.

In some embodiments, in the first device as described above that includes a first light source and a first patterned image layer that includes a plurality of isolated portions, each portion of the first patterned image layer may have a minimum distance to each of the other portions of the first patterned image layer. In some embodiments, the minimum distance between each adjacent portion of the first patterned image layer may be at least 1 micron. In some embodiments, the minimum distance between each adjacent portion of the first patterned image layer may be at least 25 microns. In some embodiments, the minimum distance between each adjacent portion of the patterned image layer may be at least 100 microns.

In some embodiments, in the first device as described above that includes a first light source and a first patterned image layer that includes a plurality of isolated portions, where each portion of the first patterned image layer has a minimum distance to each of the other portions of the first patterned image layer, there may be at least two different minimum distances between adjacent portions of the first patterned image layer.

In some embodiments, in the first device as described above that includes a first light source and a first patterned image layer that includes a plurality of isolated portions, the first device may further include a metal layer disposed between the first patterned image layer and at least one of the first electrode or the second electrode of the first light source. In some embodiments, the metal layer may comprise a plurality of portions. In some embodiments, where the metal layer comprises a plurality of portions, each of the portions of the metal layer may be optically coupled with a portion of the first patterned image layer.

In some embodiments, in the first device as described above that includes a first light source and a first patterned image layer that includes a plurality of isolated portions, the first light source may emit substantially white light.

In some embodiments, in the first device as described above that includes a first light source and a first patterned image layer that includes a plurality of isolated portions, the first organic layer of the first light source may comprise a plurality of pixels. In some embodiments, the plurality of pixels may be commonly addressable. In some embodiments, each of the plurality of pixels may include at least one portion of the first patterned image layer. In some embodiments, each of the plurality of pixels may include at least two sub-pixels that emit light having different peak wavelengths.

In some embodiments, in the first device as described above that includes a first light source and a first patterned image layer that includes a plurality of isolated portions, where the first organic layer comprises a plurality of pixels, each of the plurality of pixels may include a first sub-pixel, a second sub-pixel, and a third sub-pixel. In some embodiments, the first sub-pixel may include an emitting material having an emissive spectrum with a peak wavelength between approximately 400 and 500 nm. The second sub-pixel may include an emitting material having an emissive spectrum with a peak wavelength between approximately 500 and 580 nm. The third sub-pixel may include an emitting material having an emissive spectrum with a peak wavelength between approximately 580 and 750 nm.

In some embodiments, in the first device as described above that includes a first light source and a first patterned image layer that includes a plurality of isolated portions, where the first organic layer comprises a plurality of pixels, and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, each of the first, the second, and the third sub-pixel may have a device footprint. In some embodiments, the device footprint of the first sub-pixel of each of the plurality of pixels may be substantially the same, the device footprint of the second sub-pixel of each of the plurality of pixels may be substantially the same, and the device footprint of the third sub-pixel of each of the plurality of pixels may be substantially the same. In some embodiments, the device footprint of the first, the second, and the third sub-pixels may be different. In some embodiments, the device footprint of the first, the second, and the third sub-pixels may be substantially the same.

In some embodiments, in the first device as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area. The unmodified emitting areas of the first sub-pixel of at least two of the pixels may be different, the unmodified emitting areas of the second sub-pixel of at least two of the pixels may be different, and the unmodified emitting areas of the third sub-pixel of at least two of the pixels may be different.

In some embodiments, in the first device as described above that includes a first light source and a first patterned image layer that includes a plurality of isolated portions, where the first organic layer comprises a plurality of pixels, and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area. In some embodiments, for at least one of the plurality of pixels, the unmodified emitting area of the first sub-pixel may be different from the unmodified emitting area of each of the second sub-pixel and the third sub-pixel, and the unmodified emitting area of the second sub-pixel may be different from the unmodified emitting area of the third sub-pixel. In some embodiments, where each of the first, the second, and the third sub-pixels has a device footprint, the device footprint of the first, the second, and the third sub-pixels may be the same. In some embodiments, where each of the first, the second, and the third sub-pixels each has a device footprint, the device footprint of the first, the second, and the third sub-pixels may be different.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. The modified emitting areas of the first sub-pixel of at least two of the pixels may be different, the modified emitting areas of the second sub-pixel of at least two of the pixels may be different, and the modified emitting areas of the third sub-pixel of at least two of the pixels may be different.

In some embodiments, in the first device as described above that includes a first light source and a first patterned image layer that includes a plurality of isolated portions, where the first organic layer comprises a plurality of pixels, and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. In some embodiments, for at least one of the plurality of pixels, the modified emitting area of the first sub-pixel may be different from the modified emitting area of each of the second sub-pixel and the third sub-pixel, and the modified emitting area of the second sub-pixel may be different from the modified emitting area of the third sub-pixel.

In some embodiments, where the first, the second, and the third sub-pixels of each of the plurality of pixels each have a modified emitting area, each pixel may include a total modified emitting area that comprises the modified emitting areas of the first, the second, and the third sub-pixels of the pixel. In some embodiments, the total modified emitting area of at least one pixel is different than the total modified emitting area of at least one other pixel.

In some embodiments, in the first device as described above that includes a first light source and a first patterned image layer that includes a plurality of isolated portions, where the first organic layer comprises a plurality of pixels, and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each have an unmodified emitting area. In some embodiments, each pixel may have a total unmodified emitting area that comprises the unmodified emitting areas of the first, the second, and the third sub-pixels of the pixel, and the total unmodified emitting area of at least one pixel may be different than the total unmodified emitting area of at least one other pixel.

In some embodiments, in the first device as described above that includes a first light source and a first patterned image layer that includes a plurality of isolated portions, the first organic layer of the first light source may be a common layer to a plurality of OLEDs. In some embodiments, in the first device as described above, the first light source may include an emitting material having an emissive spectrum with a peak wavelength that is within the range of approximately 400-750 nm. In some embodiments, in the first device as described above, the first light source may include a stacked organic light emitting device (SOLED) or a transparent organic light emitting device (TOLED). In some embodiments, in the first device as described above, the first light source may comprise a top-emitting organic light emitting device.

In some embodiments, in the first device as described above that includes a first light source and a first patterned image layer that includes a plurality of isolated portions, the first patterned image layer may be transparent or semi-transparent. In some embodiments, the first patterned image layer may be opaque.

In some embodiments, in the first device as described above that includes a first light source and a first patterned image layer, the first light source may include a plurality of pixels. In some embodiments, each of the plurality of pixels may be electrically connected to a fuse.

In some embodiments, in the first device as described above that includes a first light source and a first patterned image layer, the first device may further include a second light source disposed on the substrate. The second light source may comprise a third electrode, a fourth electrode disposed over the third electrode, and a second organic layer comprising a second electroluminescent (EL) material disposed between the third and the fourth electrodes. The first device may further include a second patterned image layer disposed between the third and the fourth electrodes, where the second patterned image layer may comprise a material such that it may locally alter the emissive properties of the second organic layer, and the second patterned image layer may have a shape generated from a non-uniform visual image.

In some embodiments, in the first device as described above that includes a first and second light source and a first and second patterned image layer, the first light source and the second light source may be optically coupled.

In some embodiments, in the first device as described above that includes a first and second light source and a first and second patterned image layer, the second electrode of the first light source and the third electrode of the second light source may be the same electrode. In some embodiments, the second and the third electrodes may be transparent or semi-transparent. In some embodiments the second and the third electrodes may be reflective.

In some embodiments, in the first device as described above that includes a first and second light source and a first and second patterned image layer, the first light source and the second light source may be individually addressable. In some embodiments, the first light source and the second light source may be commonly addressable.

In some embodiments, in the first device as described above that includes a first and second light source and a first and second patterned image layer, the first organic layer and the second organic layer comprise the same organic EL material.

Embodiments may provide a device, and/or methods for manufacturing a device, that comprise a lighting panel that may display an image by altering the emissive properties of the organic layer of one or more organic devices. For instance, in some embodiments, rather than altering light after it has been emitted from a light source, a layer of material (e.g. a "patterned image layer") may be deposited within one or more OLEDs (e.g. between the anode and the cathode) that modifies the emission of light from the device. The material may alter the light that is emitted from the device in any suitable way, such as by, for instance, inhibiting light emission, reducing light emission, and/or changing the optical properties (such as the chromaticity) of the light that is emitted. The patterned image layer may be deposited in different locations relative to the layers of the OLEDs and/or in different amounts (or may in some instance comprise different materials in different areas) so that the light that is emitted from the device forms an image.

BRIEF DESCRIPTION OF THE DRAWINGS

FIGS. 13(a)-(d) show panel layouts of the anode, cathode, organic layer, and patterned image layer for an exemplary device, respectively. FIG. 13(e) shows a close-up of the patterned image layer of the exemplary device.

FIGS. 25(a)-(c) show exemplary sub-pixel and patterned image layer configurations in accordance with some embodiments.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
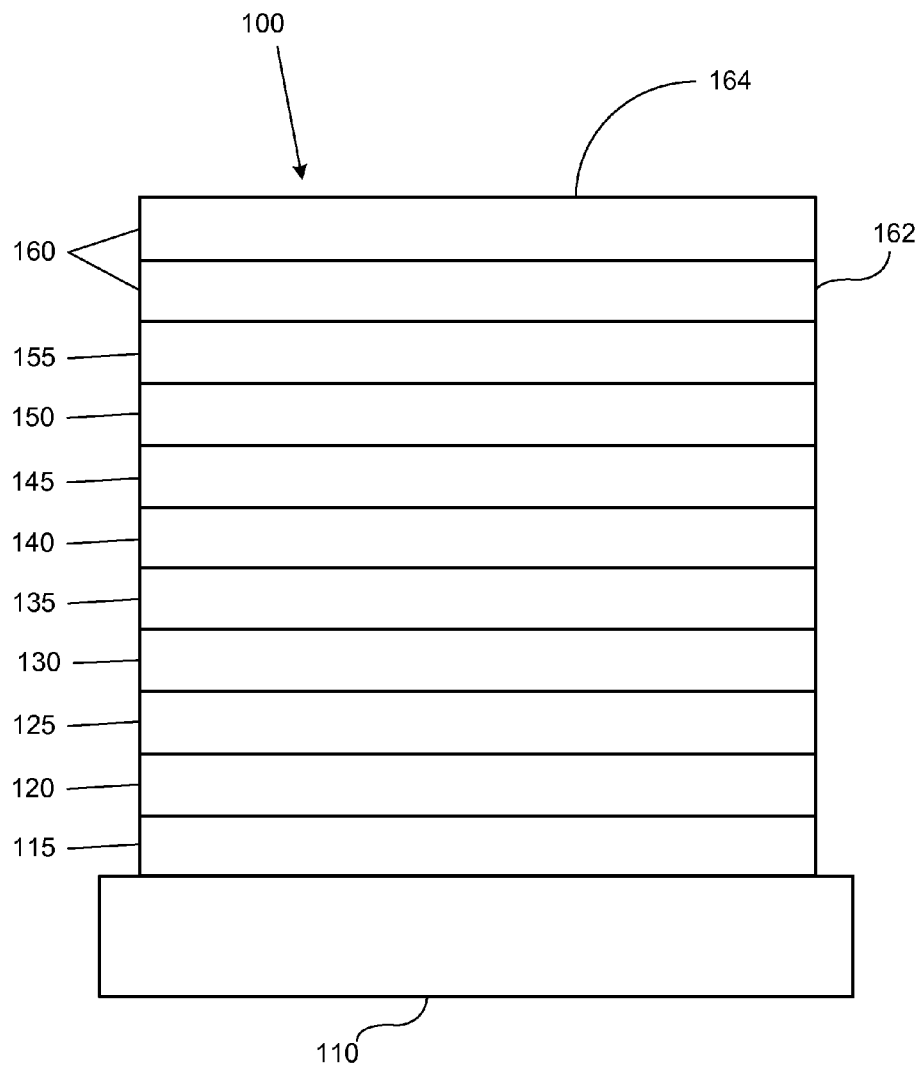
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F.sub.4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
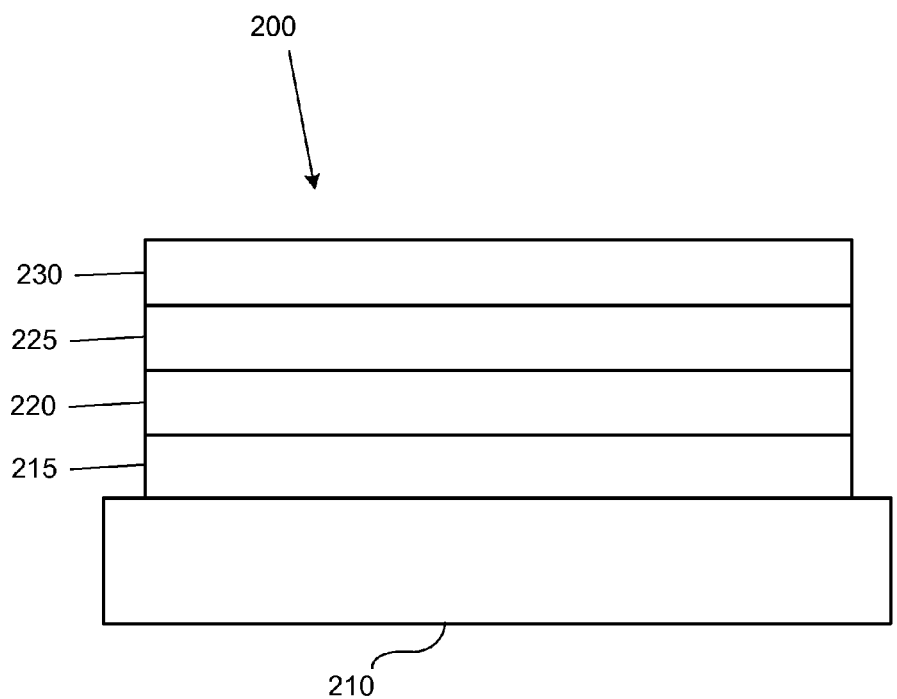
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, a "patterned image layer" may refer to a layer of material(s) that may be deposited in an organic light source that may locally alter the emissive properties of an organic layer therein. In this regard, a patterned image layer may comprise any suitable material (such as an insulator, emissive material, down conversion material, resistive material, etc.) and may be deposited in any suitable manner. The patterned image layer may comprise a single continuous layer, or may comprise a plurality of isolated portions.

As used herein, the term "locally alters" may refer to the patterned image layer (or portions thereof) affecting the emissive properties of regions of an organic layer, for which portions of the patterned image layer are disposed near to and/or are physically, electrically, or optically coupled to (depending on the properties of the patterned image layer and how it may alter the emissive properties of the organic layer). For example, locally altering the emissive properties of an organic layer may comprise preventing photons from being generated (e.g. when a patterned image layer may comprise a material (such as an insulator) that prevents current from flowing in that region of the device), changing the chromaticity of the light that is emitted in that region (e.g. when a first patterned image layer comprises a down conversion material, an emissive material, a color filter, a dichroic material, etc.), reducing the brightness of a portion of the device by, for instance, reducing the current density and/or the voltage drop across the region (e.g. when the first patterned image layer comprises a resistive material that may increase the charge barrier), etc. However, as used herein, locally altering should be sufficiently perceivable to a viewer that it can be used to render an image. In general, "locally alters" may not encompass simply blocking the light after it is generated (for instance, the way a GOBO may be used in combination with a light source). The "local alteration" occurs prior to or during emission of the light within the first light source.

As used herein, an "image" may refer to when different parts of a display appear different to a viewer on a macro scale. For instance, an image may appear like a photograph or a drawing that the human eye perceives as an object. An image is something that may be irregular on a macro scale. A "macro scale" may refer to a situation wherein an observer may perceive the images at a distance that is greater than 10 cm (i.e. the object may be discerned when an observer is located greater than 10 cm away; however, an object that is perceivable at distances of less than 10 cm may still comprise an image, so long as it may also be discerned at a distance of greater than 10 cm), and/or when the image has an area that is greater than 10 cm$^2$.

As used herein, and as would be generally understood by one of skill in the art, the term "emitting" as used to describe a material (e.g. "emitting material") in a device refers to a material that emits a significant amount of light when the device is operated under normal conditions. For example, Ir(ppy)$_3$ is a well known emissive organic material. Ir(ppy)$_3$ may be used as an emitting material in an OLED, generally by including it in the emissive layer with a host, in a device designed such that recombination occurs in or near the layer containing Ir(ppy)$_3$, and such that emission from the Ir(ppy)$_3$ is energetically favored. However, Ir(ppy)$_3$ may also be used in an OLED as a material that is not an "emitting" material. For example, it is known to use Ir(ppy)$_3$ as a hole transport material in a hole transport layer, such that the Ir(ppy)$_3$ functions to transport holes to an emissive layer where a different material emits light. In this context, Ir(ppy)$_3$ is not considered an "emitting" material.

As used herein, the term "commonly addressable" may refer to configurations in which the current in one device (or group of devices) cannot be changed without changing the current in another device (or group of devices). The current and/or current density supplied to each device or group of devices need not be the same. However, once the current is established for one device or group of devices, this also sets the current for the other groups. That is, "commonly addressable" may refer to configurations in which there is essentially a single switch that controls whether the devices are "on" or "off" (i.e. whether the devices are driven by a current). The devices or groups of devices may not thereby be individually activated and/or deactivated. In this regard, the OLEDs may also be dimmed (e.g. by reducing the current supplied to the device or portions thereof), but in such a case, each of the OLEDs are dimmed together. That is, if one OLED is dimmed, each of the other OLEDs is also dimmed, though not necessarily by the same proportion. This may be in contrast to devices or groups of devices that are individually addressable.

As used herein, the "unmodified emitting area" may refer to the area of a lighting device (or of a pixel or sub-pixel) that emits light when the device is in operation that has the same emissive properties as that of the emitting material (i.e. having wavelengths corresponding to the emissive spectrum of the emitting material). That is, the unmodified emitting area may correspond to the portions of the device, pixel, and/or sub-pixel for which the light that is emitted is not affected by a patterned image layer.

As used herein, the "modified emitting area" may refer to the area of a device (e.g. pixel or sub-pixel) that is affected by a patterned image layer such that, for instance: (1) the optical properties of the light emitted in this area is altered; or (2) light emission is inhibited in this area, but that without the patterned image layer, the "modified emitting area" would emit light that has the optical properties corresponding to the emitting material (i.e. it would emit light having the same optical properties as the unmodified emitting area). The optical properties that may be modified by the patterned image layer may include, for instance, the chromaticity, the brightness, etc. of the light emitted.

Thus, as used herein, the total area of a device, pixel or sub-pixel that emits light may be the combined area of the modified and unmodified emitting area for embodiments whereby the patterned image layer does not inhibit light emissions (but may only modify the light emissions). The total area of a device, pixel, or sub-pixel that emits light may be equal to the unmodified emitting area for embodiments where the patterned image layer inhibits light emission.

As used herein, "white balance" may refer to the chromaticity coordinates that serve to define the color "white" in image encoding or reproduction. White balance is also often referred to as the "white balance point" or "white point". The white balance designates the color that is produced, emanated, and/or passed through by a device (or component thereof) to represent the color "white". As is understood by one of ordinary skill in the art, there are many different shades of the color white comprising warmer and cooler colors, and each may comprise a different relative balance of the amount of the input colors (e.g. of red light, blue light, and green light). Thus, the white balance may be a setting that adjusts the relative intensities of the red, green and blue pixels in a display for a given image.

Figure 26:
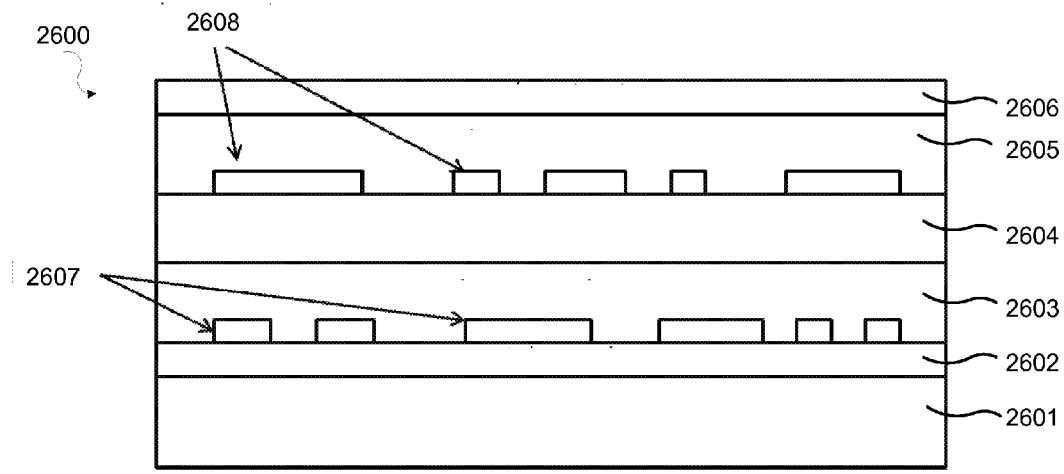
FIGS. 26(a)-(b) show exemplary digitized OLED light sources in accordance with some embodiments.
Figure 26:
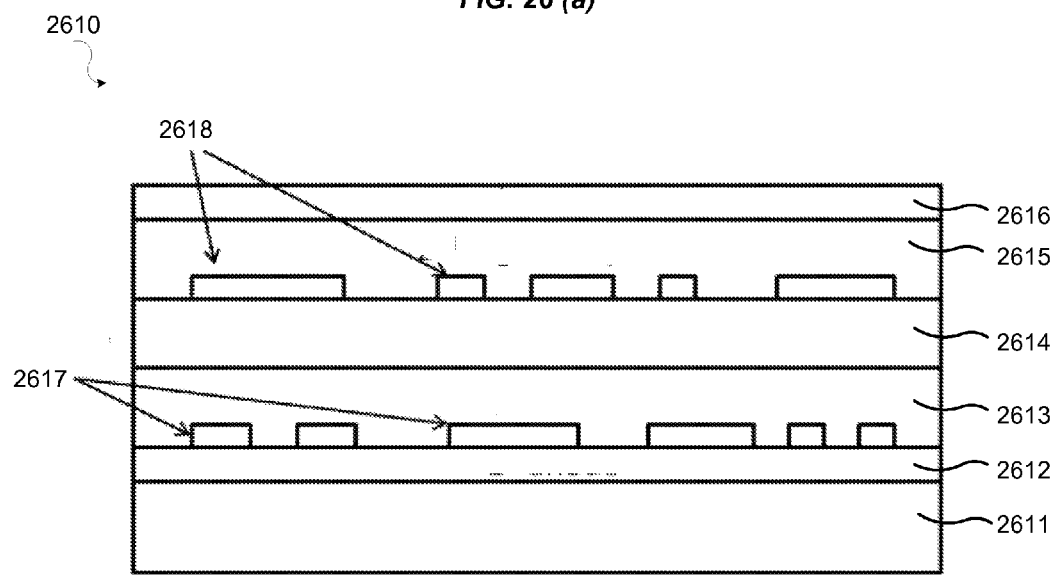

As used herein, "optically coupled" may refer to components that are configured in such a way that light that emanates from or passes through a first component also passes through or emanates from the second component. For instance, if light is generated by a light source (such as an OLED device), and the generated light emission then passes through another component (such as another OLED or layers thereof), it may be said to be optically coupled. Optically coupled does not require that all of the light that emanates from or passes through the first component also passes through the second component. Examples of OLEDs that may be optically coupled are shown in FIGS. 26(a) and (b).

As used herein, "D65," may refer to light having a correlated color temperature (CCT) of 6504 K. D65 originally described light having a CCT of 6500 K, but due to a correction of the constants in Planck's law, the CCT was later modified to a slightly higher CCT of 6504 K. The chromaticity coordinates of D65 in CIE 1931 XYZ color space chromaticity diagram are CIE 1931 (x, y)=(0.313, 0.329). This color white light is described in "Explanation of Various Light Sources and Their Use in Visual Color Matching Applications," by GTI Graphic Technology, Inc., which is hereby incorporated by reference in its entirety. In brief, D65 is further described as "light bluish colored light source used in color matching applications of paints, plastics, textiles, raw inks, and other manufactured products. It is the only daylight source that was actually measured. The other daylight sources (D75 and D50) were mathematically derived from these measurements. It accentuates blue and subdues green and red. Commonly used as a primary light source in color measurement instrumentation. It is derived from the average of measurements made of light coming in a north facing window in the northern hemisphere on an overcast day at various times through the day at various times throughout the year."

In general, images may be generated through the use of OLED displays, which typically comprise two types of display technologies: active-matrix OLED (AMOLED) and passive-matrix OLED (PMOLED) displays. While an AMOLED may be able to display high-resolution full-color dynamic images, the backplane fabrication may create additional costs and/or increase the complexity of the fabrication process (e.g. OLED growth). In addition, because of the existence of opaque TFT arrays and/or metal bus lines that are typically used in such devices, it may be more difficult to fabricate transparent AMOLED displays. PMOLED displays are popular in addressing bistable images because they may generally have lower cost and/or the fabrication process may be less complex in comparison to active-matrix displays. However, the resolution of the image in PMOLED displays may be limited based on, for instance, the increasing power consumption that results when the number of pixels within the display is increased. Furthermore, a higher current may often be utilized in such devices to address each of the pixels, which may thereby cause the device to degrade at a faster rate (and reduce device lifetime).

In contrast, the fabrication cost associated with an OLED light panel is typically much lower than that of displays (whether using AMOLED or PMOLED designs). In some applications where dynamic images may not be needed, it may be preferred that OLED light panels are used to generate static images rather than using the more complex/expensive displays. In addition, static displays that are also transparent may be more readily realized by using OLED light panels because opaque TFTs and related complex circuitry may generally be omitted from such devices (particularly in the active light emitting zones of the device). That is, for instance, higher transparency of OLED light panels may be achieved because of the relatively simple electronic driving usually needed for such a device in comparison to the more complex driving (and related circuitry) that is typically used in OLED displays.

Figure 3:
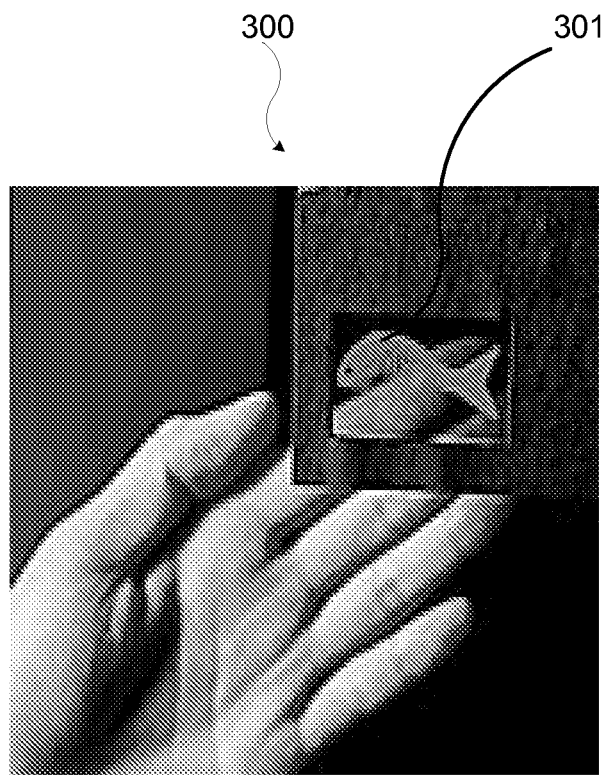
FIG. 3 shows an exemplary transparent passive-matrix OLED display.

With reference to FIG. 3, a transparent passive-matrix OLED (PMOLED) display 300 is shown demonstrating an image of a red fish 301. However, as noted above, OLED displays usually require complex driving circuitry and, in some instances, thin-film transistor (TFT) fabrication in addition to the OLED growth, which may increase the manufacturing cost. Moreover, the transparency of an OLED display is normally lower than that of an OLED lighting panel because, as noted above, the existence of opaque TFT arrays or metal bus lines. Thus, in applications where a dynamic display is not required, it may be more desirable to use a simple-processed OLED light panel for displaying static images (such as the image 301) so as to reduce manufacturing cost and/or increase the display transparency (particularly when in the off-state).

Figure 16:
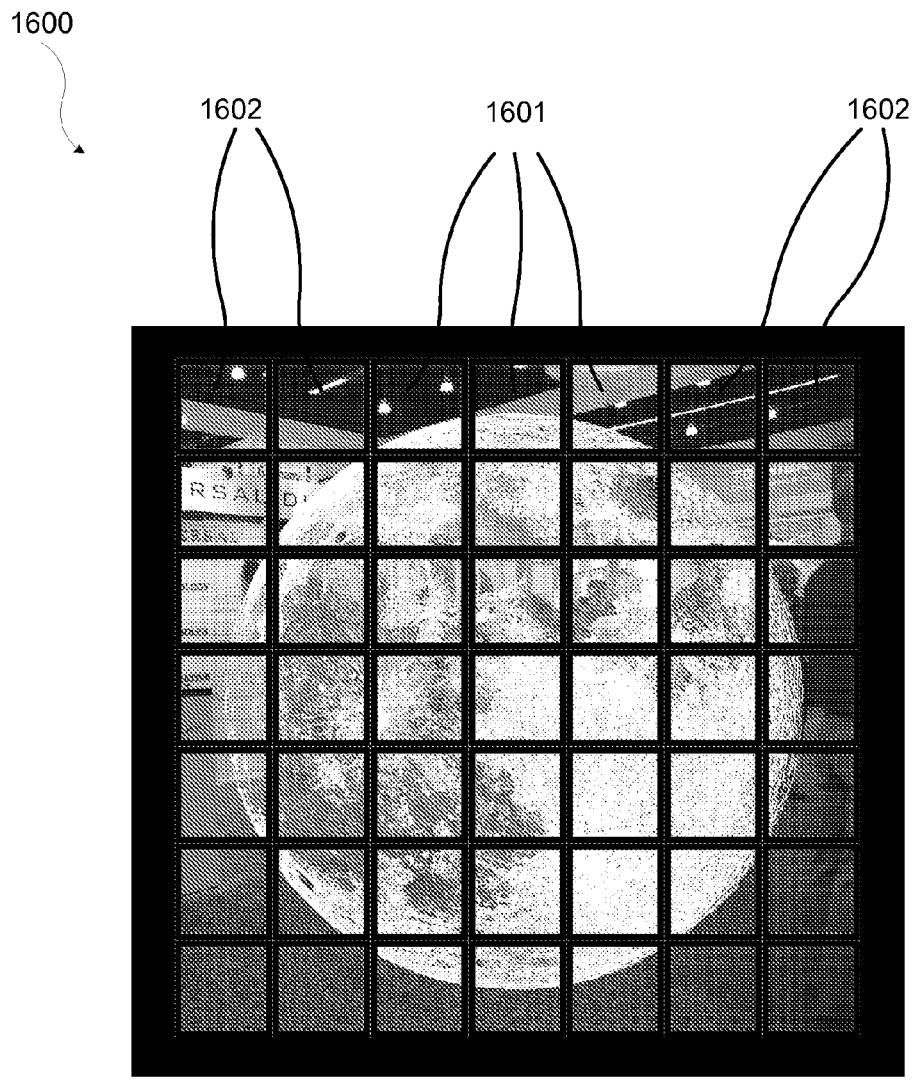
FIG. 16 shows an exemplary implementation of a tile design of digitized OLED light sources in accordance with some embodiments.

In some embodiments, multiple OLED light panels can be further "tiled up" (e.g. aligned adjacent to one or more other OLED light panels) to display macro-sized images. An example of this is shown in FIG. 16, where the device 1600 comprises a plurality of OLED light panels 1601 arranged in an array so as to display a macro image (i.e. an image that is formed using the combination of the images on each of the OLED devices). In this manner, a larger image may be displayed using multiple OLED light panels, rather than one larger OLED light panel. In some instances, it may be less expensive to manufacture a plurality of smaller devices rather than one large device. Moreover, some embodiments may also provide the advantage that if one of the smaller OLED light panel fails (thereby affecting a portion of the macro image), it may be possible to replace only that one failed OLED light panel, whereas if a single large OLED device were used, the entire device (which may be more expensive than the smaller devices due to the additional materials and complexity of manufacture) may need to be replaced if there is a failure in only a portion thereof.

Some embodiments described herein may provide a device (or methods of manufacturing a device) that may be used to display static images using an OLED light source (such as an OLED light panel). In some embodiments, the OLED light panel may be digitized by arrays of isolated portions (e.g. "dots") of a patterned image layer (such as, for instance, an insulating layer), where the isolated portions may have various sizes, geometric shapes, and/or be variably spaced apart from one another. That is, although the portions of the patterned image may be referred to herein as "dots" for illustration purposes, embodiments may comprise any geometric shape (including irregular shapes) and any size (including different size portions for a single patterned image layer). However, as described below, embodiments comprising a patterned image layer are not limited to having multiple portions, and may include, for example, a single continuous patterned image layer. It may be preferred in some embodiments, where the patterned image layer comprises a plurality of isolated portions, that the isolated portions are transparent or semi-transparent so that the portions may not be visible to an observer when the OLED light panel is in an off-state. When the device is switched to an on-state, the portions of the patterned image layer may locally alter the emissive properties of the organic layer(s) of the OLED, which may thereby create a visual contrast of bright and dark among the array of portions (or may otherwise create differential optical properties for light emissions from the light panel, such as by altering the chromaticity, brightness, etc. of the light emitted by different portions of the organic layer of the OLED) so as to create an image (e.g. a halftone image).

For example, in some embodiments, charge injection may be prohibited by the patterned image layer in sections of the organic layer disposed over (e.g. physically, optically, and/or electrically coupled to, which may be determined based on the electrical insulation property of the patterned image layer) a portion of the patterned image layer (or vice versa), which may result in light only emitting from the space in-between portions. However, embodiments are not so limited, and the portions of the patterned image layer may in some embodiments alter the emissive properties of portions of the organic layer such that the optical properties of the light emissions from the organic layer of the OLED vary so as to create an image perceivable by a viewer. For instance, the patterned image layer may comprise any one of: an insulating material (which may inhibit photon generation in portions of the organic layer); a down conversion material (which may absorb higher energy photons and emit lower energy photons, and thereby change the chromaticity and/or the brightness of a portion of the light emissions of the OLED), an emissive material (which may emit light that may be combined with the light emissions of the organic layer of the OLED so as to alter the chromaticity or brightness of a portion of the light emitted from the OLED); or a resistive material (which may not necessarily inhibit photon generation, but may raise the energy barrier which may change the current density of a region of the OLED and thereby reduce the brightness in that region). It should be noted that the above are provided for exemplary purposes and that any material that may locally alter the emissive properties of the organic layer so as to create a perceivable image to a viewer may be used for the patterned image layer.

In general, by utilizing relatively small portions for the patterned image layer, embodiments may simulate continuous-tone imagery when viewed at a certain distance. It should be noted that the distance at which the image is observable to a viewer may vary based on the size of the portions of the patterned image layer. In addition, in some embodiments, by varying the size, geometric shape, and spacing of the portions of the patterned image layer, the resolution and grayscale of an image may be controlled.

A transparent digitized OLED light panel, such as those corresponding to some of the embodiments described herein, may be preferred for use in applications such as an imaged lighting window or a shopping window pane where, for instance, a normal transparent window is present when the device is in an off-state, while a static lighting image is exhibited in an on-state of the device. In some embodiments, bottom-emission and top-emission OLED devices (e.g. a top-emission device with cavity structure) may be employed for use in other applications comprising a digitized OLED light panel, such as, for example, in a decorative mirror embodiment. In an off-state, the OLED panel may function as a mirror, while in an on-state, it may display a lighting image. It should be noted that, in general, the digitized OLED light source may display a monochrome or a full-color display (by, for instance, including at least one additional mask to pattern different emissive layers).

In some embodiments, a digitized OLED light panel may be used to display static halftone images through isolated portions of a patterned image layer (e.g. when the patterned image layer comprises an insulator). Typically, continuous-tone imagery can be simulated through digitized dots (which may correspond to isolated portions of a patterned image layer) varying in size, geometric shape or spacing, which is known as "halftone" process. This reproduction relies on a basic optical illusion where these tiny halftone dots are blended into smooth tones by human eyes. Various graphic utilities may be used to transform a continuous-tone image into a digitized one. In some embodiments, VECTORASTER® or software having similar functionality may be used to conduct the transformation. Halftone printing technology is used in the printing industry; however, the finished printing is a non-emissive image with no electrical property involved.

Exemplary Embodiments Comprising Halftone Image

Although exemplary embodiments and related general principles may be described below with reference to a patterned image layer that comprises an insulating material, it should be understood that this is for illustration purposes only. As noted above, embodiments of the patterned image layer are not so limited. The general principles and features described below may be equally applicable to the use of different materials for the patterned image layer, such as, for instance, a down conversion material, emissive material, a resistive material, etc., which may create an image that is perceivable by a viewer by locally altering the emissive properties of an organic layer of an OLED so as to vary the optical properties (e.g. the chromaticity, brightness, etc.) of the light emitted by the OLED or portions thereof. In general, a patterned image layer comprising isolated portions (e.g. in the form of dots) may be used to simulate a continuous tone image by creating a halftone image.

Figure 4:
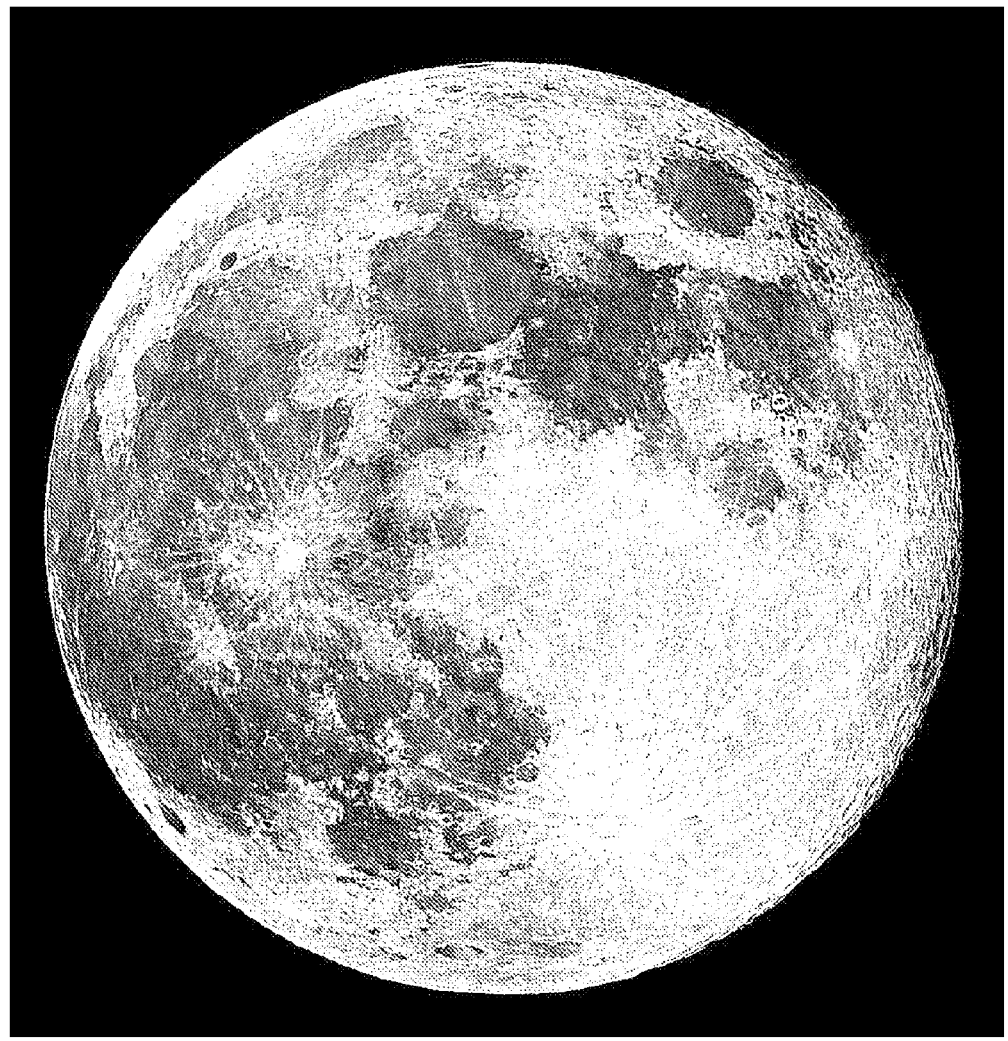
FIG. 4 shows an exemplary continuous-tone image.
Figure 5:
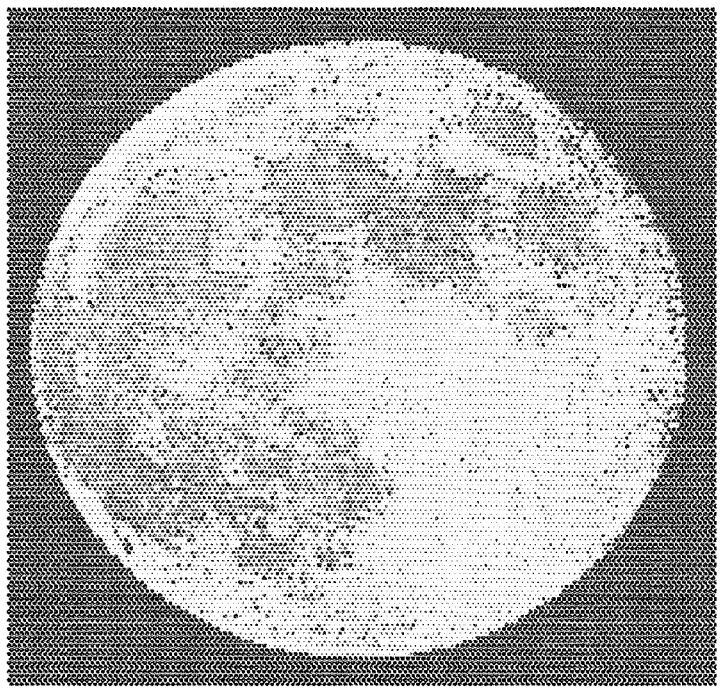
FIG. 5(a) shows an exemplary digitized halftone image of a continuous-tone image and FIG. 5(b) shows a close-up of the digitized halftone image with circular halftone dots.
Figure 5:
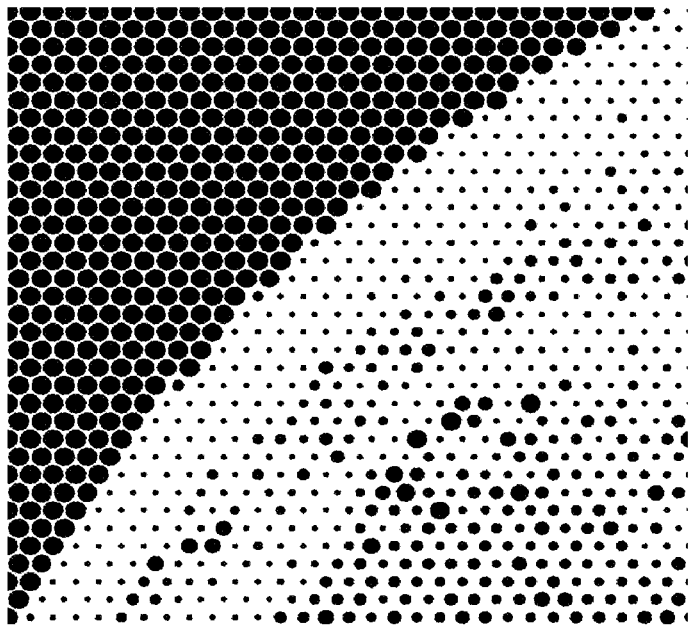
Figure 6:
FIG. 6(a) shows an exemplary digitized halftone image of a continuous-tone image and FIG. 6(b) shows a close-up of the digitized halftone image with triangular halftone dots.
Figure 6:
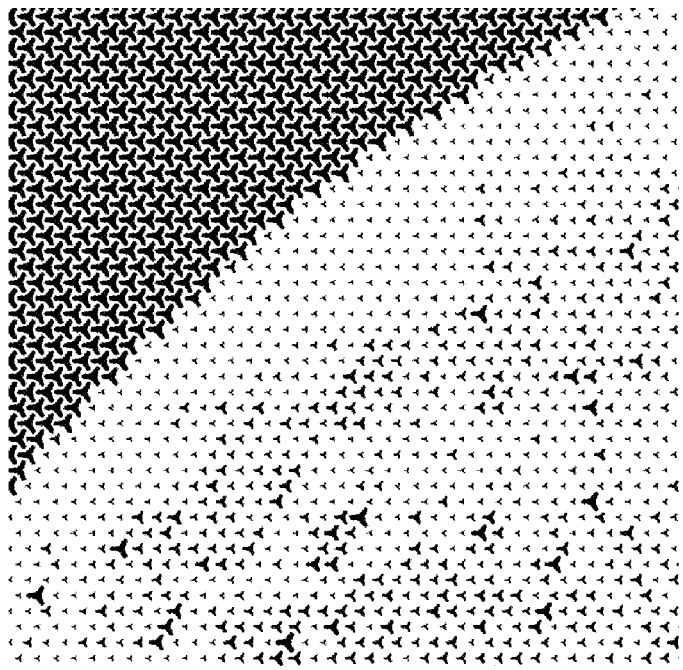
Figure 7:
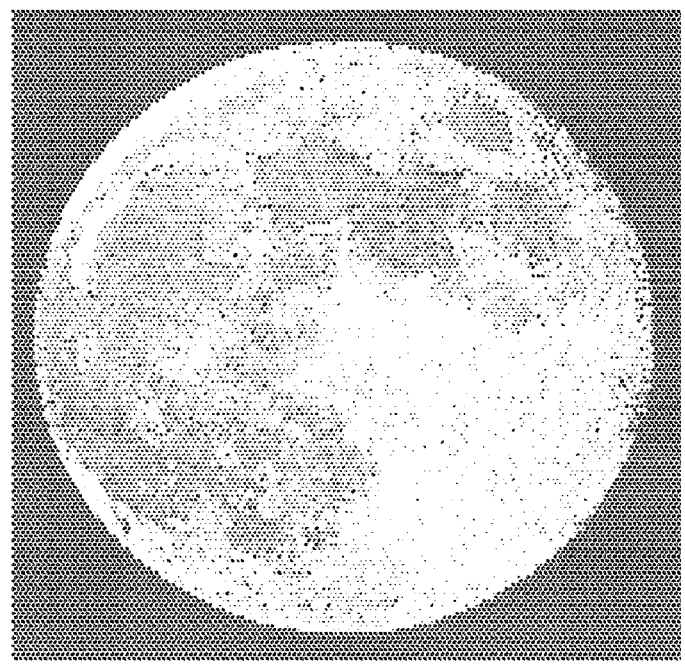
FIG. 7(a) shows an exemplary digitized halftone image of a continuous-tone image and FIG. 7(b) shows a close-up of the digitized halftone image with hexagonal halftone dots.
Figure 7:
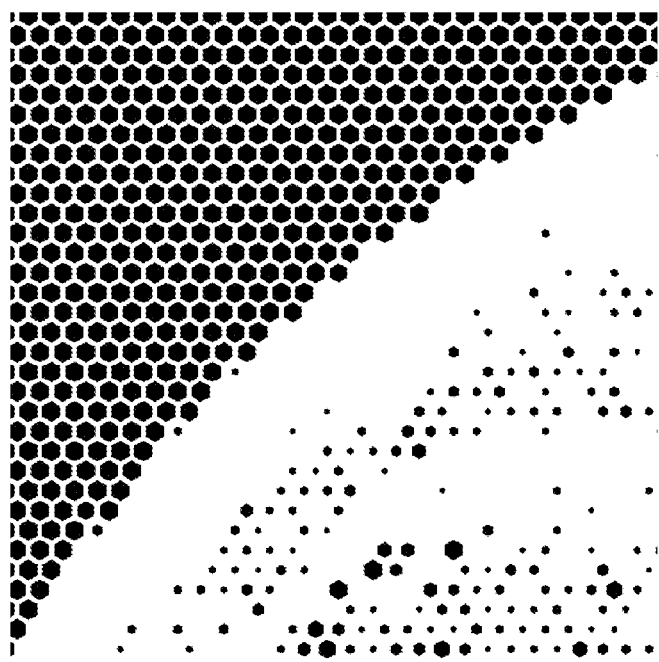
Figure 8:
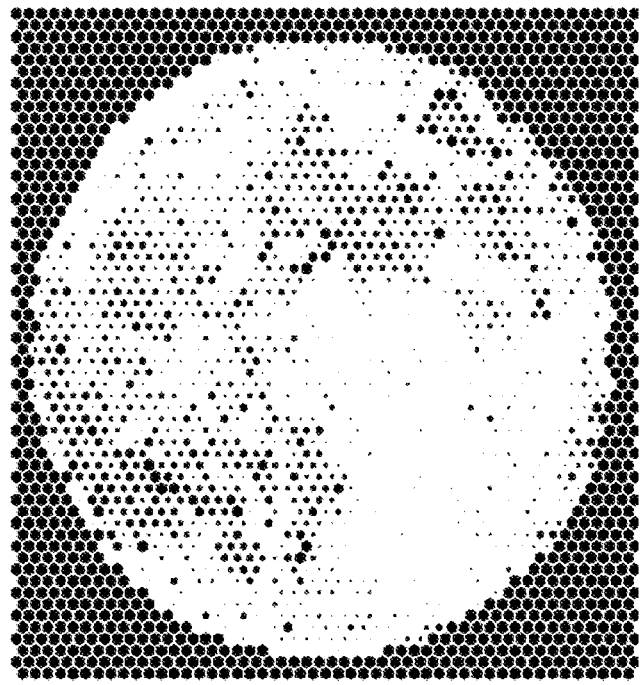
FIG. 8(a) shows an exemplary digitized halftone image of a continuous-tone image and FIG. 8(b) shows a close-up of the digitized halftone image with hexagonal halftone dots.
Figure 8:
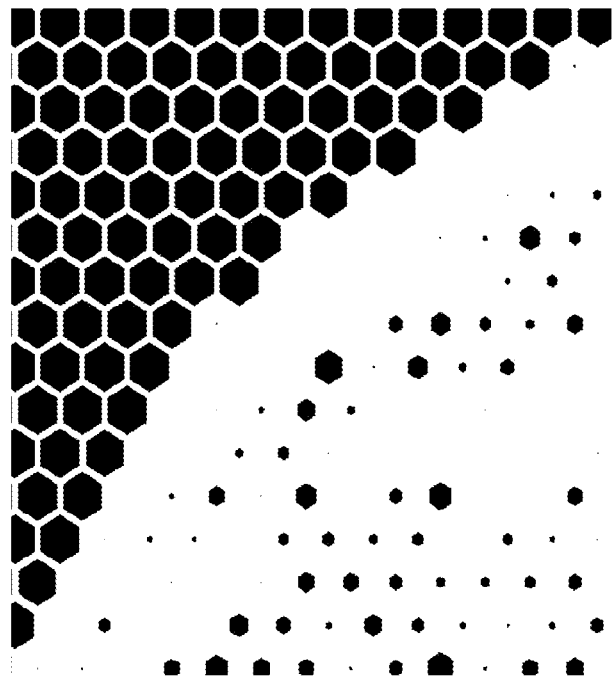

As noted above, the resolution and grayscale of a halftone image may be controlled by varying size, geometric shape and/or spacing of the halftone dots. For instance, FIG. 4 shows a continuous-tone image of the moon. The exemplary embodiments shown in FIGS. 5-8 illustrate how the image may be simulated through the halftone process using different geometric shapes of dots (which may correspond to the isolated portions of the patterned image layer in some embodiments of a digitized OLED light panel). For instance, FIGS. 5, 6, 7, and 8 show a full view (FIGS. 5(a), 6(a), 7(a), and 8(a)) and a close-up view (FIGS. 5(b), 6(b), 7(b), and 8(b)) of a digitized image of the continuous-tone image of the moon shown in FIG. 4 using circular (FIG. 5), triangular (FIG. 6), and hexagonal dots (FIGS. 7 and 8). As shown in each of these exemplary digitized images, the resolution and grayscale of the image vary with the halftone dot geometric shapes. That is, each of the exemplary dot shapes may have its own characteristics and preferred uses. For example, circular dots (shown in FIGS. 5(a) and (b)) may be better suited for light images, especially in portraying skin tones, while square dots (not shown in the figures) may be better suited for detailed images, but not necessarily skin tones. In practice, the dot geometric shape may also be dependent on the printing (or deposition) method as well as the image. At the same time, by tuning the size and spacing of the dots, various visual effects may also be achieved. The "spacing" of the dots may refer to the center-to-center distance between adjacent dots (i.e. the distance between the center of one dot and the center of an adjacent dot, which may also be referred to as the "pitch") and/or the minimum distance between adjacent portions (e.g. the shortest distance between a point on one dot and a point on an adjacent dot). In general, the resolution of the digitized imagery may be determined by the number of lines of dots in one inch, known as lines per inch (lpi). For instance, the spacing between two adjacent hexagonal dots in the exemplary embodiments shown in FIG. 7 is 1 mm, therefore, the image in FIG. 7 has a resolution of 25 lpi. FIG. 8, which also shows an example of halftone image with hexagonal dots, has larger dot diameter and spacing than the dots in FIG. 7. The spacing between two adjacent hexagonal dots are 3 mm in this exemplary embodiment, and therefore the resolution of the image in FIG. 8 is about 8 lpi, which may create a more coarse (i.e. lower resolution) appearance than FIG. 7.

Figure 9:
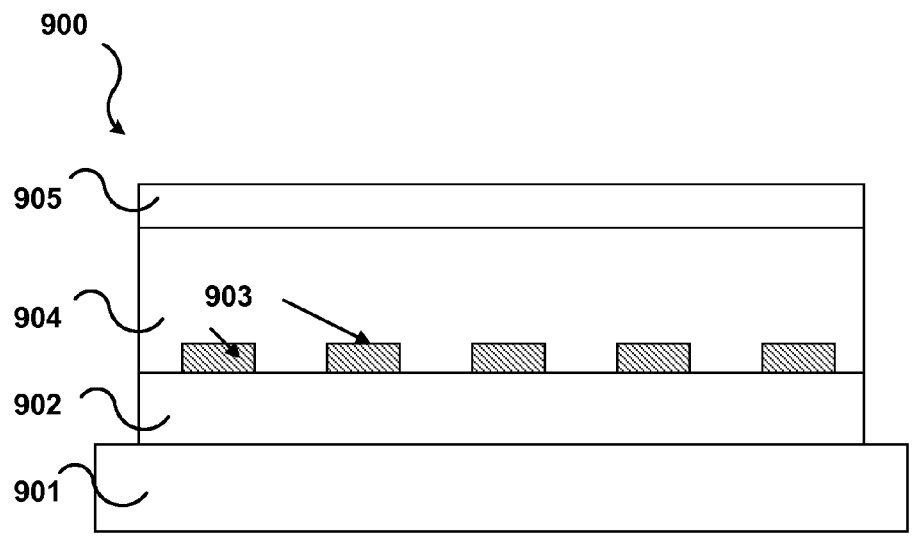
FIGS. 9(a) and (b) show exemplary digitized OLED light sources in accordance with some embodiments.
Figure 9:
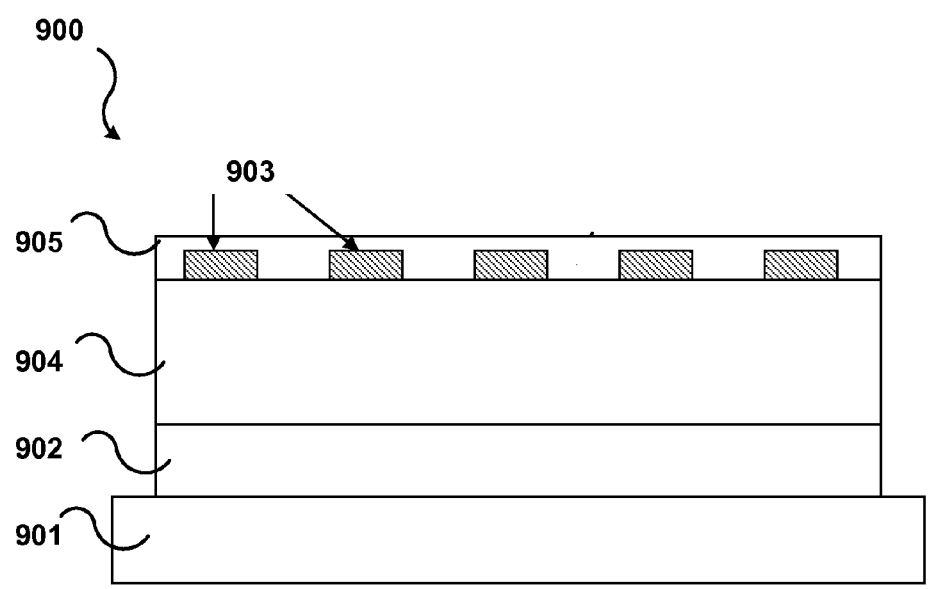

With reference to FIGS. 9(a) and (b), exemplary embodiments of a digitized OLED lighting device 900 are illustrated. As shown in this exemplary embodiment, a common anode 902 and cathode 905 are disposed (e.g. deposited) onto a substrate 901 with an organic emissive layer 904 disposed in-between. The patterned image layer 903 is shown as an array of isolated portions (e.g. dots), which could have various sizes and spacing to serve as the halftone dots (as was described above). That is, the shape of the patterned image layer 903 may be based on the halftone image. The exemplary embodiment shown in FIG. 9(a) shows a digitized OLED 900 that comprises the organic layer 904 disposed over (i.e. deposited over) the patterned image layer 903. In contrast, the exemplary embodiment shown in FIG. 9(b) shows a digitized OLED 900 that comprises the patterned image layer 903 disposed over (i.e. deposited over) the organic layer 904. As noted above, the patterned image layer 903 may comprise any material that may locally alter the emissive properties of the organic layer 904 (such as an insulating material, down conversion material, emissive material, resistive material, etc.). In this manner, the exemplary embodiments shown in FIGS. 9(a) and (b) when activated may display an image that is perceivable by a viewer.

In some embodiments, it may be preferred that the patterned image layer is transparent or semi-transparent so that a visible image cannot be seen in an off-state. In some embodiments (particularly when the patterned image layer comprises an insulating material), the patterned image layer may comprise, by way of example only, polyimide, silicon oxide, MoOx, Liq or LiF. In some embodiments, it may be preferred that the patterned image layer (e.g. the halftone dots) is opaque so that the OLED lighting panel displays a static image even when it is in an off-state (i.e. when the OLED is not emitting light).

Figure 10:
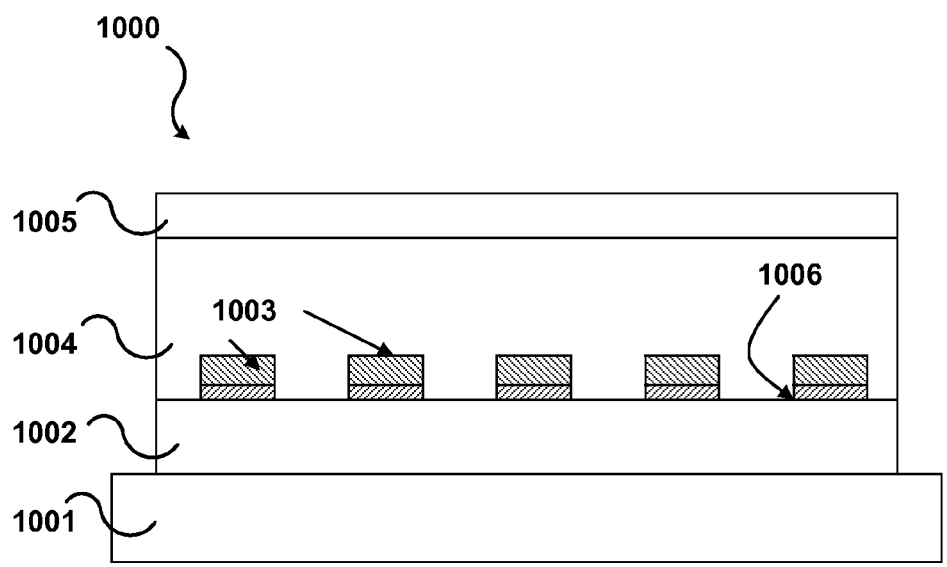
FIGS. 10(a) and (b) show exemplary digitized OLED light sources in accordance with some embodiments.
Figure 10:
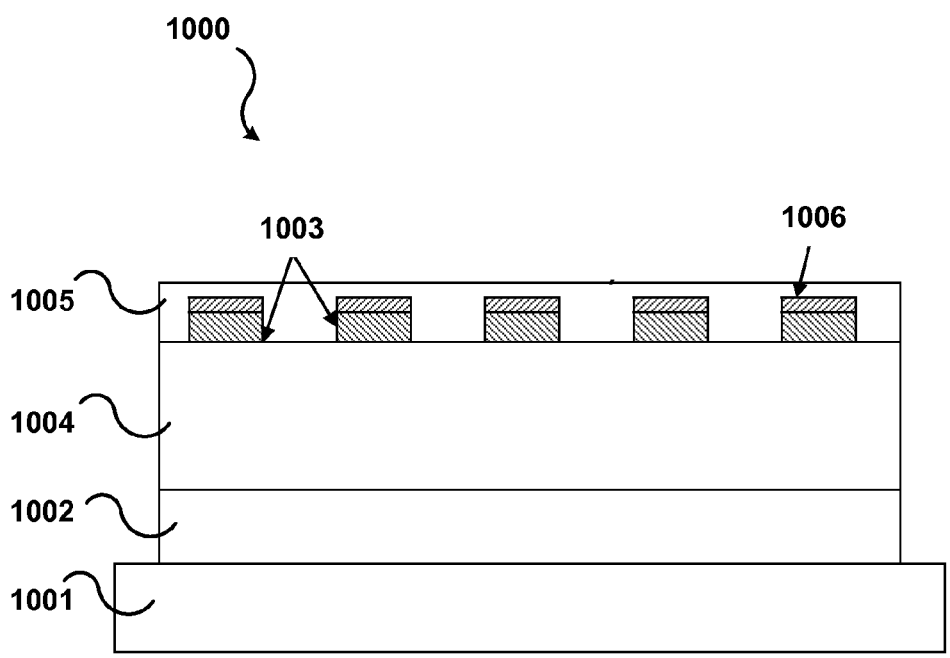

In some embodiments where the patterned image layer is opaque (particularly when it comprises an insulating material), the patterned image layer may comprise, by way of example only, silicon nitride or, as shown in FIGS. 10(a) and (b), a double stack with a layer of metal disposed in-between the portions of the patterned image layer and an electrode. That is, FIGS. 10(a) and 10(b) show exemplary embodiments of a digitized OLED 1000 that comprises a substrate 1001, an anode 1002 disposed over the substrate 1001, a patterned image layer 1003, an organic layer 1004, a cathode 1005, and a metal layer 1006. FIG. 10(a) shows an exemplary embodiment in which the metal layer 1006 is disposed (i.e. deposited) between portions of the patterned image layer 1003 and the anode 1002. FIG. 10(b) shows an exemplary embodiment in which the metal layer 1006 is disposed (i.e. deposited) between portions of the patterned image layer 1003 and the cathode 1005. This additional metal layer 1006 may form a visual pattern of an image such that when the digitized OLED 1000 is in an off-state, the image formed by the metal layer 1006 is perceivable to a viewer. In some embodiments, the metal layer 1006 may also reduce the sheet resistance of the electrode so as to improve the uniformity of the OLED light panel.

In general, the patterned image layer may be deposited in any suitable manner, such as by way of example, vacuum thermal evaporation (VTE) through a shadow mask, plasma enhanced chemical vapor deposition (PECVD) through a shadow mask, low-pressure chemical vapor deposition (LPCVD), ink-jet printed, e-beam evaporation, patterned through photolithography or laser etching. When the OLED device is in an off-state, the panel may be transparent (or semi-transparent) or reflective (e.g. mirror-like) without any visible pattern. The former may be realized through the use of a transparent OLED device, and the latter may be realized by using, for example, a bottom-emission device or a top-emission device with a cavity structure. In embodiments where the patterned image layer comprises an insulating material, when the OLED panel is switched to an on-state, charge injection may be prohibited at the portions of the patterned image layer (corresponding to the halftone dots in some embodiments) because of the electrical insulation properties of the material; however, light may still emit from the space in-between the dots where no portion of the patterned image layer exists. In this manner, a visual effect may be created by the contrast among the "dots" (i.e. area in which light is not emitted) and open areas, which may generate the halftone image that is perceivable by a viewer. A similar contrast may be created when the patterned image layer comprises a material that locally alters the emissive properties of the organic layer in any other manner (such as when the patterned image layer comprises a down conversion layer, emissive material, or resistive material), as this may create a contrast in the optical properties of the light emitted in different parts of the digitized OLED.

In some embodiments, the edge of the portions of the patterned image layer (e.g. the dots) may appear differently depending, for instance, on the material of the patterned image layer and the deposition method. For instance, in some embodiments silicon oxide may be patterned through photolithography followed by a reactive-ion-etching (RIE), which normally forms a very steep edge profile. In this circumstance, the contrast between non-emissive portions corresponding to the patterned image layer and the emissive spaces in between may be very dramatic and the halftone image may appear very sharp. In some embodiments, for instance for a silicon oxide film deposited by PECVD through a shadow mask, a strong feathering effect may occur, where the material may extend beyond the mask opening and form a thin layer embracing the portions of the patterned image layer. The thin oxide halo may surround the portions of the patterned image layer and may become a semi-insulator, creating an area where low injection may occur and hence some low-intensity light may be emitted. In some embodiments, the boundary between the emissive areas and the patterned image may thereby appear blurry to a viewer and therefore a smooth image may be realized.

As was noted above, some embodiments of a digitized OLED light panel may comprise one or more transparent electrodes. In general, a transparent electrode usually generates a potential drop across the electrode due to its relatively high resistivity, which may cause luminance non-uniformity across the panel (e.g. when there is a common anode or cathode). To create a uniformly illuminated image, some embodiments may comprise an additional layer of conducting material that may be disposed in contact with the transparent anode (or cathode) so as to reduce the equivalent sheet resistance (which may create the voltage drop across the electrode). For example, a layer of aluminum may be disposed on the substrate, which may then be followed by deposition of the anode layer. Another exemplary embodiment may include a layer of calcium that may be disposed over the anode. However, any suitable manner of electrically connecting portions of a transparent electrode to reduce sheet resistance may be used. In some embodiments, rather than (or in addition to) adding a conductor to such embodiments, certain images that may be displayed by the digitized OLED light panel may be designed to accommodate the resistive loss from the electrode. For example, an image with a deliberate dimmer center and brighter edges may not utilize any conductivity assistance. In some embodiments, the original non-uniform illumination pattern may be captured and simulated through a halftone process. A reverse image with opposite brightness gradient may then be generated accordingly, where, for instance, the initial dim regions are transformed to be a bright field (and vice versa). That is, for instance, the portions of the patterned image layer may be disposed to form the reverse image so as to compensate for the luminance non-uniformity.

Accordingly, as described above, a digitized OLED light panel may comprise a transparent device (e.g. the device may comprise a transparent anode and cathode). The OLED light panel may thereby, for instance, function as a window in an off-state and display an image when switched into an on-state. In some embodiments, the digitized OLED light panel may comprise a bottom emission device (e.g. one of the electrodes may be transparent), where a reflective material (such as a metal) may be deposited as the other electrode (e.g. as the cathode). In such embodiments, the panel may function as a mirror in an off-state, and display one or more images when switched to an on-state. In some embodiments, the digitized OLED light panel may further comprise a top-emission device with a cavity structure where a reflective material (e.g. metal) may be deposited on the anode side.

Figure 12:
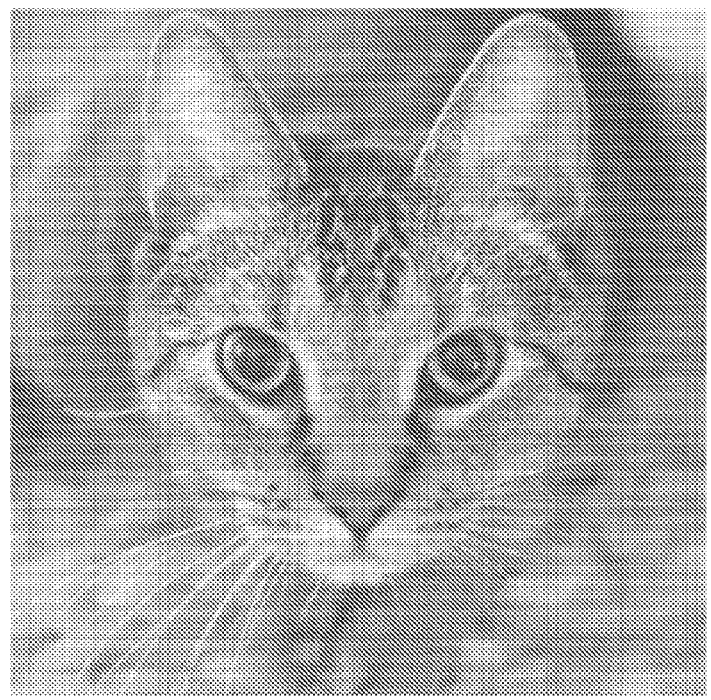
FIG. 12(a) shows an exemplary halftone digitized image of a cat and FIG. 12(b) shows a close-up of a portion of the halftone image.
Figure 12:
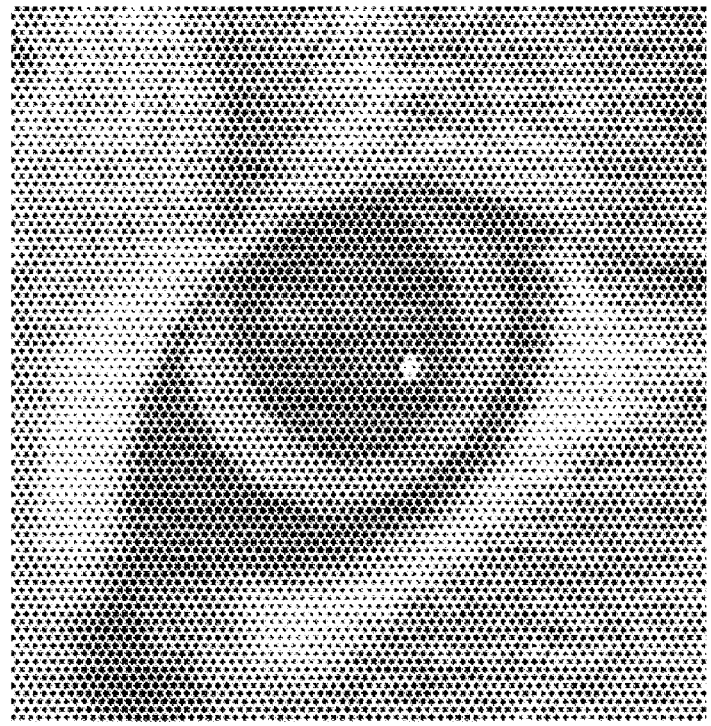

In some embodiments, a digitized OLED light panel may be monochromic, including, but not limited to, emitting red, green, blue or white light (for instance, when an organic layer is commonly disposed). In some embodiments, the OLED light panel may have strong angular dependence, where the wavelength of the light emissions shifts with the viewing angles (i.e. depending on the angle the viewer is located from the emission surface of the OLED light panel, the color of the light emissions may differ). This may, for instance, be realized by depositing a reflective material (e.g. a metal) as the anode of a top-emitting device. FIGS. 12(a) and 12(b) show a monochromic picture of a cat and a close-up image of the eye region, respectively, where the solid black dots within each sub-pixel represent the portions of the patterned image layer (which for illustration purposes, may comprise insulating dots).

Figure 11:
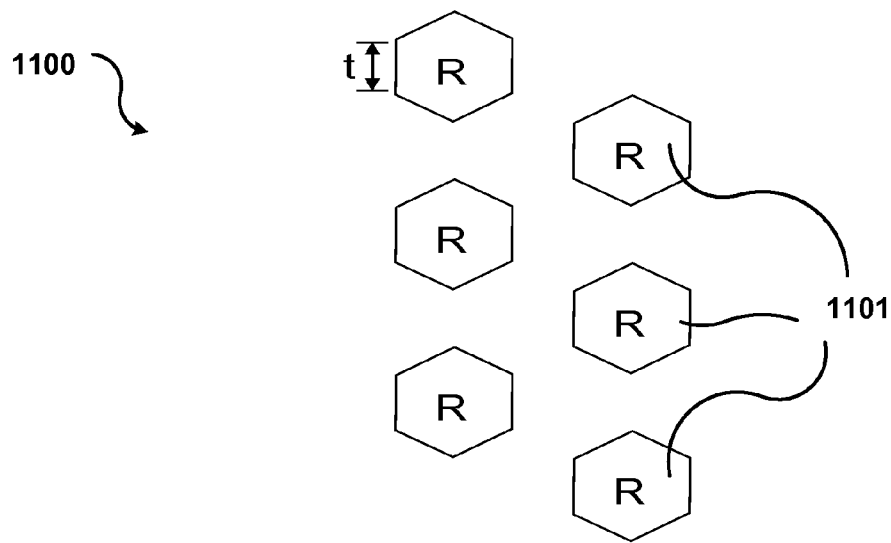
FIGS. 11(a) and (b) show an exemplary deposition process of a portion of an exemplary device comprising a plurality of sub-pixels in accordance with some embodiments.
Figure 11:
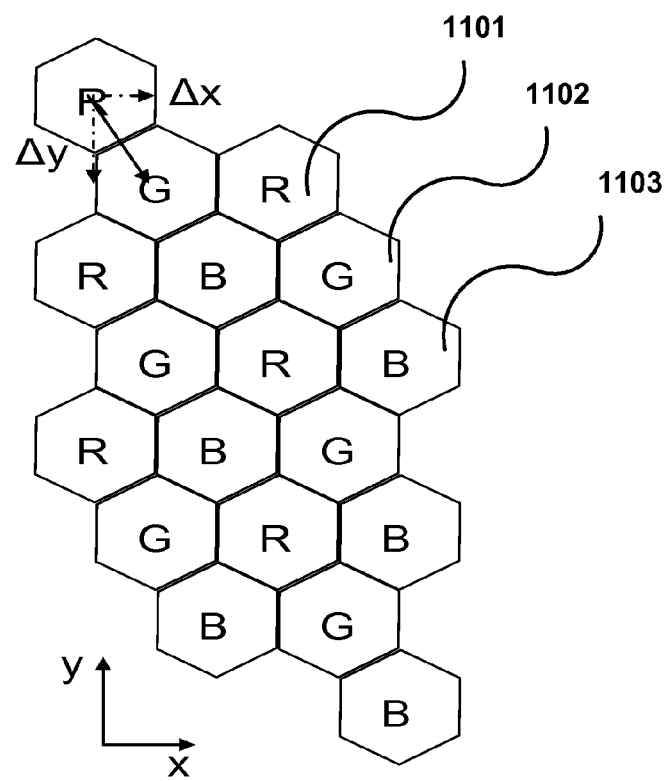

In some embodiments, a digitized OLED light panel may display full-color images. For instance, the organic emissive layer of the OLED light panel may be pixilated into arrays of individual red (R), green (G), and blue (B) regions (i.e. sub-pixels) adjacent to each other (note that as used herein, adjacent red, green, and blue sub-pixels may comprise a "pixel"). The sub-pixel pattern for each color may be the same so that the deposition of different colors may be performed through the same mask by simply shifting the position of the mask over one or more of the other layers of the OLED device. For instance, FIG. 11(a) illustrates a portion of the mask 1100 for the deposition of the organic emissive layer of an OLED light panel that comprises arrays of hexagon sub-pixels with a side length of "t." FIG. 11(a) further shows that the red (R) emissive material 1101 may first be disposed through this exemplary mask 1100. FIG. 11(b) shows that in some embodiments, after the red emissive material 1101 has been disposed, a layer of green (G) emissive material 1102 may be disposed through the same mask by shifting the location of the mask over the substrate (and/or any of the other layers of the OLED device) according to $$\Delta x = \frac{\sqrt{3}}{2}t, \Delta y = -\frac{3}{2}t,$$

where "$\Delta x$" is the change in relative position of the patterned mask in the x-direction, "$\Delta y$" is the change in relative position of the patterned mask in the y-direction, and "t" is the length of the side of one the hexagon sub-pixels. Blue (B) emissive material 1103 may be deposited through the same patterned mask after the green emissive material 1102 by again shifting the patterned mask by the same amount as was done prior to depositing the green emissive material 1102. Thus, as shown, FIG. 11(b) depicts a portion of the patterns of the sub-pixels of the OLED light panel after the deposition of RGB colors for an exemplary embodiment.

In some embodiments, after the organic layer has been deposited (e.g. as was described above for the full-color embodiment shown in FIG. 11(b)), arrays of portions of a patterned image layer (such as, for example, an array of insulating dots) may be disposed between the organic stacks and an electrode of the OLED light panel so as to control the emissive properties of one or more of the sub-pixels (e.g. sub-pixels 1101, 1102, and 1103). The patterned image layer may, for instance, be disposed such that the variation of the area ratio among the three colors results in the color variation and hence creates the full-color image (e.g. FIGS. 23 and 24). As noted above, there are several graphic utilities capable of transforming a full-color continuous-tone image into a digitized image. In some embodiments, VECTORASTER® may be used along with PHOTOSHOP® to process the image.

Figure 14:
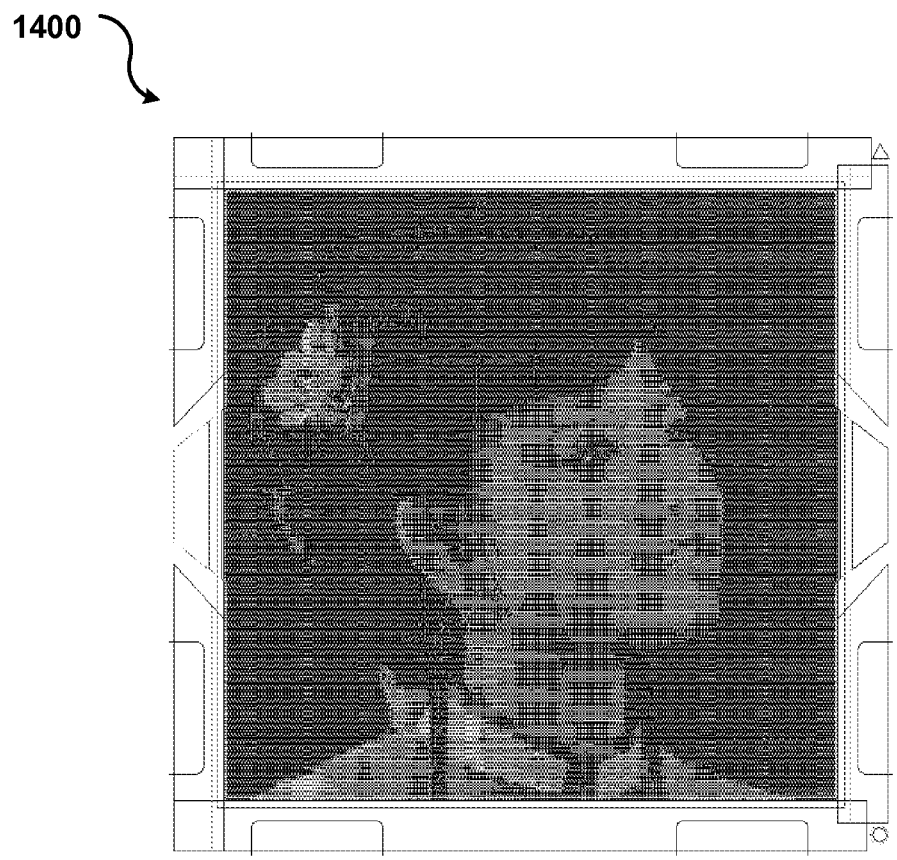
FIG. 14 shows the exemplary panel layouts of FIGS. 13(a)-(d) combined to comprise an exemplary device in accordance with some embodiments.

The inventors have applied some of the above described concepts into a reduction to practice of an exemplary device. The exemplary fabricated device comprised a 6 inch by 6 inch monochrome (white) bottom emission OLED light panel. FIGS. 13(a)-(d) show the layouts of the anode 1301, cathode 1302, organic stacks 1303, and patterned image layer 1304 (which, for this exemplary device, comprised an insulating material), respectively. The anode 1301, cathode 1302, and organic layers 1303 were all disposed through common masks (that is, the exemplary OLED device was not pixilated, but blanket deposited instead). The patterned image layer 1304 comprised hexagonal dots with sizes and spacing varying from 200 to 500 microns, as shown in FIG. 13(e). FIG. 14 shows the overall panel layout 1400 (i.e. combining the anode 1301, cathode 1302, organic stacks 1303, and patterned image layer 1304, where the organic stacks 1303 and the patterned image layer 1304 were disposed between the anode 1301 and the cathode 1302), where a picture of a girl is displayed.

Figure 15:
FIG. 15(a) shows an exemplary digitized OLED light source displaying an image in the on-state and FIG. 15(b) shows a close-up of a portion of the digitized OLED light source in the on-state.
Figure 15:
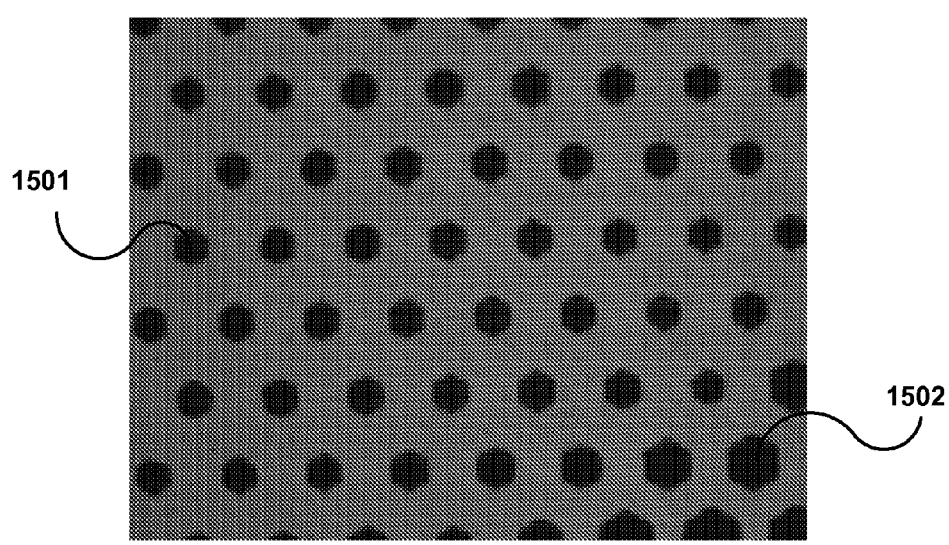

With reference to FIG. 15(a), a photograph of the exemplary fabricated bottom-emission white OLED light panel 1500 (which corresponds to panel layout 1400 in FIG. 14) during operation is shown. Note that, because the light is emitting from the deposition side towards the substrate side in a bottom-emission device, the illuminated image in FIG. 15(a) is mirrored as compared to the mask layout shown in the exemplary embodiment in FIG. 14. As can be seen in FIG. 15(a), when the exemplary device 1500 was in the on-state, the image of a girl (which can be seen in the patterned image layer 1304 in FIG. 13(d)) was illuminated. The inventors found that the exemplary OLED panel 1500 exhibited high resolution, grayscale, and contrast. With reference to FIG. 15(b), a close up of the patterned image layer is shown.

Well-defined individual hexagonal dots can be seen clearly in the microscopic close-up photo, which was also taken while the device was in the on-state. For illustration purposes, it can be seen that the portion of the pattern image layer 1501 (comprising a first hexagonal dot) is smaller than the portion of the patterned image layer 1502 (comprising a second hexagonal dot), and that the portion of the patterned image layer 1501 is spaced further apart from adjacent portions. As explained above, the use of different sized and spaced portions of the patterned image layer may create a contrast in the light emissions from portions of a digitized OLED so as to create an image.

As discussed above, some embodiments of digitized OLED light panels may be scaled up to macro-size displays. FIG. 16 demonstrates one exemplary embodiment where a matrix of 7 by 7 glass panels are tiled together to simulate the moon image as previously shown in FIG. 4, among which 37 transparent digitized OLED light panels 1601 (including the three squares in the middle of the top row) and 12 plain glass panels 1602 (including the two squares on the left or right corner of the top row) are used. In some embodiments, the OLED light panels 1601 may have high transparency, and thereby may function as window panes when the device 1600 is not in operation. Once the device 1600 is turned on, the OLED light panels 1601 may display the designated images. In some embodiments, the transparent digitized OLED panels may be mounted as a glass roof, such that during day time, the panels may transmit sunlight into the room (which may or may not comprise an image), while at night time, when the device is operated, it may emit lighting images. It should be understood that embodiments provided herein may be used for many applications in addition to the specific example described above.

Exemplary Embodiments Comprising Full-Color Digitized Lighting

Presently, there exist several different ways to display full-color images. For example, in the display industry, colors are often simulated by controlling the emission luminous intensity "I" (having a standard unit of cd or lm/sr) of the light emitted from red (R), green (G) and blue (B) sub-pixels. Each sub-pixel may be physically separated from each of the other sub-pixels, and the modulation of the luminous intensity of each sub-pixel may be individually controlled through electrical circuitry. For example, white light may be achieved by turning all three RGB sub-pixels fully on, where typically the sub-pixels have a luminous intensity ratio to one another of approximately $I_R:I_G:I_B=3:6:1$ (that is, the luminous intensity of the red sub-pixel is 3 times greater than that of the blue sub-pixel, but half the luminous intensity of the green sub-pixel, etc.). This variation of the intensity of each sub-pixel may account for the wavelength dependence of the human visual response. This method of generating colors is an example of additive color mixing.

In some instances, half-toning may also be used (typically in the printing industry) to display full-color images. However, unlike display technology, in the color printing field, various shades are typically reproduced by tuning the sizes and density of halftone dots of each subtractive primary color (normally cyan, magenta, yellow, and black in the CMYK color model). Note that, in color printing technology, halftone dots from different primary colors may overlap with each other to form various colors. This is an example of subtractive color mixing.

In general and as described herein, embodiments comprising a full-color digitized lighting image may be novel from either of the above described techniques related to display and printing technology. For instance, in some embodiments, RGB sub-pixels may be used as primary colors, and various colors may be simulated through tuning the emissive properties of the organic layer of each sub-pixel. As was described above, in some embodiments, the modulation of the emissive areas of the sub-pixels may be achieved via patterning insulating materials within the OLED device so as to define the emissive areas. However, as described above, embodiments of the insulating layer are not so limited. In some embodiments, the lighting panel may be commonly addressed through anode and cathode electrodes. Further details of an exemplary embodiment and process for generating full color-digitized images will be described below in detail. It should be understood that the software described for use in this exemplary embodiment is just one example, and that any suitable graphic tool may be used as long as the purpose is met.

Figure 17:
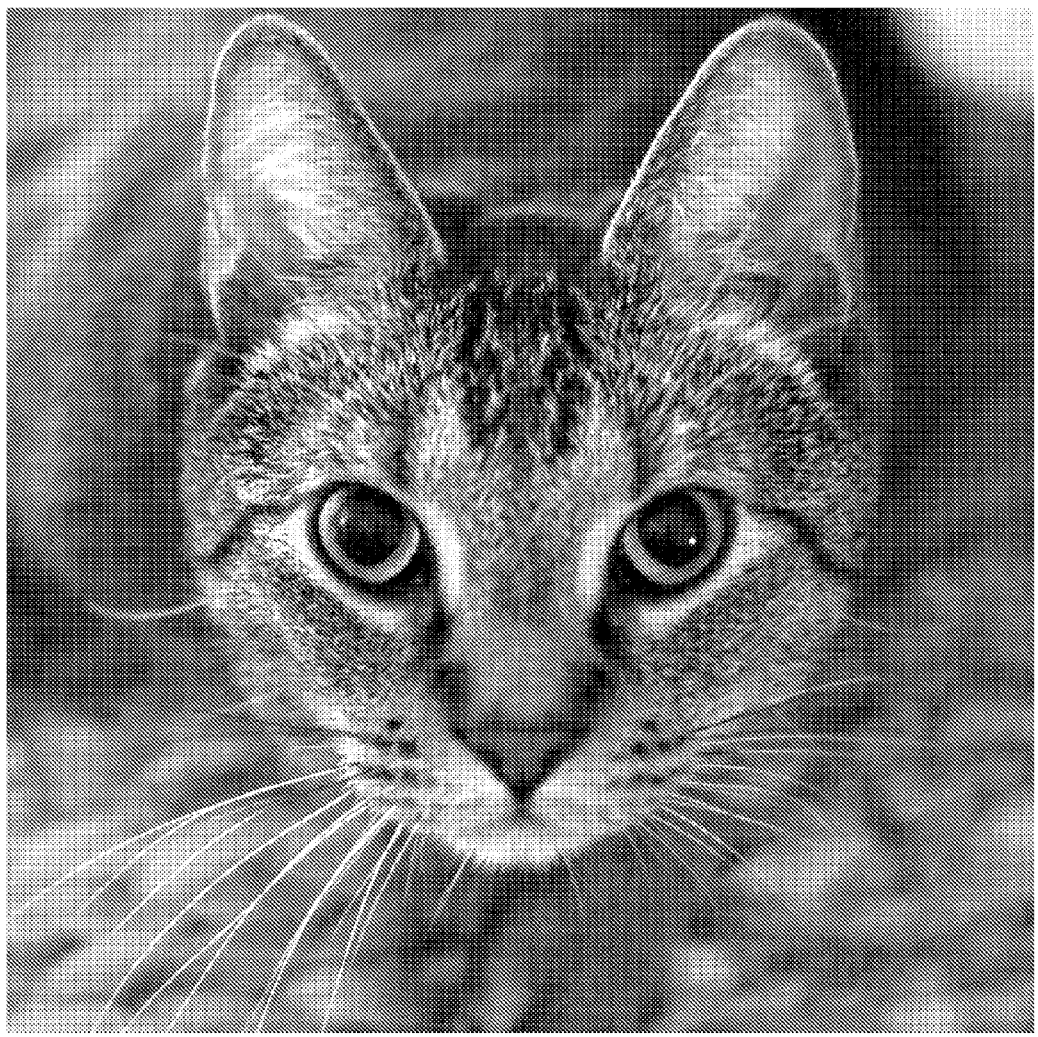
FIG. 17 shows a full color image (displayed here in grayscale) of a cat.

An original full-color image is shown in FIG. 17 of a cat (note that the image is displayed in grayscale for this application, but will be described below with respect to its original appearance). Reference will be made to FIGS. 18-25 to illustrate an exemplary process by which the original full-color image in FIG. 17 may be displayed using a digitized OLED light source. It should again be understood that while this exemplary process may be explained with respect to a patterned image layer that comprises an insulating material, embodiments are not limited to such implementations. Moreover, some or all of the features discussed below may be combined with other features or aspects of such devices as described herein. The exemplary process is provided for illustration purposes, and it should be understood that it is contemplated that steps may, in some embodiments, be performed in a different order and/or some steps may be added or omitted.

In an exemplary process, a pixel (and/or sub-pixel) configuration may be created and optimized based on the original full-color image, which may include the size, geometric shape, and pitch of the sub-pixel for each primary color. In the exemplary embodiment described herein, the inventors simulated this using VECTORASTER®. A target white point may also be initially chosen for the device. In this example, D65 was used having CIE 1931 (x, y) coordinates of (0.3127, 0.3290).

In some embodiments, the CIE 1931 (x, y) coordinates of each primary color may then be set such that a base unit (i.e. a "pixel") comprising one set of RGB sub-pixels adjacent to one another deliver white emission at the target white point under the desired operating condition (e.g. at a predetermined applied voltage and resultant luminance). In this example, initial CIE 1931 (x, y) coordinates of the three primary colors R, G, B were selected to be (0.7350, 0.2650), (0.2740, 0.7170) and (0.1670, 0.0090), respectively. In some embodiments, the initial CIE values may be determined based on the color property of the equivalent OLED test pixels as will be discussed below. Note that, these initial values may also be corrected according to the color properties, and/or luminance-voltage relationship, and/or target white point of different OLED devices as may be used in different designs, which will be discussed below.

In principle, the size, geometric shape, and/or pitch of the sub-pixels may be arbitrarily tuned so as to achieve a desired contrast when integrating three halftone single-channel images, which will be discussed in detail below. However, in practice, the ability to tune these parameters may normally be limited by practical considerations in the fabrication process, where the feature size of the components is decided. For example, patterns deposited through shadow masks using a VTE process may have a feature size associated with the thickness of the mask. Typically, the diameter of the opening on a shadow mask may be at least equal to or greater than the thickness of the mask. For example, in some embodiments, the feature size of the pattern deposited through a shadow mask may be greater than 25 μm (which may correspond to the thickness of a typical shadow mask). In some embodiments, the digitized patterns (corresponding to the patterned image layer) may be formed through a different process (such as photolithography) and may have a much finer feature size (for instance, in the range of 1~10 μm). As described below, in general the feature size of the portions of the patterned image layer may be finer than those of the sub-pixels such that a portion of the organic layer of the sub-pixel may be modified rather than the entire organic layer of the sub-pixel.

Figure 18:
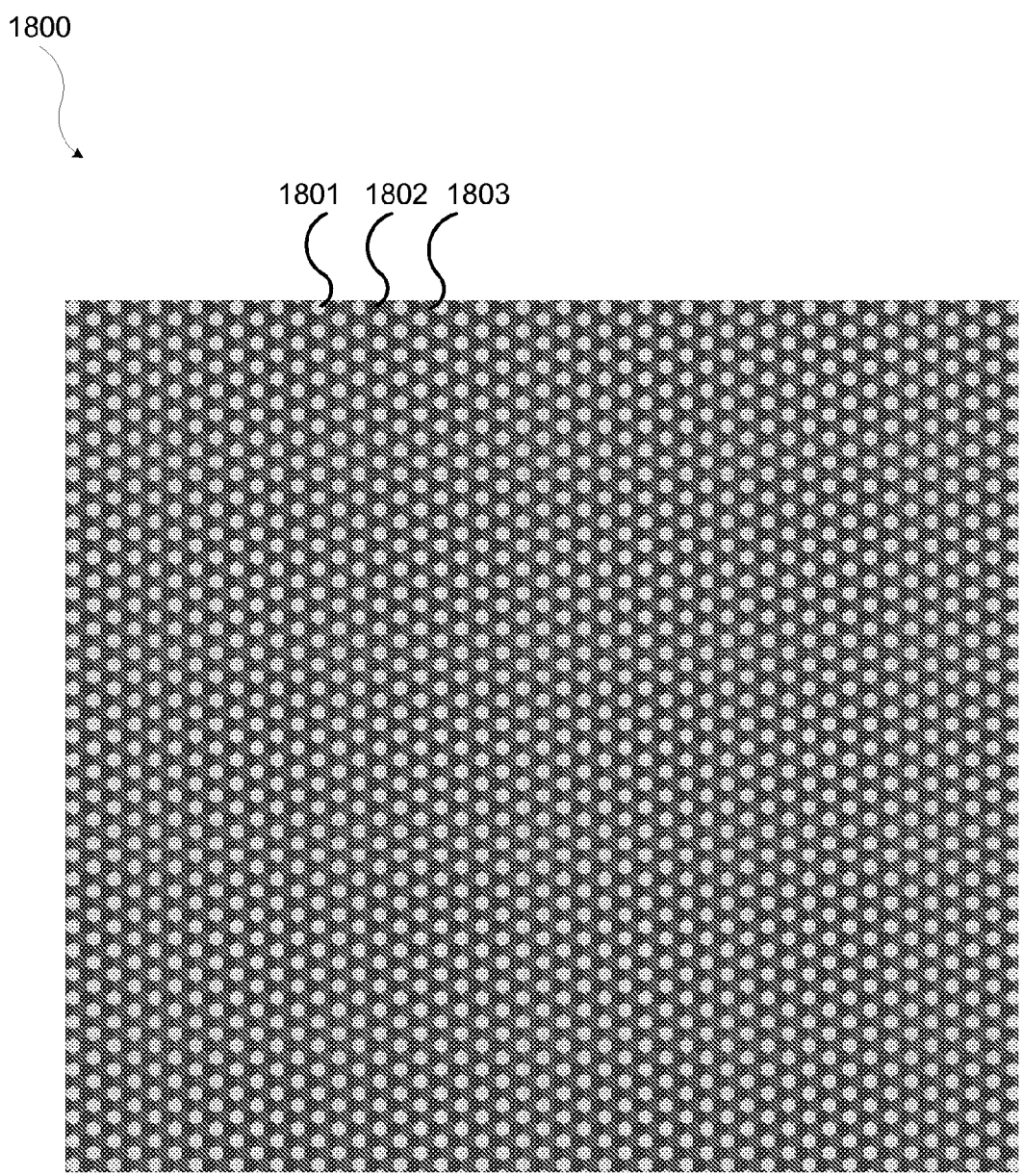
FIG. 18 shows an exemplary panel layout for a device comprising a plurality of red, green, and blue sub-pixels in accordance with some embodiments.

Continuing with this exemplary embodiment, each of the sub-pixels were optimized to have a hexagonal shape with the same diameter (the longest diagonal length) of 308 μm. Sub-pixels of the same color have a pitch to the adjacent pixel of 267 μm horizontally and 269 μm vertically (e.g. in the x-y plane), which is measured from the center of one sub-pixel to the center of an adjacent pixel. As noted above, one set of three adjacent sub-pixels comprising different colors may form a base unit (e.g. "pixel"), and the base unit may be evenly repeated to form the basic RGB pattern on the OLED light panel. The RGB pattern for this exemplary device is shown in FIG. 18 (displayed here in grayscale), which shows the optimized RGB pattern 1800 (i.e. comprising red sub-pixels 1801, blue sub-pixels 1802, and green sub-pixels 1803) for the original image shown in FIG. 17, where 94 dpi resolution was achieved.

As described above, to achieve white emission, the contribution from each color sub-pixel may be different, typically forming a luminous intensity ratio of 3:6:1 among R:G:B. Therefore, to generate white emissions to adapt to the human visual system response to different wavelengths of light, the luminous intensity of each color may be balanced for the device. The modulation of luminous intensity (I) having a unit of [cd] of a RGB base unit may be achieved by tuning the product of luminance (L) (having a unit of $cd/m^2$) and the emissive area (A) $[m^2]$ of each pixel as $I=L\times A$.

However, for some embodiments where the RGB sub-pixels in the digitized OLED light panel are to be commonly driven at the same voltage, the luminance level of each color may be different. For instance, operating at 4 V, the luminance may be 2,000 $cd/m^2$ for a red OLED, 12,000 $cd/m^2$ for a green OLED and 3,000 $cd/m^2$ for a blue OLED. In addition, luminance level may also be dependent on the driving condition (and usually this is a non-linear relationship). Therefore, the luminance-voltage (L-V) dependence of each color sub-pixel may be needed, and the operating condition may need to be set for some embodiments. The luminance-voltage relationship may be acquired from equivalent test pixels, which comprise device stacks that will be implemented into the panel (that is, for instance, small-area test pixels may be tested having device stacks corresponding to each of the sub-pixels).

Once the driving voltage $V_o$ is fixed, the luminance at this condition for red ($L_R$), green ($L_G$) and blue ($L_B$) may also be determined. If the emissive area of RGB sub-pixels are all the same, i.e. $A_R=A_G=A_B$, the combined emission may not have the desired intensity ratio (e.g. $I_R:I_G:I_B=3:6:1$) due to the luminance variation among the different colors. In this circumstance, a divisional factor $F_1$ may be calculated for each color to compensate for the difference, such that by multiplying the $F_1$ factor with the original emissive area, i.e. $A'=A\times F_1$, the luminous intensity ratio of the three colors may then be balanced, i.e. $I_R:I_G:I_B=(L_R\times F_{1R}):(L_G\times F_{1G}):(L_B\times F_{1B})$. For example, the operating voltage may be set at $V_o$=4 V, and the luminance of each of the RGB OLEDs may be $L_R$=2,000 $cd/m^2$, $L_G$=12,000 $cd/m^2$, and $L_B$=3,000 $cd/m^2$, respectively. To match the intensity ratio of $I_R:I_G:I_B$=3:6:1, the $F_1$ factor for red, green and blue are $F_{1R}$=1, $F_{1G}$=1/3, and $F_{1B}$=2/9. By multiplying the $F_1$ factors to the initial area, the intensity ratio $I_R:I_G:I_B$=(2000×1):(12000×1/3):(3000×2/9)=3:6:1. It should be understood that the process described above was for illustration purposes only and that the luminous intensity ratio of the sub-pixels may be determined according to the intended application of the device (which may result in the $F_1$ factor having to be re-calculated for different applications).

Further, in some embodiments, the variation of RGB color coordinates may result in the variation of the base unit (e.g. pixel) configuration. The CIE 1931 (x, y) coordinates of each of the RGB sub-pixels may be determined from the use of equivalent OLED test pixels and may therefore vary according to different device structures as well as design specifications. For instance, if the CIE 1931 (x, y) coordinates of one of the colors shifts from the values mentioned earlier, the composition of each color may be re-balanced to achieve white light emissions having a D65 white point (or other target white point as desired). In such circumstances, the sub-pixel emissive area of each color may be designed to be different from each of the other sub-pixels to accommodate the difference. Similarly, another divisional factor $F_2$ may be introduced to tune the emissive area for each color to match the target white point.

Taking such factors into consideration, in some embodiments the base unit may be configured to have three sub-pixels, each having different emitting areas. This may be done by, for instance, changing the outline of each sub-pixel (i.e. making the hexagon of each sub-pixel smaller or bigger, yet still a solid pattern). However, this may affect the evenness of the pattern of the sub-pixels and/or increase fabrication costs. In some embodiments, rather than changing the outline of each sub-pixel, dark regions (i.e. regions that do not emit light and/or emit light having a lower brightness) may be formed on each sub-pixel (where needed) to subtract from (i.e. reduce) the emissive area of the sub-pixel. This may be achieved by, for instance integrating the area correction into a patterned image layer that may locally alter the emissive properties of the organic layers of the sub-pixels (e.g. by using an insulating and/or resistive material in some embodiments). Thus, some embodiments provided herein may be utilized to set the target white point of a full-color panel, without having to change the size of the sub-pixels and/or change the emitting material used for each sub-pixel. In addition, the base solid RGB unit may be commonly used for other designs so that only a subtractive pattern may need to be generated separately for each design. The subtraction pattern may then be integrated (e.g., added) into the patterned image layer. That is, for instance, a single (perhaps uniform) panel design comprising sub-pixels of a given size and comprising a given emitting material may serve as a template, which may be altered as required for multiple applications by changing the patterned image layer that is deposited between the first and the second electrodes of each sub-pixel. Embodiments may thereby simplify the process of setting a target white point for a device, as well as reduce manufacturing costs.

Figure 19:
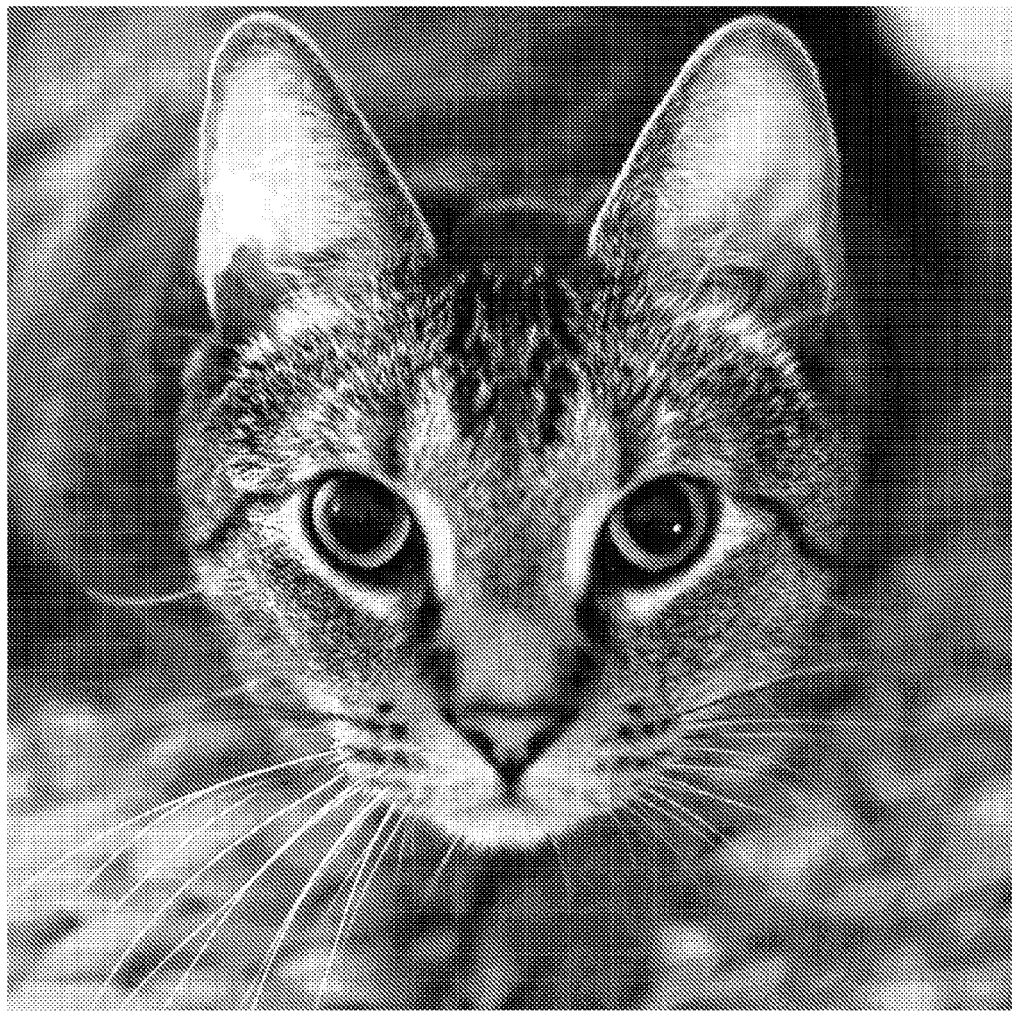
FIG. 19 shows a red color channel image (displayed here in grayscale) of a full color image in accordance with some embodiments.
Figure 20:
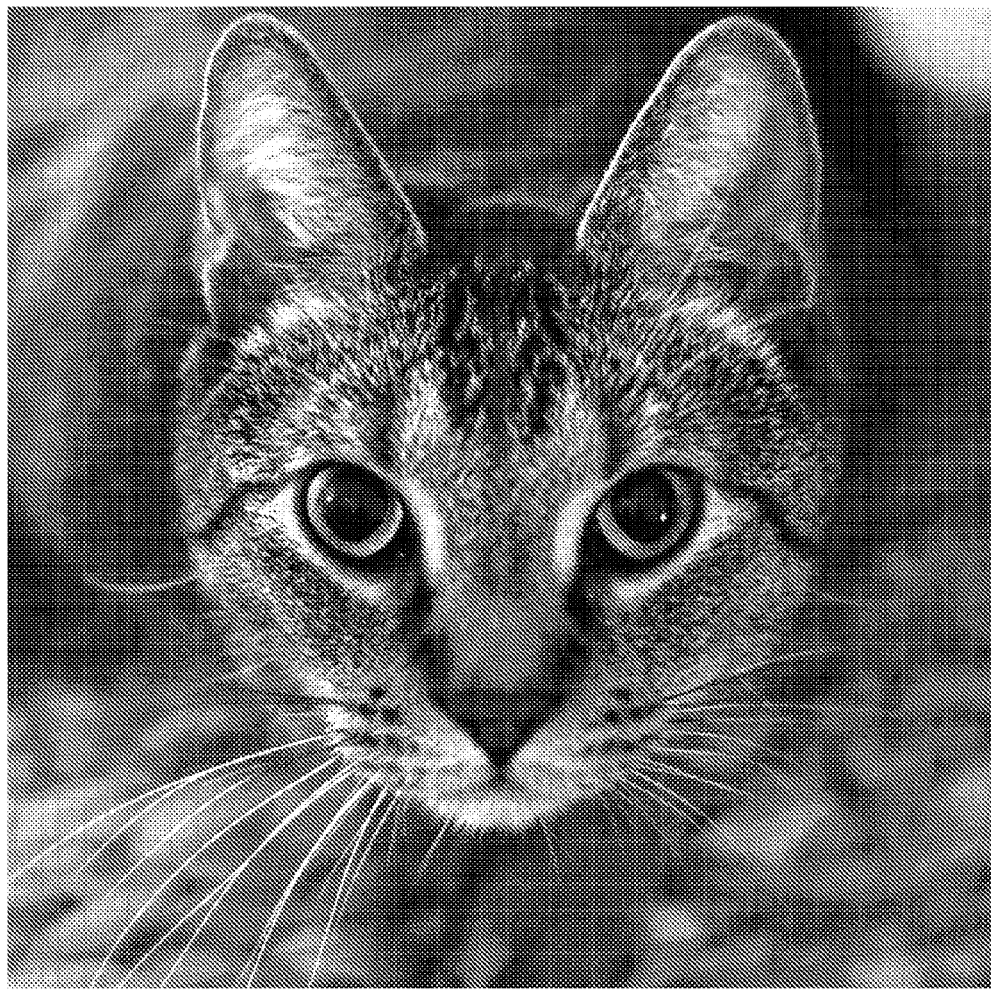
FIG. 20 shows a green color channel image (displayed here in grayscale) of a full color image in accordance with some embodiments.
Figure 21:
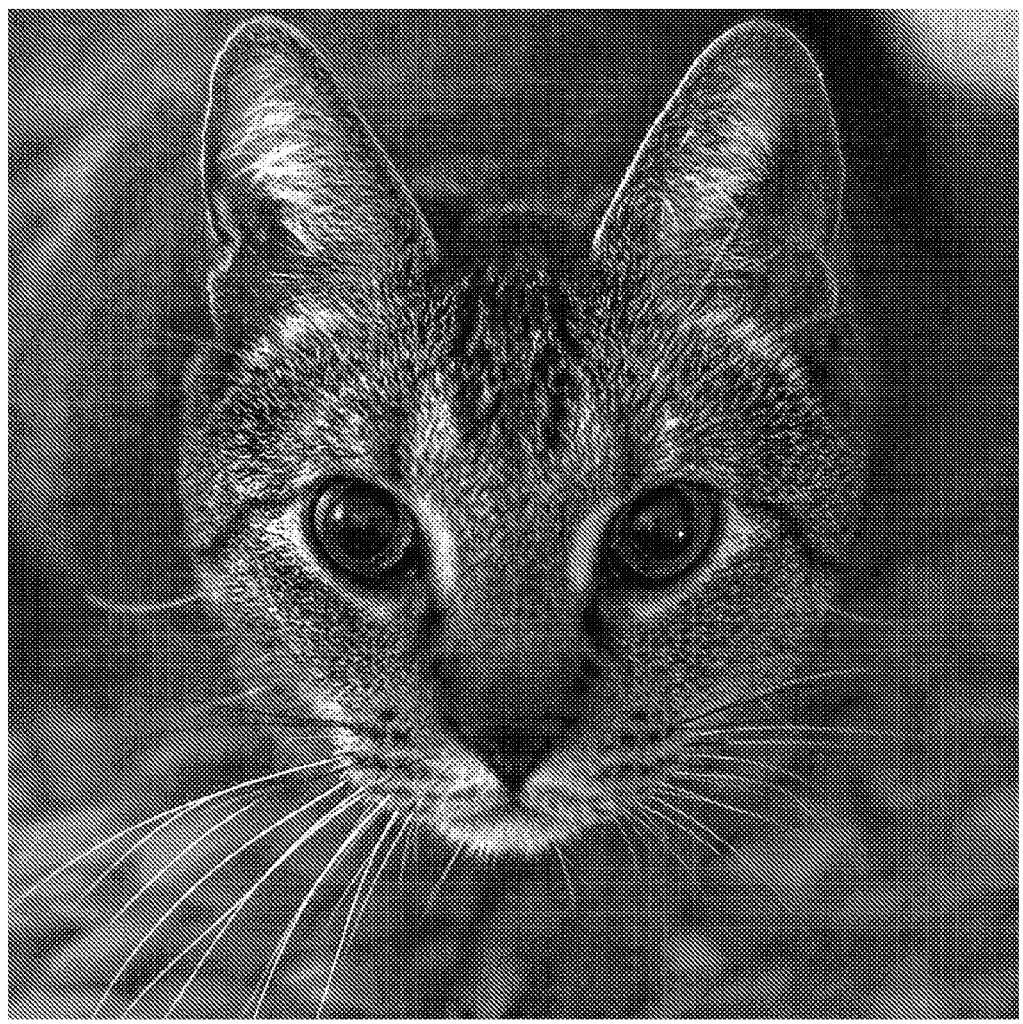
FIG. 21 shows a blue color channel image (displayed here in grayscale) of a full color image in accordance with some embodiments.

Returning to the exemplary process for developing and fabricating a full-color digitized OLED light panel, the inventors used Photoshop® to break down the full-color image in FIG. 17 into three color channels, and the extracted single-channel images are shown in FIGS. 19, 20, and 21, with red, green and blue channels respectively. A channel in a color image is the grayscale image derived from the original full-color image, made of just one of the primary colors. It should be noted that FIGS. 19-21 are displayed in grayscale for purposes of this application based on the original single-channel images, which display grayscaled red, green and blue images, respectively. In general, the single-channel images map the required contribution from each primary color at each location in the full-color image of FIG. 17. In this exemplary process, a halftone process was then applied to each single-channel image, as described above. Dark dots (in this exemplary embodiment, realized via a patterned image layer that comprises insulating materials) were patterned to transform the single-channel continuous-tone images to digitized images. VECTORASTER® was used to facilitate this transformation.

Figure 22:
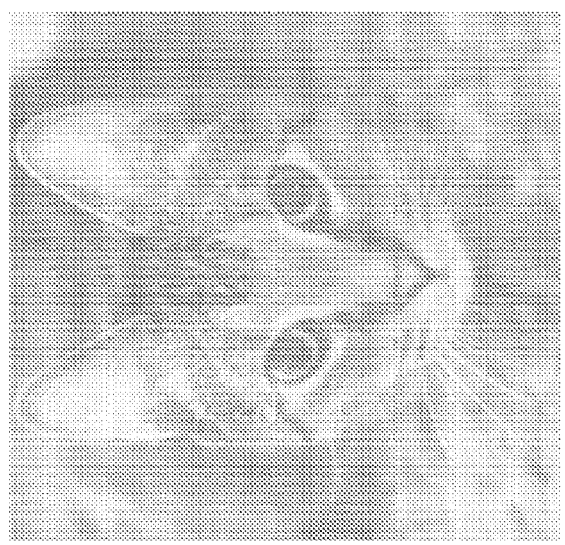
FIGS. 22(a)-(c) show exemplary digitized halftone images for each of the color channels shown in FIGS. 19-21, respectively.
Figure 22:
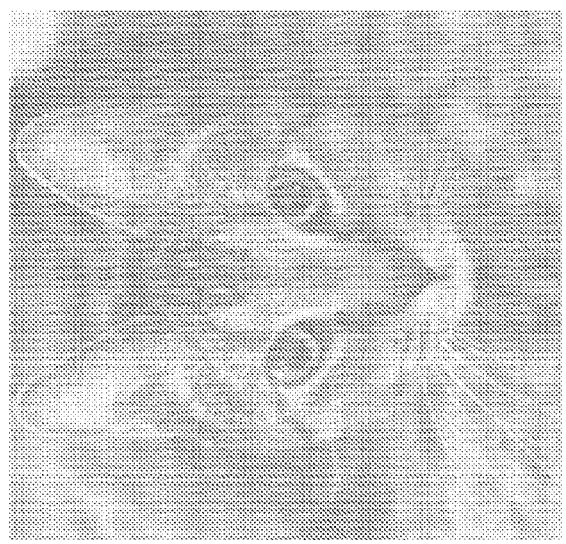
Figure 22:
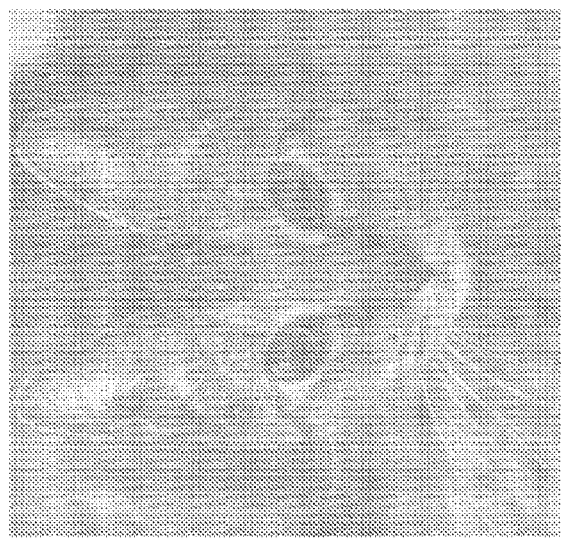

As was described above, the pitch and the minimum size of the dots (corresponding to portions of the patterned image layer that are disposed in each of the sub-pixels (as needed)) are typically limited by the practicalities of the fabrication process. In the exemplary embodiment described herein, the shape of each dot was a hexagon and the diameter of the dots ranged from 100 to 308 µm, with a pitch of 267 µm horizontally and 269 µm vertically. That is, the center of each dot in this example had the same center-to-center distance from adjacent dots as each of the other dots, but the size was varied to achieve the desired emissive properties for each sub-pixel. The arrangement of the dots, including the geometric shape, size, and pitch, was optimized to achieve the best contrast for this exemplary embodiment. In addition, in some embodiments, the pitch of the dots may be the same as that of the basic pattern for the sub-pixels. After the halftone process, three digitized images were generated for three primary colors R, G, and B, as shown in FIGS. 22(*a*)-(*c*), respectively. Again, FIG. 22(*a*)-(*c*) are displayed in grayscale for the purpose of this application based on the original images, which comprises dark halftone dots on a full-red, full-green and full-blue background, respectively. These images were then integrated in the following steps described below to form the final digitized pattern for this exemplary device.

Figure 23:
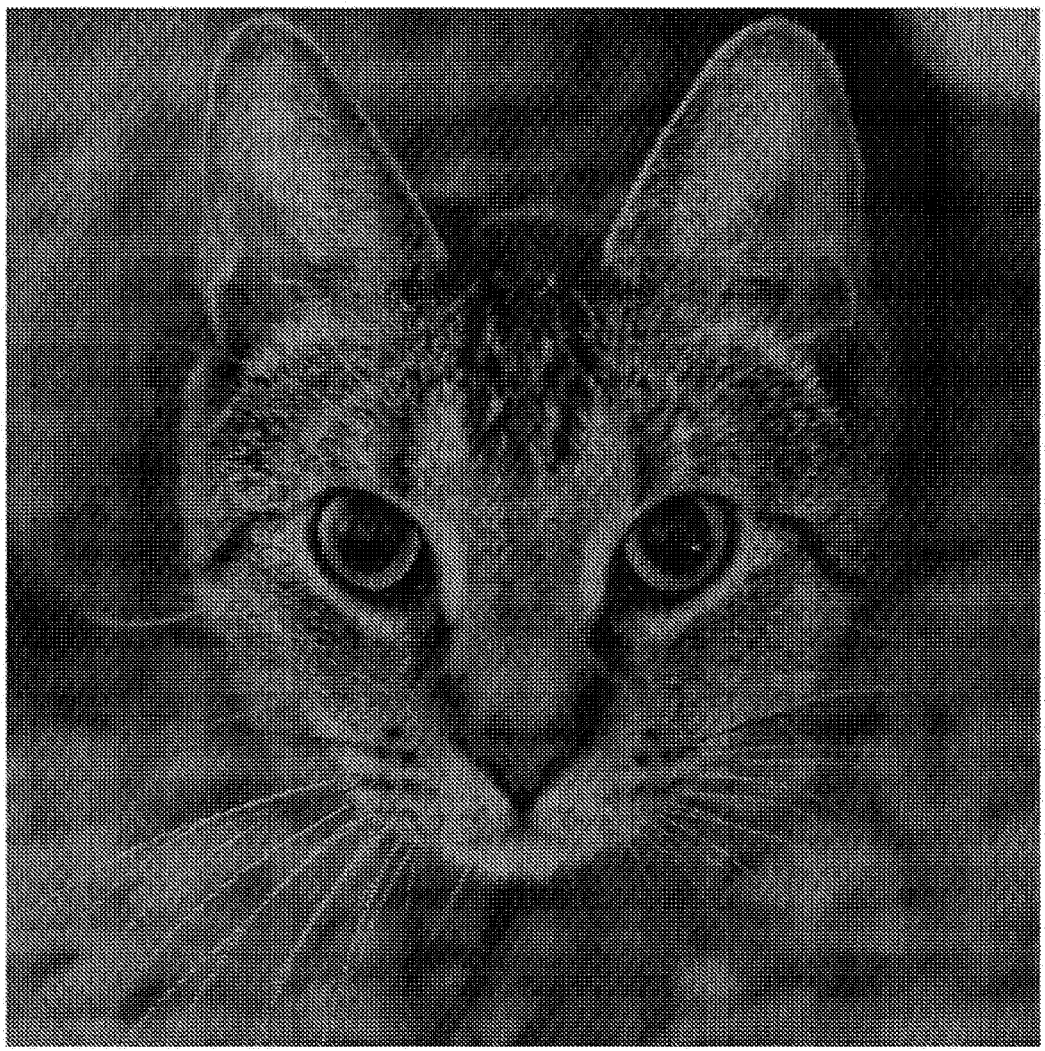
FIG. 23 shows a combined digitized halftone image of FIGS. 22(a)-(c) (displayed here in grayscale).
Figure 24:
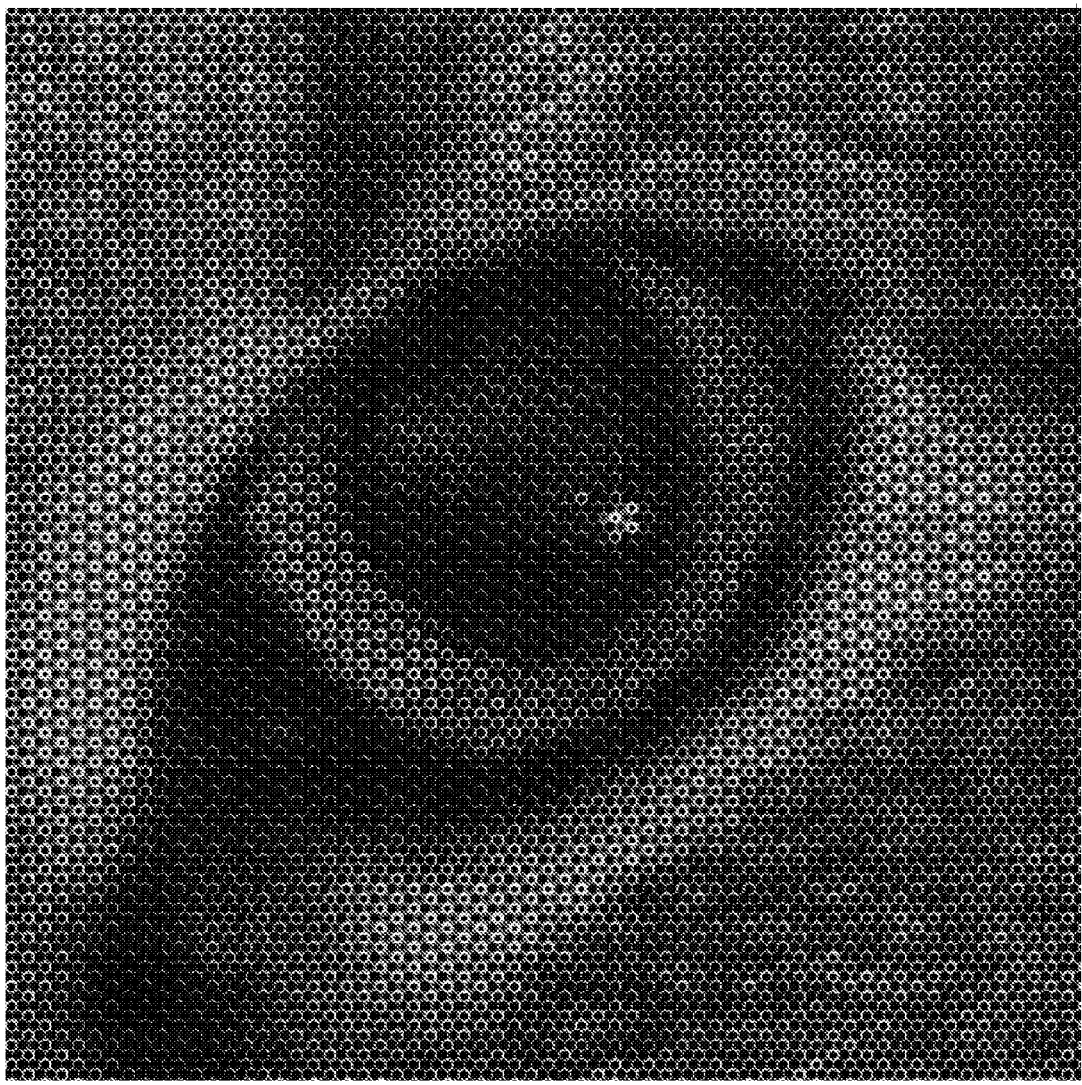
FIG. 24 shows a close-up of a portion of the image in FIG. 23 (displayed here in grayscale).

The final step in this exemplary process performed by the inventors was to align the digitized single-color images (shown in FIGS. 22(*a*)-(*c*)) with the basic RGB pattern (shown in FIG. 18), where the halftone dots determined for each color are aligned so as to be disposed in the sub-pixels of the same color (i.e. the dots corresponding to FIG. 22(*a*) will each align with a red sub-pixel, the dots corresponding to FIG. 22(*b*) will each align with a green sub-pixel, and the dots corresponding to FIG. 22(*c*) will each align with a blue sub-pixel). This is shown in FIGS. 23 (overall image) and 24 (a close-up image). Again, FIGS. 23 and 24 are displayed in grayscale for the purpose of this application based on the original full-color image, which comprises dark halftone dots on arrays of RGB sub-pixels. In one aspect, when $F_1$ and/or $F_2$ for any of the three sub-pixel colors≠1, a subtractive pattern may be integrated into the patterned image layer. That is, the subtractive pattern, as discussed above, may be added to the dots of the patterned image layer (i.e. the size of the dots may be corrected with the addition of the subtractive pattern) so as to form a revised digitized pattern (such that, for instance, a target white point for a device may be achieved). The size, geometric shape and pitch of the basic RGB pattern and the halftone dots may be further optimized in some embodiments to achieve the best contrast and grayscale. The revised integrated digitized patterns for all three colors can then be extracted as one layer. In some embodiments and as explained above, insulating material may be disposed between the anode and cathode to form this pattern. The organic emissive layers may be patterned into RGB pixels according to the basic pattern without any subtractions, as described above.

In some embodiments, rather than creating halftone dots within each sub-pixel, the base unit may be treated as one pixel and dots for the three sub-pixels may be merged to the center (or relevant portion) of the pixel (or any other suitable combination of merging halftone dots corresponding to more than one sub-pixel). Examples illustrating such embodiments are shown in FIGS. 25(*a*)-(*c*), which show a red sub-pixel 2501, a blue sub-pixel 2502, a green sub pixel 2503, and shadow regions that represent the halftone dots 2504. The halftone dots 2504 may have any area that is needed to display an image. For instance, the halftone dots 2504 may occupy the same area of each of the sub-pixels (shown in FIG. 25(*a*)), different areas of each sub-pixel (shown in FIG. 25(*b*)), or even have no occupation in one or more of the sub-pixels (shown in FIG. 25(*c*)). Embodiments that comprise merged dots may provide the advantage that the limitation of feature size (e.g. based on practical considerations related to manufacturing) may be extended. For example, as the dimension of a halftone dot is typically smaller than the sub-pixel, assuming an embodiment where the critical dimension of the halftone dot is limited to 50 µm, if the halftone dot is disposed on each individual sub-pixel, the smallest dimension for a sub-pixel may then be 50 µm; however, if the halftone dots from different sub-pixel colors are merged together (i.e. the portion of halftone dot in each sub-pixel may have a dimension less than 50 µm), the smallest dimension for a sub-pixel may be reduced to, for instance, one-third of 50 µm (about 16.7 µm). In this manner, embodiments may improve the resolution and the grayscale of the image by utilizing smaller sub-pixels.

Embodiments Comprising Mixed-Color Digitized Lighting

Described above are exemplary methods of fabricating monochromic and full-color digitized lighting (and devices thereto). In some embodiments, mixed-color digitized lighting images may be provided by a digitized OLED light panel. For instance, in some embodiments a device may comprise a common layer of an emitting material having an emission spectrum corresponding to a first color (such as R, G, B or white). A second emissive material having an emission spectrum that corresponds to a second color that is different from the first color may be disposed in the device through a digitized pattern. For example, a common layer of emissive material that emits red light may be disposed in an exemplary device, and a digitized layer of emissive material that emits green light may be disposed either before or after the red emissive material layer (i.e. above or below in the device). When the device is activated, the overlap of red and green light from each of the emissive materials may form a yellow emission, and a yellow image on a red background may be realized. In some embodiments, the digitized pattern may comprise a down conversion material. The down conversion material layer may comprise a material that absorbs light having a peak wavelength corresponding to the emission spectrum of the common emissive material. In this manner, when the device is in operation, the portions of the emissive area where there is an overlap between the digitized down conversion material layer and the common emissive material may emit light having optical properties (such as chromaticity) corresponding to the emission spectrum of the down conversion material (or the light emissions may be modified by the light emissions from the down conversion material). It should be understood that the examples provided are for illustration purposes, and that after reading this disclosure, a person of ordinary skill in the art may understand various features and configurations described herein may be used to provide mixed-color digitized images.

Embodiments Comprising a Fuse

In some embodiments, electrical fuses may be integrated into the digitized OLED light panel so to reduce the likelihood of catastrophic failure due to localized electrical shorts. In some embodiments, the emissive area of the panel may be pixilated, where each pixel may contain at least one digitized dot. Each digitized dot may be associated with a fuse, such that when a short happens in one region of the emissive area, the fuse correlated to the digitized dot that is closest to the short may open (e.g. blow out) because of the excess current, thereby electrically isolating a portion of the device by creating an open circuit. The integration of electrical fuse into a light panel is described in detail in U.S. Pat. App. No. 61/431,985 entitled "OLED Device with Short Tolerant Structure," which is hereby incorporated by reference in its entirety. For example, in some embodiments, the anode may be patterned to facilitate the application of fuse embodiments. In some embodiments, the cathode may be patterned to incorporate the fuse.

Embodiments Comprising Multiple Images

In some embodiments, a digitized OLED light panel may be used to display multiple images. In some embodiments, device stacking may be used to realize multiple images on a single panel, examples of which are shown in FIGS. 26(a) and (b). With reference to FIG. 26(a), the device 2600 is shown as comprising two OLEDs vertically stacked together, where a first OLED is disposed on the substrate 2601 and comprises a first electrode 2602, a first patterned image layer 2607, a first organic layer 2603, and a common electrode layer 2604. The device 2600 is also shown as comprising a second OLED that is disposed over the first OLED (such that they may be optically coupled), comprising a common electrode layer 2604, a second image layer 2608, a second organic layer 2605 and a second electrode 2606. In some embodiments, the first electrode may be the anode for the first OLED, and the second electrode may be the cathode for the second OLED. The common electrode 2604 may be shared by the two OLEDs, which may serve as a cathode for the first OLED and at the same time an anode for the second OLED. An example of a common electrode may be a compound cathode, such as Ca/IZO; however, any suitable material (or materials) may be used. As shown, the pattern of the first patterned image layer 2607 may be different from that of the second patterned image layer 2608. In some embodiments, a first electrical contact may be connected to the first electrode 2601, a second electrical contact may be connected to the common electrode 2604, and a third electrical contact may be connected to the second electrode 2606. In this manner, in some embodiments, a first image may be displayed when a voltage is supplied between the first electrode 2601 and the common electrode 2604; a second image may be displayed when a voltage is supplied between the common electrode 2604 and the second electrode 2606; and a combination of the first and the second image may be displayed when a first voltage is supplied between the first electrode 2601 and the common electrode 2604 and a second voltage is supplied between the common electrode 2604 and the second electrode 2606 (e.g. the first electrode 2601 may be connected to 5 V, the common electrode 2604 may be connected to 0 V, and the second electrode 2606 may be connected to −5 V).

With reference to FIG. 26(b), another exemplary embodiment is depicted where a common cathode 2614 is used, and the second OLED is an inverted device. That is, the first OLED may be disposed on the substrate 2611 and may comprise a first anode 2612, a first patterned image layer 2617, a first organic layer 2613, and a common cathode 2614. The device is also shown as comprising a second OLED that is disposed over the first OLED (such that they may be optically coupled), comprising a common cathode 2614, a second image layer 2618, a second organic layer 2615 and a second anode 2616. Similarly, to the exemplary device shown in FIG. 26(a), three images may be displayed by applying a voltage between the first anode 2612 and the common cathode 2614, applying a voltage between the second anode 2616 and the common cathode 2614, and applying a first voltage between the first anode 2612 and the common cathode 2614 and a second voltage between the second anode 2616 and the common cathode 2614. In the exemplary embodiments above, the three images may be substantially the same size as the panel. However, even though the images are coming from the same panel, they are physically separated in two different layers. Thus, by tuning the thickness of different layers, in some embodiments a three dimensional (3D) visual effect may be achieved, owing to the physical distance between the two image layers.

In the exemplary embodiments described above with reference to FIGS. 26(a) and (b), to display three images, the common electrode (2604 and 2614) and at least one of the top or bottom electrodes may be transparent or semi-transparent. However, in some embodiments (for instance, when it is preferred that two images can be seen—one that can be seen by viewing one side of the device, and the second that can be seen by viewing a different side of the device), the common electrode may be reflective and both the top and bottom electrodes may be transparent or semi-transparent.

Figure 27:
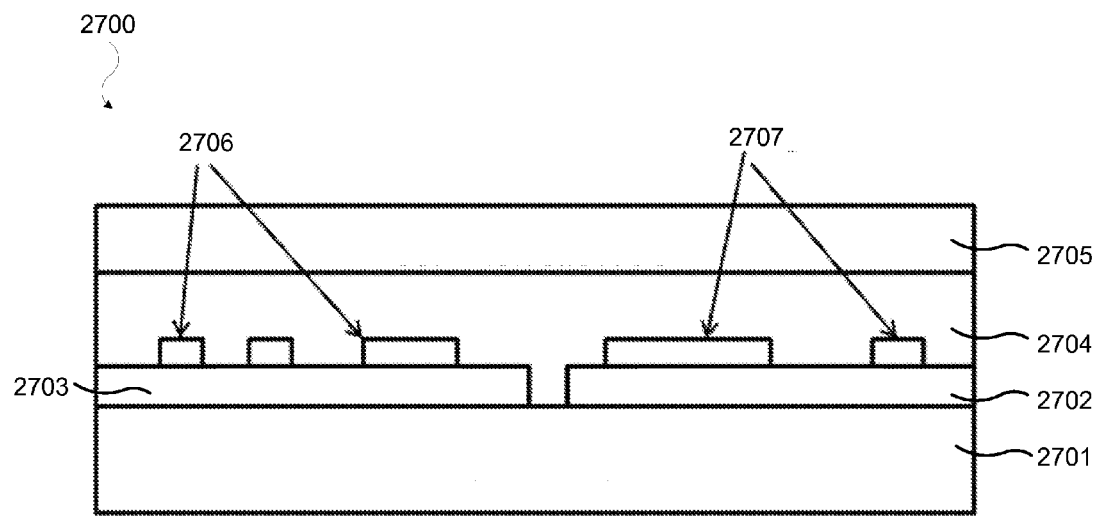
FIGS. 27(a)-(b) show exemplary digitized OLED light sources in accordance with some embodiments.
Figure 27:
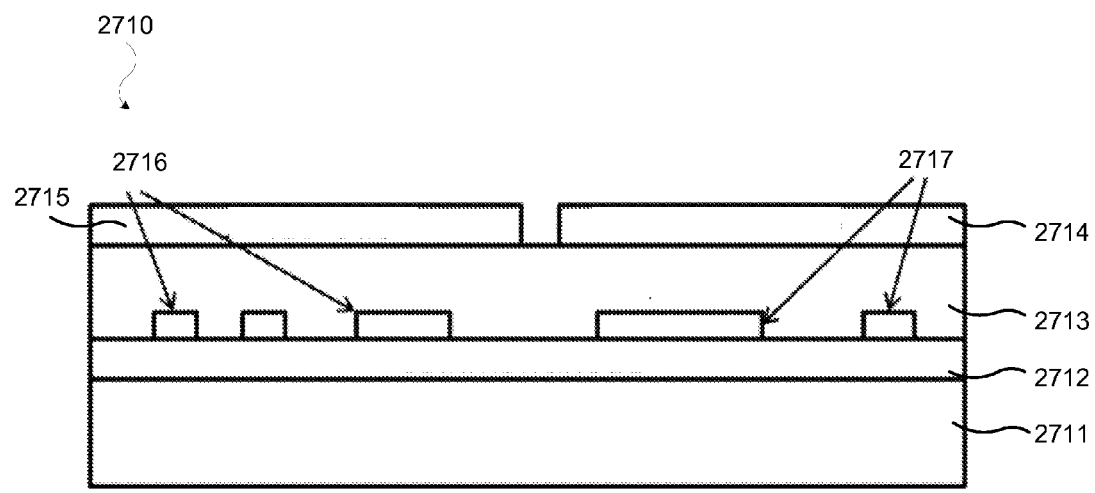

With reference to FIGS. 27(a) and (b), another exemplary approach of providing multiple images using a single digitized OLED light panel is shown, where two electrodes may be patterned such that the panel (2700 or 2710) is divided into multiple segments, and each of the segments may be individually addressed. For example, FIG. 27(a) illustrates an embodiment where the anode is patterned into two segments (2702 and 2703), and two images may be displayed that are associated with each of the anodes. In some embodiments, the two images may be disposed through a single patterned image layer (2706 and 2707), which may reduce fabrication costs, or the patterned image layers (2706 and 2707) may be separate layers. A common organic layer 2704 and a common cathode 2705 may be disposed over the patterned image layer (2704 and 2705) and the patterned anodes (2702 and 2703), which are disposed on a substrate 2701. A first electrical contact may be connected to the first segment of the anode 2702 (associated with the first image), a second electrical contact may be connected to the second segment of the anode 2703 (associated with the second image), and a third electrical contact may be connected to the common cathode 2705. By applying a voltage between the first anode 2702 and the common cathode 2705, a first image may be displayed; by applying a voltage between the second anode 2703 and the common cathode 2705, a second image may be displayed; and by applying a first voltage between the first anode 2702 and the common cathode 2705 and a second voltage between the second anode 2703 and the common cathode 2705, a third image may be displayed (which may comprise a combination of the first image and the second image).

In some embodiments, the cathode may be patterned into multiple segments while the anode may be common to multiple OLED devices, as illustrated in the exemplary embodiment shown in FIG. 27(b). The exemplary device 2710 comprises a substrate 2711, a common anode 2712, a patterned image layer (2716 and 2717), a common organic layer 2713, and patterned cathodes (2714 and 2715). Three electrical contacts may be connected: one electrical contact to the common anode 2712, one electrical contact to the first segment of the cathode 2714, and one electrical contract to the second segment of cathode 2715. Similar to the exemplary device shown in FIG. 27(a), by supplying power to each of the different contacts, three images may be displayed (one image that may be associated with each of the first 2714 and second 2715 segments of the cathode, and a third image that may comprise a combination of the first and the second images).

It should be understood that, while described with respect to two images (corresponding to two separate segments of the anode or cathode), the number of the images that a device may display may be determined by the number of the total number of segments. For instance, a digitized OLED light panel may be divided into any number of segments, and each segment may provide a different image when activated (which may each comprise a portion of a larger image or images). Moreover, in some embodiments, although each image may be smaller than the panel size, the content of each image may be designed in a way that, for instance, when turned on subsequently (i.e. when illuminating one or more segments at different times), a connection or even a story may be displayed. In general, external electrical circuitry may be added to control the operation of the devices that comprise multiple images. For example, as noted above, the multiple images associated with each segment (or segments, when illuminated simultaneously) may be designed to display subsequently at a certain frequency such that a motion effect may be achieved, which adds diversity to the applications that such panels may be used for.

In some embodiments, the patterning of electrodes to display multiple images (e.g. as depicted in FIGS. 27(a) and (b)) can be combined with the integration of multiple patterned image layers (e.g. as depicted in FIGS. 26(a) and (b)), to create richer display content and visual effect, including motion effect and/or 3D effect.

Additional Exemplary Embodiments

Described below are further exemplary embodiments of devices, and methods of fabricating such devices, that comprise a digitized OLED light source. The embodiments described herein are for illustration purposes only and are not thereby intended to be limiting. After reading this disclosure, it may be apparent to a person of ordinary skill that various components and features as described below may be combined or omitted in certain embodiments, while still practicing the principles described herein.

Exemplary Methods:

Embodiments described herein may provide devices comprising a digitized OLED light source and/or methods of manufacturing such devices. In some embodiments, a first method may be provided. The first method may comprise the steps of depositing a first conductive layer over a substrate, depositing a first organic layer comprising electroluminescent material over the first conductive layer, and depositing a second conductive layer over the first organic layer. In general, any of these layers may be deposited so as to be common to one or more OLED devices on a light panel. Moreover, each layer may be deposited in any suitable manner, including the various methods that are described herein. These steps of the first method may define one or more OLED devices that may comprise an OLED light panel.

The first method may further comprise the step of depositing a first patterned image layer over some but not the entire first conductive layer, where the first patterned image layer locally alters the emissive properties of the first organic layer. The patterned image layer may comprise any suitable material, and may be disposed in any suitable manner. As defined above, the term "locally alters" may refer to the patterned image layer affecting the emissive properties of regions of the first organic layer for which the portions of the first patterned image layer are disposed near to and/or are physically, electrically, or optically coupled to (depending, for instance, on the properties of the patterned image layer and how it may alter the emissive properties of the organic layer). In this manner, the patterned image layer may, in some embodiments, be utilized to create light emission variation across an OLED light panel that, when the device is activated, may generate an image that is perceivable by a viewer.

The first method may further comprise depositing the first patterned image layer such that the shape of the first patterned image layer may be based on a non-uniform visual image. As used herein, the "shape" of the first patterned image layer may comprise the location of the deposition of the first patterned image layer over the surface of the substrate (or other layer(s) of the device). Moreover, for embodiments where the first patterned image layer comprises a plurality of isolated portions, the "shape" of the first patterned image layer may comprise not only the location of those portions, but also the sizes and geometric shapes of the portions of the patterned image layer. In addition, the shape of the patterned image layer may be "based on" an image if, for instance, the shape of the first patterned image layer is deposited in accordance with the image. For example, the shape of the patterned image layer may be deposited in accordance with the location or placement of dots of a halftone image (which itself may be based on a continuous-tone image). The patterned layer does not necessarily have to form the image, but may in some embodiments have a shape that causes the light emissions from the first organic layer to generate the image (or contribute to generating an image) which may be perceivable to an observer.

As was described above, embodiments that comprise a first patterned image layer that locally alters the emissive properties of the organic layer of an OLED device may provide advantages over displays. For instance, embodiments may provide for the ability to display an image on a lighting device without the need for expensive and complex circuitry (as in an AMOLED display) or using excess current to power devices (such as PMOLED display). This may reduce fabrication costs, and may allow for the use of such devices in applications that may not be feasible for more expensive devices (e.g., for use as advertisements, disposable image displays, etc.). Moreover, as noted above, devices that comprise a patterned image layer may display an image while maintaining significant portions of the display as transparent or semi-transparent. This may permit applications whereby the device may function as a window in an off-state (e.g. a viewer may look through or at the display area unimpeded), while in the on-state an image may then be displayed. This may have application, for instance, as decorative art or designs, advertisements, etc.

In some embodiments, in the first method as described above comprising the steps of depositing a first organic layer, depositing first and second conductive layers, and depositing a first patterned image layer over some but not all of the first conductive layer, the first patterned image layer may be deposited through a mask. The mask may comprise a patterned mask (such as a fine metal mask) and may be used so that the shape of the first patterned image layer may locally alter certain portions of the organic layer so as to create an image when the display is in an on-state. However, as was noted above, the first patterned image layer may be deposited in any suitable manner. Thus, in some embodiments, the first patterned image layer may be deposited by ink jet deposition and/or any one of: vacuum thermal evaporation (VTE), e-beam evaporation, plasma enhanced chemical vapor deposition (PECVD), low-pressure chemical vapor deposition (LPCVD), photolithography, or laser etching. In general, it may be preferred that the deposition method used for the first patterned image layer permit the feature size of the first patterned image layer (e.g. the smallest size of portions of the layer) to be as small as possible, which may provide for higher resolution images. Moreover, in some embodiments, smaller size portions of the first patterned image layer may permit for smaller (and thereby additional) sub-pixels to be used in embodiments, thereby potentially increasing resolution and fidelity of the device.

In some embodiments, in the first method as described above comprising the steps of depositing a first organic layer, depositing first and second conductive layers, and depositing a first patterned image layer over some but not all of the first conductive layer, the first patterned image layer may comprise an insulating material. An "insulating material" may refer to a material through which electrical charge does not pass. For instance, a first patterned image layer that comprises an insulating material may generate an image by differentially blocking exciton generation (and thereby light emission) from the first light source. Thus, the emissive properties of the first organic layer may be "locally altered" in such embodiments because the insulating material blocks current flow and exciton generation. Embodiments where the first patterned image layer comprises an insulating material may have wide applicability in generating an image on a digitized OLED light panel. By way of example only, an insulating patterned image layer may be used to create grayscale images by blocking portions of the emissive area of an OLED light panel (such as described above with regard to the halftone image process). However, embodiments are not so limited, and may be used, for instance, in full color displays to achieve a target white point, to control the emission levels of sub-pixels such that their combined emissions provide a desired chromaticity, etc.

In some embodiments, in the first method as described above comprising the steps of depositing a first organic layer, depositing first and second conductive layers, and depositing a first patterned image layer over some but not all of the first conductive layer, the first patterned image layer may comprise a down conversion material. A "down conversion material" (or down converter) may, for instance, comprise fluorescent material which efficiently absorbs higher energy photons (e.g. blue light) and re-emits photons at lower energy (e.g. at either green or red light), depending on the materials used. A patterned image layer that comprises a down conversion material may locally alter the emissive properties of the first organic layer because the down conversion material absorbs light emitted by the first organic layer and re-emits light at a different wavelength, while being disposed between the electrodes of the first device. Embodiments comprising a down conversion material may, for instance, be particularly beneficial in devices having a common organic layer, such that the patterned image layer may provide for portions of the display to emit light having a different chromaticity than other portions. This may create an image (which may be monochromic) over a monochromic background. For instance, if the common organic layer emits blue light, and a down conversion layer has an absorption spectrum that absorbs blue light and an emission spectrum corresponding to red light, the patterned image layer may be deposited over sections of the organic layer so as to create a red image with a blue background. However, embodiments are not so limited, and a device comprising a down conversion layer may be used in any suitable manner.

In some embodiments, in the first method as described above comprising the steps of depositing a first organic layer, depositing first and second conductive layers, and depositing a first patterned image layer over some but not all of the first conductive layer, the first patterned image layer may comprise an emissive material. Embodiments that provide a patterned image layer that comprises an emissive material my locally alter the emissive properties of the organic layer because, for instance, the emissive material may trap excitons and emit them at a different wavelengths than the emitting material of the first organic layer. The emissive material in the first patterned image layer may have an emission spectrum having a peak wavelength that differs from the peak wavelength of the emission spectrum of the emitting material of the organic layer. The emissions from each of these emissive materials may be combined (e.g. added) such that when viewed by an observer, portions of the device may emit light having different chromaticities (which may, for instance, generate a color image).

In some embodiments, in the first method as described above comprising the steps of depositing a first organic layer, depositing first and second conductive layers, and depositing a first patterned image layer over some but not all of the first conductive layer, the first patterned image layer may comprise a resistive material. A "resistive material" may comprise any material that permits current to flow through it, but may provide a voltage drop across that portion of the material. That is, unlike an insulating material, current may still pass through that portion of the patterned image layer. A resistive material may comprise, for instance, a dielectric, organic, or metallic material, so long it elevates the energy barrier for the charges to flow through. In this regard, a resistive material may also be an electrically conductive material. For example, aluminum can be disposed over the anode of an OLED to suppress hole injection, even though aluminum itself is a highly-conductive metal. Thus, as used herein, "resistive material" does not mean the material is necessarily electrically resistive. Embodiments that comprise a resistive material may locally alter the emissive properties of an organic layer because the resistive material may at least partially hinder the current flow. In general, embodiments that comprise a resistive material for a patterned image layer may be particularly applicable to grayscale an image, because, for instance, certain portions of the OLED may thereby be energized by different current densities and have different brightness levels.

In some embodiments, in the first method as described above comprising the steps of depositing a first organic layer, depositing first and second conductive layers, and depositing a first patterned image layer over some but not all of the first conductive layer, the first patterned image layer may be transparent or semi-transparent. That is, the patterned image layer may itself not be visible such that, when the device is in an off-state, an image is not displayed on the device. As noted above, this may provide advantages for embodiments where the device may also serve as, for instance, a window or a mirror. As noted above, more complex devices such as AMOLED displays may not be transparent in certain embodiments because of the additional opaque circuitry needed to display images on such devices. Moreover, devices that, for instance, may comprise a printed image which a light source is disposed behind may also not be transparent and thereby may not provide for the additional utility of allowing a viewer to look through the display unimpeded in the off-state. However, embodiments are not so limited, and therefore in some embodiments, the first patterned image layer may comprise an opaque material. Such embodiments may be beneficial, for instance, where it may be desired that an image may be viewed in the off-state of the device.

In some embodiments, in the first method as described above comprising the steps of depositing a first organic layer, depositing first and second conductive layers, and depositing a first patterned image layer over some but not all of the first conductive layer, the first method may further include the step of patterning the first conductive layer or the second conductive layer so as to define a plurality of organic light emitting devices (OLEDs). Exemplary embodiments were described above with reference to FIGS. 27(*a*) and (*b*), in which patterning one or more of the electrodes may enable more than one image to be displayed for a device. Moreover, in some embodiments, the first method may further comprise the step of electrically connecting each OLED of the plurality of OLEDs to a fuse. That is, by patterning one or more of the electrodes so as to define a plurality of OLEDs, embodiments may permit each OLED to be electrically isolated by a fuse if a short fault occurs, for instance, in only a portion of the organic layer. This may prevent catastrophic failure of the OLED device; such that the device may continue to function adequately for its intended purpose if a short fault occurs (i.e. the entire device may not need to be replaced). In some embodiments, the plurality of OLEDs may be commonly addressable, which may decrease the complexity and the costs of manufacturing such a device in comparison to a device that comprises individually addressable OLEDs (because, for instance, such devices may not require complex circuitry).

In some embodiments, in the first method as described above comprising the steps of depositing a first organic layer, depositing first and second conductive layers, and depositing a first patterned image layer over some but not all of the first conductive layer, the first and the second conductive layers may each be deposited as blanket layers. By a "blanket layer," it is generally meant that the deposition may not be through a critically patterned (e.g. pixelated, or segmented) metal mask such that the blanket layer may be common across the device. This may decrease fabrication costs of the device because, unlike when patterning one or more of the layers, depositing blanket layers may not require the need to precisely align a mask so as to deposit the layers in precise locations of the device.

In some embodiments, in the first method as described above comprising the steps of depositing a first organic layer, depositing first and second conductive layers, and depositing a first patterned image layer over some but not all of the first conductive layer, the first patterned image layer may be deposited over the first organic layer. In some embodiments, the first organic layer may be deposited over the first patterned image layer. That is, in general, the first patterned image layer may be disposed either above or below the organic layer of the device.

In some embodiments, in the first method as described above comprising the steps of depositing a first organic layer, depositing first and second conductive layers, and depositing a first patterned image layer over some but not all of the first conductive layer, the first method may further include the step of obtaining the non-uniform visual image in a digitized form. As used herein, "obtaining an image" may refer to any manner of receiving or generating an image in a digitized form, which may comprise manufacturing, fabricating, preparing, creating, constructing the image itself, or receiving the image or having another party create the image, etc. An exemplary process was described above with reference to FIGS. 12, 17-24. This may, for instance, comprise taking a continuous image, and transforming it into a halftone image. For instance, in some embodiments, the step of obtaining the non-uniform visual image may further include obtaining a continuous-tone image and simulating the continuous-tone image through digitized dots varying in size, geometric shape, and/or spacing. This may be performed with the assistance of commercially available software, such as those described above. As used herein, the "space" or "spacing" may refer to the "pitch" of the digitized dots, i.e. the center-to-center distance between adjacent dots. In general, the obtained image may comprise dots having: (1) the same pitch and various shapes; (2) various pitches and the same shape; and (3) various pitches and various shapes. As used herein, the "shape" may refer to the geometric shape and/or the size of the dots. In this manner, embodiments may provide for a digitized image to be perceived as a continuous-tone image by an observer. Moreover, it should be understood that the term "dots" does not imply circular or uniformly shaped components. Indeed, in general, the "dots" can have any suitable shape or size (regular or irregular), such as those described above with reference to FIGS. 5-8. Moreover, in some embodiments, the "dots" of the obtained image may also correspond to isolated portions (i.e. segments) of the first patterned image layer in a fabricated device.

In this regard, in some embodiments, the first method may further include the steps of obtaining a patterned mask layout based on the digitized image and depositing the first patterned image layer through the patterned mask layout. The term "obtaining a patterned mask layout" may comprise, for instance, fabricating or having a third party fabricate a deposition mask that has openings corresponding to the portions (i.e. dots) of the digitized image. These portions may correspond to sections of the organic layer to which the patterned image layer is designed to locally alter the emissive properties so that the digitized image may be created by an OLED device.

Although as noted above, it may be desirable in some embodiments to deposit one or more of the conductive layers and/or organic layers as a blanket layer because it may reduce the cost and the complexity of manufacturing, embodiments described herein are not so limited. For instance, in some embodiments, the first method as described above may further include the steps of fabricating a mask layout for critically patterning a first conductive layer, fabricating a mask layout for critically patterning a first organic layer, and fabricating a mask layout for critically patterning a second conductive layer. As used herein, "critically patterning" may refer to pixelating and/or segmenting a layer. This may provide embodiments with advantages such as utilizing fuses to isolate individual elements of the device, enabling multiple images to be displayed by a single device (as described with respect to FIG. 27), enabling a full color display (with pixels and/or sub-pixels), etc.

As was noted above, in some embodiments, in the first method as described above comprising the steps of depositing a first organic layer, depositing first and second conductive layers, and depositing a first patterned image layer over some but not all of the first conductive layer, the first organic layer may be deposited so as to define a plurality of pixels. As used herein, a "pixel" may comprise a plurality of sub-pixels, such as sub-pixels that emit red, green, and blue (RGB) light. In this manner, in some embodiments, each pixel may be capable of emitting light having a variety of chromaticities based on, for instance, the combination of the light emitted by each of the sub-pixels comprised therein. Embodiments that comprise a plurality of pixels may provide for a multi-color or full color display of an image. The first organic layer may be deposited in any suitable manner, including through one or more patterned masks. An exemplary deposition process was described above, with reference to FIGS. 11(a) and (b); however, embodiments are not so limited and may include any suitable deposition process.

In some embodiments, in the first method as described above where the first organic layer is deposited so as to define a plurality of pixels, each of the plurality of pixels may comprise at least two sub-pixels, and each sub-pixel may include an emitting material having an emissive spectrum with a peak wavelength. In some embodiments, for at least one of the plurality of pixels, the peak wavelength of the emissive spectrum of the emitting material of each sub-pixel may be different. In this way, as was described above, the pixel may provide light having a plurality of chromaticities. Moreover, it may be more efficient in some embodiments to deposit the first patterned image layer so as to alter the light emissions at the pixel level, rather than addressing each sub-pixel individually. That is, as was described above, the feature size of the portions of the first patterned image layer may affect the minimum size of each sub-pixel (in further view of practical considerations regarding manufacturing and fabrication processes). Utilizing the larger areas of the pixel (rather than each sub-pixel) in determining the application of the first patterned image layer may enable devices to utilize smaller sub-pixels, and thereby have higher fidelity and resolution (e.g. as shown in FIG. 25).

In some embodiments, in the first method as described above where the first organic layer is deposited so as to define a plurality of pixels, each of the plurality of pixels may comprise a first sub-pixel, a second sub-pixel, and a third sub-pixel. The first sub-pixel may include an emitting material having an emissive spectrum with a peak wavelength between approximately 400 and 500 nm, the second sub-pixel may include an emitting material having an emissive spectrum with a peak wavelength between approximately 500 and 580 nm, and the third sub-pixel may include an emitting material having an emissive spectrum with a peak wavelength between approximately 580 and 750 nm. That is, for instance, each pixel may comprise a sub-pixel that emits substantially red light; a sub-pixel that emits substantially green light; and a sub-pixel that emits substantially blue light. In this manner, embodiments may comprise pixels that may emit light having a wide variety of chromaticities based on the combination of the light emitted by each sub-pixel. Moreover, embodiments of the device may have a plurality of pixels, and the light emitted by each pixel may be combined so as to provide a full color image.

In some embodiments, in the first method as described above where the first organic layer is deposited so as to define a plurality of pixels, and wherein each of the plurality of pixels includes a first sub-pixel, a second sub-pixel, and a third sub-pixel, each of the first, the second, and the third sub-pixel has a device footprint. As used herein, the "device footprint" may refer to the area of a sub-pixel that would emit unmodified light (i.e. light having the optical properties corresponding to the emitting material, such as the chromaticity, intensity, etc.), if there was no first patterned image layer. In some embodiments, the device footprint of the first sub-pixel of each of the plurality of pixels may be substantially the same, the device footprint of the second sub-pixel of each of the plurality of pixels may be substantially the same, and the device footprint of the third sub-pixel of each of the plurality of pixels may be substantially the same. That is, in some embodiments the device footprint of the first sub-pixel of each pixel is substantially the same, the device footprint of the second sub-pixel of each pixel is substantially the same; and the device footprint of the third sub-pixel of each pixel is substantially the same. For example, in some embodiments the device footprint of each of the red sub-pixels may be the same; the device footprint of each of the green sub-pixels may be the same; and the device footprint of each of the blue sub-pixels may be the same. However, each of the first sub-pixels (e.g. red sub-pixels) may, but need not, have the same device footprint as either the second (e.g. green) or third (e.g. blue) sub-pixels. Similarly, each of the second sub-pixels (e.g. green sub-pixels) may, but need not, have the same device footprint as each of the third sub-pixels (e.g. the blue sub-pixels). As used herein, device footprints may be "substantially the same" if the variation of size of each device footprint is within experimental and/or manufacturing error—such as within 5%.

However, in some embodiments, the device footprint of the first, the second, and the third sub-pixels of each of the plurality of pixels may be substantially the same. This may decrease the complexity of the fabrication process because, for instance, a single patterned mask could be used to deposit each of the emissive materials for each sub-pixel by simply shifting the mask by a fixed amount for each deposition step. An exemplary process was described with reference to FIG. 11. Moreover, as described above, embodiments where each sub-pixel has the same device footprint may be used as a base panel layout, wherein a patterned image layer may then be applied so as to modify the emissive area of such devices in accordance with the specific applications they may be utilized for (or the images that each may display). This may further enable mass production and/or a decrease in manufacturing costs for some device embodiments. However, embodiments are not so limited, and therefore, in some embodiments, the device footprints of the first, the second, and the third sub-pixels for at least one of the pixels of the plurality of pixels may be different from at least one other pixel. That is, for example, in some embodiments, the device footprint of the red sub-pixel, the blue sub-pixel, and the green sub-pixel for at least one of the pixels may be different.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area (as defined above). In some embodiments, the unmodified emitting area may be zero if there is no portion of the sub-pixel that emits light that is not affected by the first patterned image layer (e.g. if the patterned image layer is deposited over all of the sub-pixel). In some embodiments, the unmodified emitting areas of the first sub-pixel of at least two of the pixels are different, the unmodified emitting areas of the second sub-pixel of at least two of the pixels are different; and the unmodified emitting areas of the third sub-pixel of at least two of the pixels are different. That is, for instance, the corresponding sub-pixels of at least two pixels may have different areas that are not affected by the first patterned image layer. This may be achieved, for instance, when corresponding sub-pixels comprise the same device footprint but have different amounts of their emissive areas affected by the first patterned image layer. For example, the first sub-pixel (e.g. the red sub-pixel) of one pixel may have the same device footprint, but a different amount of the first patterned image layer disposed over its emissive area as the first sub-pixel (e.g. the red sub-pixel) of a different pixel; the second sub-pixel (e.g. the green sub-pixel) of a pixel may have the same device footprint, but a different amount of the first patterned image layer disposed over its emissive area as the second sub-pixel (e.g. the green sub-pixel) of a different pixel; the third sub-pixel (e.g. the blue sub-pixel) of a pixel may have the same device footprint, but a different amount of the first patterned image layer disposed over its emissive area as the third sub-pixel (e.g. the blue sub-pixel) of a different pixel. In some embodiments, the amount of the emissive area of the corresponding sub-pixels may be the same, but the device footprints of the sub-pixels may be different. For example, the first sub-pixel (e.g. the red sub-pixel) of a pixel may have a different device footprint but the same amount of the first patterned image layer disposed over its emissive area as the first sub-pixel (e.g. the red sub-pixel) of a different pixel, the second sub-pixel (e.g. the green sub-pixel) of a pixel may have a different device footprint but the same amount of the first patterned image layer disposed over its emissive area as the second sub-pixel (e.g. the green sub-pixel) of a different pixel; and the third sub-pixel (e.g. the blue sub-pixel) of a pixel may have a different device footprint but the same amount of the first patterned image layer disposed over its emissive area as the third sub-pixel (e.g. the blue sub-pixel) of a different pixel This may be utilized, for instance, to create pixels having different colors by varying the amount of the contribution of light from each of the sub-pixels to generate a full-color image.

In some embodiments, for at least one of the plurality of pixels, the unmodified emitting area of the first sub-pixel may be different from the unmodified emitting area of each of the second sub-pixel and the third sub-pixel, and the unmodified emitting area of the second sub-pixel may be different from the unmodified emitting area of the third sub-pixel. That is, for instance, within a single pixel, each of the sub-pixels (e.g. the red, green, and blue sub-pixels) may have a different amount of the first patterned image layer over the emissive areas. In some embodiments, the device footprint of each sub-pixel may be the same for a pixel, but the patterned image layer may alter a different proportion of the light emitted by each sub-pixel such that the unmodified emitting areas are different. It should be noted that in such embodiments, where the first patterned image layer does not inhibit light emissions (although it may be altered in some way, such as altering the intensity, chromaticity, etc.) the total emitting area of each of the sub-pixels (i.e. the area from which light is emitted comprising the combined modified and unmodified emitting areas) may still be the same for each sub-pixel; however, the unmodified emitting areas will be different. In addition, in some embodiments the modified emitting areas may be the same for each sub-pixel, but the size of the device footprints of each sub-pixel may be different. For instance, the first patterned image layer may be disposed over the same area of each sub-pixel, but the first, second, and third sub-pixels may have different device footprints.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. The "modified emitting area" may be zero for a sub-pixel if the patterned image layer does not locally alter its emissive properties. In some embodiments, the modified emitting areas of the first sub-pixel of at least two of the pixels are different, the modified emitting areas of the second sub-pixel of at least two of the pixels are different; and the modified emitting areas of the third sub-pixel of at least two of the pixels are different. That is, for instance, the corresponding sub-pixels of at least two pixels may have different areas that are affected by the first patterned image layer. For example, the first sub-pixel (e.g. the red sub-pixel) of a pixel may have a different amount of the first patterned image layer disposed over its emissive area than the first sub-pixel (e.g. the red sub-pixel) of a different pixel, and so forth. This may be used, for instance, to create variation of the light emissions across the device so as to render an image that is perceivable by a viewer In some embodiments, for at least one of the plurality of pixels, the modified emitting area of the first sub-pixel may be different from the modified emitting area of each of the second sub-pixel and the third sub-pixel, and the modified emitting area of the second sub-pixel may be different from the modified emitting area of the third sub-pixel. That is, each of the sub-pixels of one of the pixels may have a different amount of the first patterned image layer affecting the light emissions. This may be utilized, for instance, to create pixels (that comprise each of the sub-pixels) having different colors by varying the amount of the contribution of light from each of the sub-pixels to generate a full-color image.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each have a modified emitting area. Each of the pixels may include a total modified emitting area that comprises the modified emitting areas of the first, the second, and the third sub-pixels of the pixel. In some embodiments, the total modified emitting area of at least one pixel may be different than the total modified emitting area of at least one other pixel. That is, for instance, embodiments may comprise a patterned image layer that is disposed over different proportions of the sub-pixels of at least two different pixels such that the total modified emitting areas (i.e. the areas that are affected by the first patterned image layer) for the two pixels are different. Again, this may, in some embodiments, provide for different pixels of the device to emit a different amount of light and/or light have different optical properties, so as to generate an image that may be perceived by a viewer.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each may have an unmodified emitting area. Each of the pixels may have a total unmodified emitting area that comprises the unmodified emitting areas of the first, the second, and the third sub-pixels of the pixel, and the total unmodified emitting area of at least one pixel may be different than the total unmodified emitting area of at least one other pixel. That is, in some embodiments at least two of the pixels that comprise part of the first device may have different amounts of their emissive areas affected by the first patterned image layer. This may create variation of the light emissions across the device and thereby generate a perceivable image based on the differences in, for example, intensity, chromaticity, etc.

In some embodiments, in the first method as described above where the first organic layer is deposited so that each pixel comprises a first sub-pixel that includes an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first method may further include the steps of determining a working condition of the first device and obtaining CIE coordinates and voltage-luminance relationship at the determined working condition of the first, the second, and the third sub-pixels. As was described in detail above, determining the properties of each of the sub-pixels for a given operating condition may be performed so that it may determine what, if any, modifications to the properties of each sub-pixel may be needed to obtain a particular white balance for an OLED light panel. The modifications may include, for example, changing the device footprint of the sub-pixels, the emissive materials used herein, and/or in some embodiments, the amount of the sub-pixel that the first patterned image layer affects the light emissions there from. In some embodiments, the first method as described above may further include the steps of determining a target white point for the first device. For instance, an exemplary white point may be set to D65, and the sub-pixels may be configured or modified so that the OLED light panel obtains this white point.

In some embodiments, in the first method as described above comprising the steps of depositing a first organic layer, depositing first and second conductive layers, and depositing a first patterned image layer over some but not all of the first conductive layer, the first method may further include the steps of depositing a third conductive layer, depositing a second organic layer comprising electroluminescent material over the third conductive layer, and depositing a second patterned image layer over some but not all of the third conductive layer. The second patterned image layer may locally alter the emissive properties of the second organic layer, and the shape of the second patterned image layer may be based on a non-uniform visual image. The first method may further include the step of depositing a fourth conductive layer over the second organic layer. Such embodiments may, for instance provide for multiple images to be displayed by a single device. Exemplary embodiments were described above with reference to FIGS. 26(a) and (b), but embodiments are not so limited. A first image may be provided based on the first patterned image layer (which locally alters portions of the first organic layer), and a second image that may be provided based on the second patterned image layer (which locally alters portions of the second organic layer). It should be understood that, in general, any number of patterned image layers, organic layers, and conductive layers may be used in a device to produce any number of images.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the steps of depositing the second conductive layer and depositing the third conductive layer may comprise the same step. That is, the second and third conductive layers may be deposited during the same deposition process. Embodiments may, for example, provide for a single common conductive layer (e.g. a shared electrode, such as a shared anode or cathode, as shown in FIGS. 26(a) and (b)) or the conductive layer may be patterned so as to create one or more separate devices. Depositing the second and third conductive layers in the same step may reduce manufacturing costs by decreasing the number of deposition steps needed to fabricate the device.

In this regard, in some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the second and the third conductive layers may be the same. As was described above, in some embodiment the first conductive layer, first organic layer, and second/third conductive layers may be deposited so as to define a first light source (i.e. a first OLED), and the second/third conductive layer, the second organic layer, and the fourth conductive layer may deposited so as to define a second light source (i.e. a second OLED). Each of the first and the second light source may, in some instances, when modified by the first or the second patterned image layer, respectively, generate an image. In some embodiments, at least one of the first and the fourth conductive layers may be transparent or semi-transparent. In some embodiments, the first and the second light sources may be disposed so as to be optically coupled, and the images (when each device is in an "on-state") may be combined to form a third image. In this regard, in some embodiments, the second and third conductive layers may be transparent or semi-transparent. By having the second/third conductive layers comprise transparent or semi-transparent materials, embodiments may thereby enable the first and the second OLEDs to be optically coupled (such that at least some of the light that is emitted from one of the OLEDs may also pass through a section of the other OLED). This may enable a viewer looking at one side of the device to perceive both images. In some embodiments, where at least one of the first and the fourth conductive layers is transparent or semi-transparent, the second and the third conductive layers may be reflective. While in general it may not be a preferred embodiment to have the second/third conductive layer comprise a reflective material, this may be beneficial in some embodiments such as where the device may have a first image when looked at from one side, and a second image when looked at from a different side. For example, a billboard or other advertising material may comprise two different images for two different advertisements on either side, such that a person on one side of the advertisement may see the first image, and a person on the opposite side may see a second image.

In some embodiments, in the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the first conductive layer, the first organic layer, the first patterned image layer and the second conductive layer may comprise a first OLED light source, and the third conductive layer, the second organic layer, the second patterned image layer and the fourth conductive layer may comprise a second OLED light source. In some embodiments, the second and third conductive layers may be the same such that the first OLED light source and the second OLED light source may have a common electrode. In some embodiments, the first and the second OLED light sources may be individually addressable. In this way, some embodiments may enable either one or both of the OLEDs (corresponding to the first and second organic layers and corresponding first, second, third, and fourth conductive layers, as described above) to be in the on-state at a given time. The device may thereby display either one or both of the images associated with each OLED. In some embodiments, the first and the second OLED light sources may be commonly addressable. That is, in some embodiments, the OLEDs may both either be in the on-state or the off-state, and the images associated with each may not be displayed separately.

As was described above, in some embodiments, where the first method as described above comprising the steps of depositing first and second organic layers, depositing first, second, third, and fourth conductive layers, depositing a first patterned image layer over some but not all of the first conductive layer, and depositing a second patterned image layer over some but not all of the third conductive layer, the first organic layer and the second organic layer may be optically coupled. This may enable some embodiments to display multiple images that may be viewed from one side of the device (or both sides, depending on the transparency of the conductive layers). In addition, by optically coupling the first and the second organic layers such that the light emissions (and thereby the image generated by each organic layer and the corresponding patterned image layer) may be perceived by looking at one side of the device, it may also be possible to provide devices that may display a third image corresponding to the combination of the first and second images. For example, the first image may comprise one section of a photograph, and the second image may comprise another section of the photograph.

In some embodiments, the first organic layer and the second organic layer may comprise the same organic EL material. An example of this is shown and described with respect to FIGS. 27(a) and (b). As shown therein, embodiments may provide for side-by-side devices, such that different images may be displayed on different parts of the device. This may provide advantages for certain embodiments, such as enabling (with additional circuitry that may address and/or control each of the portions of the device) dynamic images that may appear to move across the device as different devices are energized and de-energized.

In some embodiments, the patterning of one or more electrodes to display multiple images (e.g. as depicted in FIGS. 27(a) and (b)) may be combined with the integration of multiple patterned image layers (e.g. as depicted in FIGS. 26(a) and (b)), to create a richer display content and visual effect, including motion effect and 3D effect.

It should be understood that the exemplary methods provided above are for illustration purposes only. Moreover, a person of ordinary skill in the art after reading this disclosure may understand that certain features may be combined or omitted in different embodiments. Each of the steps in the methods described above need not be performed in a particular order unless stated to the contrary.

Exemplary Devices:

Described below are exemplary embodiments of a device that may comprise aspects in accordance with some of the features described above. It should be noted that many aspects of the exemplary embodiments of the device provided below were described in detail above, and to the extent that these features or aspects are consistent (as would be understood by one of ordinary skill in the art upon reading this disclosure) the descriptions may be equally applicable to the embodiments described below. Moreover, it should be understood that these exemplary embodiments are provided as examples, and should not thereby be considered limiting.

In some embodiments, a first device comprising a digitized OLED may also be provided. The first device may include a substrate and a first light source disposed on the substrate. The first light source may include a first electrode, a second electrode disposed over the first electrode, and a first organic layer that includes an organic electroluminescent (EL) material disposed between the first and the second electrodes. The first device may further include a first patterned image layer disposed between the first and the second electrode, where the first patterned image layer may comprise a material such that it locally alters the emissive properties of the first organic EL material. The shape of the first patterned image layer may be generated from an image. As noted above, the first patterned image layer has a shape that is generated from an image, and the shape of the first patterned image layer may be deposited in accordance with (i.e. correspond to) an image. For example, the shape of the first patterned image layer may be deposited in accordance with the location or placement of dots of a halftone image (which itself may be based on a continuous-tone image). The first patterned image layer itself may or may not comprise an image; however, based in part on its interactions with the light source (i.e. how the first patterned image layer locally alters the emissive properties of the organic layer), an image may be generated that may be perceivable to a viewer.

In some embodiments, in the first device as described above that includes a first light source and a first patterned image layer, the first patterned image layer may be a single continuous layer. That is, for instance, in some embodiments the first patterned image layer may not have any portions or sections that are physically separated (e.g. isolated) from the other portions. The first patterned image layer can be any shape and any size, but in general does not contact the entire emitting area of the first light source. While this may not be a preferred embodiment, it may be possible in some instances to utilize thicker and thinner sections of a continuous layer to alter the emissive properties of different sections of the emitting area of a device, so as to create an image.

In some embodiments, in the first device as described above that includes a first light source and a first patterned image layer, the first patterned image layer may include a plurality of portions, and each portion may be isolated from each of the other portions. As used herein, "isolated" may refer to when the portions of the first patterned image layer are disposed such that they are physically separate. In some instances, light (unaltered by the first patterned image layer) and/or electrical current may flow in the space between each portion. That is, for instance, there may be a physical space located between (i.e. separating) each portion. Therefore, each isolated section of the first patterned image layer may comprise a "portion" of the first patterned image layer as used herein. However, the term "portion" does not imply a circular or uniformly shaped component of the first patterned image layer. Indeed, the "portions" may be any shape or size, regular or irregular. In effect, a "portion" as used herein may simply refer to an isolated segment of the first patterned image layer (i.e. it is physically isolated (e.g. not connected to) from other portions of the image layer). In general, embodiments that utilize a patterned image layer that comprises a plurality of portions may be used in conjunction with halftone imaging processes so as to locally alter sections of an organic layer to provide a perceivable image for an OLED light panel.

In some embodiments, in the first device as described above that includes a first light source and a first patterned image layer that includes a plurality of isolated portions, the first device may include a plurality of equally sized regions. In some embodiments, the first patterned image layer may include a plurality of N different patterns, where each of the N different patterns fits within one of the equally sized regions. Each of the N different patterns may correspond to one of N different luminous intensities, and one of the N different patterns may be present in each region. Embodiments such as the one described above may correspond to an exemplary manner in which gray scaling may be readily achieved. That is, for instance, the luminous intensity of the light that is emitted from the equally spaced "regions" may be varied based on the particular pattern that locally alters that region of the device. The regions may refer to any arbitrary section of the display (for instance, a 100 cm$^2$ lighting panel could comprise ten regions having an area of 10 cm$^2$, 100 regions having an area of 1 cm$^2$, etc.). The "pattern" may refer to the configuration of the first pattern image layer (or a portion thereof) within (or above) one of the regions. The different patterns may be provided by varying the size, geometric shape, and/or pitch of the portions of the first patterned image layer deposited over the regions. In addition, it may be possible to change the luminous intensity by varying the materials of the first patterned image layer in the regions. In some embodiments, one of the patterns may comprise the absence of the first patterned image layer. Another pattern in some embodiment may be the presence of the first patterned image layer disposed over the entire region.

For instance, in some embodiments, N may equal 2. That is, each of the regions may either have no portions of the patterned image layer or it may be completely covered by a portion of the patterned image layer. This may be the case, for instance, if the size of each of the region is designated as the minimum size of a portion of the first patterned image layer. In some embodiments, N may be equal to at least 8. In general, embodiments that use fewer luminance intensity levels may comprise an easier or less expensive fabrication process because, for instance, there may be lower requirements for the feature size of the portions of the first patterned image layer. However, reducing the number of luminance intensity levels may reduce the level of control in creating an image because, for instance, there may be less ability to make distinctions in features of the image. In contrast, having a higher number of luminance levels may provide for more control in rendering an image, but may be more expensive to manufacture. In some embodiments, N may be at least 16.

In some embodiments, in the first device as described above that includes a first light source and a first patterned image layer that includes a plurality of isolated portions, the plurality of portions of the first patterned image layer may be regularly shaped and irregularly spaced. As used herein, "regularly" shaped may refer to when portions of the patterned image layer comprise substantially the same geometric shape and substantially the same size. The "size" of the portions of the patterned image layer may refer to the area of the surface of the portion of the patterned image layer that is substantially parallel to the first and/or second electrode. As used herein, the term "substantially the same size" may refer to embodiments where the variation of sizes are within 5% (e.g. within manufacture or experimental error). It should be understood that this definition may apply to substantially all of the portions; however, there may be a small population of the portions that do not conform, but so long as this is less than approximately 1% of the total number of portions, the portions of the first patterned image layer may be considered to be regularly shaped. In contrast, as used herein, "irregularly spaced" may refer to when the spacing between the centers (i.e. the center-to-center distance, e.g. the pitch) of adjacent portions may vary across the patterned image layer.

In some embodiments, the plurality of portions of the first patterned image layer may be irregularly shaped and regularly spaced. As used herein, the portions may be "regularly spaced" when, for instance, the spacing between the centers of adjacent portions is substantially the same across the first patterned image layer. As used in this context, "substantially the same" may refer to when the distance between each portion does not vary by more than approximately 5%. It should be understood that this definition may apply to substantially all of the portions; however, there may be a small population of the portions that do not conform, but so long as this is less than approximately 1% of the total number of portions, the portions of the first patterned image layer may be considered to be regularly spaced. As used herein, the term "irregularly shaped" may refer to when the portions of the patterned image layer may comprise a plurality of different geometric shapes and/or sizes.

In some embodiments, the portions of the first patterned image layer are irregularly shaped and are irregularly spaced. Thus, in general, the portions of the patterned image layer may have (1) the same pitch, various shapes; (2) various pitches, same shape; and (3) various pitches, various shapes. As used herein, the "shape" may refer to the combination of both geometric shape and the size of the portions. In this manner, embodiments may provide a patterned image layer that may create variation of the light emissions across the device such that an image may be rendered.

In some embodiments, in the first device as described above that includes a first light source and a first patterned image layer that includes a plurality of isolated portions, the first patterned image layer may form a digitized image. That is, in some embodiments, the patterned image layer itself may be deposited so as to create an image when viewed (i.e. it may be perceived by the viewer even when the device is in an off-state when the patterned image layer is opaque). However, embodiments are not so limited, and in some instances, the patterned image layer alone may not comprise an image (but the patterned image layer may be deposited so that when the device is in an on-state, an image may be generated).

In some embodiments, the shape of the first patterned image layer may be such that light emissions from the first organic layer generate an image that is perceivable by an observer at distance of greater than 10 cm, but the image may not be perceivable by a viewer at distance of less than 1 cm. That is, embodiments may provide a device that may create a macro image—i.e., an image that may be perceived by a viewer when located at a certain distance from the device. For example, (such as when using a halftone image), if a viewer is too close to the device, the image may not be perceivable. In general, the distance of 10 cm may correspond to the closest distance in which a person usually views most displayed images. However, embodiments are not so limited, and typically the larger the device, the farther away a viewer may be located before the image is viewable.

In some embodiments, in the first device as described above that includes a first light source and a first patterned image layer that includes a plurality of isolated portions, each of the plurality of portions of the first patterned image layer may have a shape that comprises at least one of: a circle, a rectangle, a triangle, a hexagon, or an irregular polygon. As was described above, in general, the portions of the first patterned image layer may comprise any suitable geometric shape. However, some geometric shapes may have different attributes that may make them more ideal for creating or displaying an image or portions thereof. For instance, circular portions may be preferred for rendering skin tone, whereas for sharper images, square portions of the patterned image layer may be preferred. Moreover, in some embodiments, the use of regular shaped portions may make manufacturing or fabrication (for instance deposition through a patterned mask) less complex or less expensive.

In some embodiments, in the first device as described above that includes a first light source and a first patterned image layer that includes a plurality of isolated portions, the plurality of portions of the first patterned image layer may include at least two portions that have different sizes. Different size portions may be used to create varying light emission properties across the device so as to render an image. In some embodiments, the size of each portion of the first patterned image layer is within the range of approximately 1 to 1000 microns. In general, the larger the portions of the patterned image layer, the less resolution that an image may have; however, using very small portions may increase the difficulty of manufacturing a device and may increase the costs and expense. Therefore, in some embodiments, the size of each portion of the patterned image layer is within the range of approximately 25 to 500 microns. In some embodiments, the size of each portion of the patterned image layer is within the range of approximately 100 to 500 microns. The inventors have found that devices using portion sizes of at least 100 microns may typically be manufactured without a large increase in fabrication burden, and images that are rendered using portion sizes of less than 500 microns may generate images with adequate resolution for most purposes.

In some embodiments, in the first device as described above that includes a first light source and a first patterned image layer that includes a plurality of isolated portions, where the plurality of portions include at least two portions that have different sizes, the plurality of portions of the first patterned image layer may include a first group of portions having a first size, and a second group of portions having a second size that is different than the first size. That is, there may be a plurality of portions of the patterned image layer that have a first size (e.g. 100 microns) and a plurality of portions that have a second size (e.g. 500 microns) that may be used to generate an image. In some embodiments, any number of different sized portions may be used. In general, the larger the number of different sized portions that are used for a patterned image layer, the greater the ability to render higher resolution images (e.g. it may permit more contrasts to be created). However, embodiments may be less expensive to manufacture if fewer different sized portions are used because it may decrease the complexity of manufacturing. Other factors may also affect the resolution that the patterned image layer may provide of an image and/or the manufacturing costs of the device, including the spacing between portions and the shape of the portions.

In some embodiments, in the first device as described above that includes a first light source and a first patterned image layer that includes a plurality of isolated portions, the plurality of portions of the first patterned image layer may comprise a plurality of groups of portions. In some embodiments, the size of the portions of the first patterned image layer within each group may be approximately the same, and the size of the portions of the first patterned image layer that are in different groups may be different. As used in this context, "approximately the same size" may refer to when the variation of size of the portions are within experimental or manufacturing error (i.e. within 5%). As noted above, different sized portions may be used (along with other factors related to the portions of the patterned image layer, such as shape and spacing) to create variation in the light emissions of a device to render an image. In general, it may be more efficient in manufacturing (such as when patterning a mask) to have a fixed number of different sized portions that may be used for the patterned image layer. In some embodiments, the first device may include at least 8 groups of portions of the first patterned image layer. However, in some embodiments, a greater number of different sized portions may enable greater contrast and resolution for displaying an image. In some embodiments, the first device may include at least 16 groups of portions of the first patterned image layer.

In some embodiments, in the first device as described above that includes a first light source and a first patterned image layer that includes a plurality of isolated portions, each portion of the first patterned image layer may have a minimum distance to each of the other portions of the first patterned image layer. In some embodiments, the minimum distance between each adjacent portion of the first patterned image layer may be at least 1 micron. The "minimum distance" may refer to the distance between any section of one portion of the first patterned image layer and the closest section of an adjacent portion of the first patterned image layer. The minimum distance may correspond to the fabrication limit in some embodiments. For example, if the first patterned image layer is deposited through a shadow mask, the minimum distance may be determined by the narrowest metal lines/features that can be made on the mask. In some embodiments, the minimum distance between each adjacent portion of the first patterned image layer is at least 25 microns. In some embodiments, the minimum distance between each adjacent portion of the first patterned image layer is at least 100 microns.

In some embodiments, in the first device as described above that includes a first light source and a first patterned image layer that includes a plurality of isolated portions, where each portion of the first patterned image layer has a minimum distance to each of the other portions of the first patterned image layer, there may be at least two different minimum distances between adjacent portions of the first patterned image layer. As noted above, instead of, or in addition to, varying the size and the geometric shape of the portions, embodiments may also vary the distance between portions of the first patterned image layer to create varying contrast across the device to display an image.

In some embodiments, in the first device as described above that includes a first light source and a first patterned image layer that includes a plurality of isolated portions, the first device may further include a metal layer disposed between the first patterned image layer and at least one of the first electrode or the second electrode of the first light source. As was described above with reference to FIGS. 10(a) and (b), the metal layer may comprise an opaque material and may form a visual pattern of an image such that when the device is in an off-state, the image formed by the metal layer is perceivable to a viewer. The image formed by the metal layer and the image formed by the patterned image layer may, but need not, be the same. For instance, the metal layer may form an image that comprises a part of a larger image when the device is operated. In some embodiments, the metal layer may reduce the sheet resistance of the electrode so as to improve the luminance uniformity of the OLED light panel. In some embodiments, the metal layer may comprise a plurality of portions and may be deposited in any suitable manner, such as through a patterned mask. The metal layer may be disposed over or under the first patterned image layer. In some embodiments, where the metal layer comprises a plurality of portions, each of the portions of the metal layer may be optically coupled with a portion of the first patterned image layer.

In some embodiments, in the first device as described above that includes a first light source and a first patterned image layer that includes a plurality of isolated portions, the first light source may emit substantially white light. "Substantially white light" may refer to light having a Duv value of less than 0.010. The first device may comprise, for instance, one or more OLEDs that emit substantially white light (e.g. one or more OLEDs that may comprise yellow and blue emitting materials, or red, green, and blue emitting materials). In some embodiments, the first device may comprise a plurality of OLEDs that emit different color light such that their combined emissions comprise substantially white light (such as a device that comprises red, blue, and green sub-pixels). In some embodiments that comprise a light source that emits white light, a patterned image layer may also be used that may alter the emissive properties so as to display full-color images.

In some embodiments, in the first device as described above that includes a first light source and a first patterned image layer that includes a plurality of isolated portions, the first organic layer of the first light source may comprise a plurality of pixels. As described above, in some embodiments, each pixel may be capable of emitting light having a variety of chromaticities based on, for instance, the combination of the light emitted by each of the sub-pixels comprised therein. Embodiments that comprise a plurality of pixels may provide for a mixed-color or full-color display of an image. In some embodiments, the plurality of pixels may be commonly addressable. As noted above, embodiments such as AMOLED displays that have individually addressable pixels may require complex circuitry and/or TFTs that may increase manufacturing costs and/or prevent devices from having fully transparent displays. In some embodiments, each of the plurality of pixels comprises at least one portion of the first patterned image layer. The first patterned image layer may thereby alter the emissive proprieties of the organic layer in each pixel. This may be the case, for example, in embodiments where the first patterned image layer may be utilized to achieve a white balance for a display. In some embodiments, each of the plurality of pixels may include at least two sub-pixels that emit light having different peak wavelengths. In this way, as was described above, the pixel may provide light having a plurality of chromaticities.

In some embodiments, in the first device as described above that includes a first light source and a first patterned image layer that includes a plurality of isolated portions, and where the first organic layer comprises a plurality of pixels, each of the plurality of pixels may include a first sub-pixel, a second sub-pixel, and a third sub-pixel. The first sub-pixel may include an emitting material having an emissive spectrum with a peak wavelength between approximately 400 and 500 nm. The second sub-pixel may include an emitting material having an emissive spectrum with a peak wavelength between approximately 500 and 580 nm. The third sub-pixel may include an emitting material having an emissive spectrum with a peak wavelength between approximately 580 and 750 nm. That is, for instance, each pixel may comprise a sub-pixel that emits substantially red light; a sub-pixel that emits substantially green light; and a sub-pixel that emits substantially blue light. In this manner, embodiments may comprise pixels that may emit light having a wide variety of chromaticities based on the combination of the light emitted by each sub-pixel. Moreover, embodiments of the device may have a plurality of pixels, and the light emitted by each pixel may be combined so as to provide a full-color image.

In some embodiments, in the first device as described above that includes a first light source and a first patterned image layer that includes a plurality of isolated portions, where the first organic layer comprises a plurality of pixels and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, each of the first, the second, and the third sub-pixel may have a device footprint. In some embodiments, the device footprint of the first sub-pixel of each of the plurality of pixels may be substantially the same, the device footprint of the second sub-pixel of each of the plurality of pixels may be substantially the same, and the device footprint of the third sub-pixel of each of the plurality of pixels may be substantially the same. That is, in some embodiments the device footprint of the first sub-pixel of each pixel is substantially the same, the device footprint of the second sub-pixel of each pixel is substantially the same; and the device footprint of the third sub-pixel of each pixel is substantially the same. For example, in some embodiments the device footprint of each of the red sub-pixels may be the same; the device footprint of each of the green sub-pixels may the same; and the device footprint of each of the blue sub-pixels may be the same. However, each of the first sub-pixels (e.g. red sub-pixels) may, but need not, have the same device footprint as either the second (e.g. green) or third (e.g. blue) sub-pixels. Similarly, each of the second sub-pixels (e.g. green sub-pixels) may, but need not, have the same device footprint as each of the third sub-pixels (e.g. the blue sub-pixels). As used herein, device footprints may be "substantially the same" if the variation of size of each device footprint is within experimental and/or manufacturing error—such as within 5%.

In some embodiments, the device footprint of the first, the second, and the third sub-pixels may be different. In some embodiments, the device footprint of the first, the second, and the third sub-pixels may be substantially the same. This may decrease the complexity of the fabrication process because, for instance, a single patterned mask could be used to deposit each of the emissive materials for each sub-pixel by simply shifting the mask by a fixed amount for each deposition step. An exemplary process was described with reference to FIG. 11. Moreover, as described above, embodiments where each sub-pixel has the same device footprint may be used as a base panel layout, wherein a patterned image layer may then be applied so as to modify the emissive area of such devices in accordance with the specific applications they may be utilized for (or the images that each may display). This may further enable mass production and/or a decrease in manufacturing costs for some device embodiments. However, embodiments are not so limited, and therefore, in some embodiments, the device footprints of the first, the second, and the third sub-pixels for at least one of the pixels of the plurality of pixels may be different from at least one other pixel. That is, for example, in some embodiments, the device footprint of the red sub-pixel, the blue sub-pixel, and the green sub-pixel for at least one of the pixels may be different.

In some embodiments, in the first device as described above that includes a first light source and a first patterned image layer that includes a plurality of isolated portions, where the first organic layer comprises a plurality of pixels and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have an unmodified emitting area (as defined above). In some embodiments, the unmodified emitting area may be zero if there is no portion of the sub-pixel that emits light that is not affected by the first patterned image layer (e.g. if the first patterned image layer is deposited over all of the sub-pixel). In some embodiments, the unmodified emitting areas of the first sub-pixel of at least two of the pixels are different, the unmodified emitting areas of the second sub-pixel of at least two of the pixels are different; and the unmodified emitting areas of the third sub-pixel of at least two of the pixels are different. That is, for instance, the corresponding sub-pixels of at least two pixels may have different areas that are not affected by the first patterned image layer. This may be achieved, for instance, when corresponding sub-pixels comprise the same device footprint but have different amounts of their emissive areas affected by the first patterned image layer. For example, the first sub-pixel (e.g. the red sub-pixel) of one pixel may have the same device footprint, but a different amount of the first patterned image layer disposed over its emissive area as the first sub-pixel (e.g. the red sub-pixel) of a different pixel; the second sub-pixel (e.g. the green sub-pixel) of a pixel may have the same device footprint, but a different amount of the first patterned image layer disposed over its emissive area as the second sub-pixel (e.g. the green sub-pixel) of a different pixel; the third sub-pixel (e.g. the blue sub-pixel) of a pixel may have the same device footprint, but a different amount of the first patterned image layer disposed over its emissive area as the third sub-pixel (e.g. the blue sub-pixel) of a different pixel. In some embodiments, the amount of the emissive area of the corresponding sub-pixels may be the same, but the device footprints of the sub-pixels may be different. For example, the first sub-pixel (e.g. the red sub-pixel) of a pixel may have a different device footprint but the same amount of the first patterned image layer disposed over its emissive area as the first sub-pixel (e.g. the red sub-pixel) of a different pixel, the second sub-pixel (e.g. the green sub-pixel) of a pixel may have a different device footprint but the same amount of the first patterned image layer disposed over its emissive area as the second sub-pixel (e.g. the green sub-pixel) of a different pixel; and the third sub-pixel (e.g. the blue sub-pixel) of a pixel may have a different device footprint but the same amount of the first patterned image layer disposed over its emissive area as the third sub-pixel (e.g. the blue sub-pixel) of a different pixel This may be utilized, for instance, to create pixels having different colors by varying the amount of the contribution of light from each of the sub-pixels to generate a full-color image.

In some embodiments, for at least one of the plurality of pixels, the unmodified emitting area of the first sub-pixel may be different from the unmodified emitting area of each of the second sub-pixel and the third sub-pixel, and the unmodified emitting area of the second sub-pixel may be different from the unmodified emitting area of the third sub-pixel. That is, for instance, within a single pixel, each of the sub-pixels (e.g. the red, green, and blue sub-pixels) may have a different amount of the first patterned image layer over the emissive areas. In some embodiments, the device footprint of each sub-pixel may be the same for a pixel, but the first patterned image layer may alter a different proportion of the light emitted by each sub-pixel such that the unmodified emitting areas are different. It should be noted that in such embodiments, where the patterned image layer does not inhibit light emissions (although it may be altered in some way, such as altering the intensity, chromaticity, etc.) the total emitting area of each of the sub-pixels (i.e. the area from which light is emitted comprising the combined modified and unmodified emitting areas) may still be the same for each sub-pixel; however, the unmodified emitting areas may be different. In addition, in some embodiments the modified emitting areas may be the same for each sub-pixel, but the size of the device footprints of each sub-pixel may be different. For instance, the first patterned image layer may be disposed over the same area of each sub-pixel, but the first, second, and third sub-pixels may have different device footprints.

In some embodiments, in the first device as described above that includes a first light source and a first patterned image layer that includes a plurality of isolated portions, where the first organic layer comprises a plurality of pixels and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixels may each have a modified emitting area. The "modified emitting area" may be zero for a sub-pixel if the first patterned image layer does not locally alter its emissive properties. In some embodiments, the modified emitting areas of the first sub-pixel of at least two of the pixels are different, the modified emitting areas of the second sub-pixel of at least two of the pixels are different; and the modified emitting areas of the third sub-pixel of at least two of the pixels are different. That is, for instance, the corresponding sub-pixels of at least two pixels may have different areas that are affected by the first patterned image layer. For example, the first sub-pixel (e.g. the red sub-pixel) of a pixel may have a different amount of the first patterned image layer disposed over its emissive area than the first sub-pixel (e.g. the red sub-pixel) of a different pixel, and so forth. This may be used, for instance, to create variation of the light emissions across the device so as to render an image that is perceivable by a viewer.

In some embodiments, for at least one of the plurality of pixels, the modified emitting area of the first sub-pixel may be different from the modified emitting area of each of the second sub-pixel and the third sub-pixel, and the modified emitting area of the second sub-pixel may be different from the modified emitting area of the third sub-pixel. That is, each of the sub-pixels of one of the pixels may have a different amount of the first patterned image layer affecting the light emissions. This may be utilized, for instance, to create pixels (that comprise each of the sub-pixels) having different colors by varying the amount of the contribution of light from each of the sub-pixels to generate a full-color image.

In some embodiments, where the first, the second, and the third sub-pixels of each of the plurality of pixels each have a modified emitting area, each pixel may include a total modified emitting area that comprises the modified emitting areas of the first, the second, and the third sub-pixels of the pixel. In some embodiments, the total modified emitting area of at least one pixel is different than the total modified emitting area of at least one other pixel. That is, for instance, embodiments may comprise a patterned image layer that is disposed over different proportions of the sub-pixels of at least two different pixels such that the total modified emitting areas (i.e. the areas that are affected by the first patterned image layer) for the two pixels are different. Again, this may, in some embodiments, provide for different pixels of the device to emit a different amount of light and/or light have different optical properties, so as to generate an image that may be perceived by a viewer.

In some embodiments, in the first device as described above that includes a first light source and a first patterned image layer that includes a plurality of isolated portions, where the first organic layer comprises a plurality of pixels and each pixel comprises a first sub-pixel that comprises an emitting material having an emissive spectrum with a peak wavelength between approximately 400 and 500 nm, a second sub-pixel that includes an emitting material having an emissive spectrum with a peak wavelength between approximately 500 and 580 nm, and a third sub-pixel that includes an emitting material having an emissive spectrum with a peak wavelength between approximately 580 and 750 nm, the first, the second, and the third sub-pixel of each of the plurality of pixels may each have an unmodified emitting area. In some embodiments, each pixel may include a total unmodified emitting area that comprises the unmodified emitting areas of the first, the second, and the third sub-pixels of the pixel, and the total unmodified emitting area of at least one pixel may be different than the total unmodified emitting area of at least one other pixel. That is, in some embodiments at least two of the pixels that comprise part of the first device may have different amounts of their emissive areas affected by the first patterned image layer. This may create variation of the light emissions across the device and thereby generate a perceivable image based on the differences in, for example, intensity, chromaticity, etc.

In some embodiments, in the first device as described above that includes a first light source and a first patterned image layer that includes a plurality of isolated portions, the first organic layer of the first light source may be a common layer to a plurality of OLEDs. For example, the plurality of OLEDs may emit monochromic light and/or if the common organic layer comprises multiple emitting materials (such as blue and yellow, or red, green, and blue), the first light source could emit white light. By utilizing a common organic layer, embodiments may reduce the cost, time, and complexity of the manufacturing process. In some embodiments, in the first device as described above, the first light source may include an emitting material having an emissive spectrum with a peak wavelength that is within the range of approximately 400-750 nm. That is, the first light source may emit light having any chromaticity. In some embodiments, in the first device as described above, the first light source may include a stacked organic light emitting device (SOLED) or a transparent organic light emitting device (TOLED). As was noted above, any suitable light source (i.e. OLED stack design) may be used for the device, including OLEDs that emit substantially white light and may thereby comprise multiple emitting materials that have emissive spectrums having different peak wavelengths. In some embodiments, in the first light source as described above, the first light source may comprise a top-emitting organic light emitting device. As was described above, devices may emit light in either or both directions and thereby the image may be displayed and be perceivable to a viewer on either or both sides of the device.

In some embodiments, in the first device as described above that includes a first light source and a first patterned image layer that includes a plurality of isolated portions, the first patterned image layer may be transparent or semi-transparent. As describe above, when the device is in an off-state the device may be transparent (or most of the display area may be transparent) such that light may pass through the device relatively unimpeded. Such devices may serve as a window in the off-state. In some embodiments, the first patterned image layer may be opaque. In this manner, embodiments may display an image that is perceivable to a viewer in the off-state, and may also display the same image illuminated (or perhaps a different image that comprises the opaque portions of the patterned image layer and an image that results from the alteration of the emissive properties of the organic layer by the patterned image layer) when in the on-state.

In some embodiments, in the first device as described above that includes a first light source and a first patterned image layer, the first light source may include a plurality of pixels and each of the plurality of pixels may be electrically connected to a fuse. As was described above, the use of one or more fuses may provide for a more robust device that is tolerant to short faults that may occur for one or more pixels. That is, if a short fault occurs in one pixel, it may not create a catastrophic failure, and the device may continue to function adequately for its intended purpose after the closest fuse to the short opens and electrically isolates a portion of the first light source.

In some embodiments, in the first device as described above that includes a first light source and a first patterned image layer, the first device may further include a second light source disposed on the substrate. The second light source may comprise a third electrode, a fourth electrode disposed over the third electrode, and a second organic layer comprising a second electroluminescent (EL) material disposed between the third and the fourth electrodes. The first device may further include a second patterned image layer disposed between the third and the fourth electrodes, where the second patterned image layer may comprise a material such that it may locally alter the emissive properties of the second organic layer and may have a shape generated from an image. Such embodiments may, for instance provide for multiple images to be displayed by a single device. Exemplary embodiments were described above with reference to FIGS. 26(a) and (b), but embodiments are not so limited. A first image may be provided based on the first patterned image layer (which locally alters portions of the first organic layer), and a second image that may be provided based on the second patterned image layer (which locally alters portions of the second organic layer). It should be understood that, in general, any number of patterned image layers, organic layers, and conductive layers may be used in a device to produce any number of images.

In some embodiments, in the first device as described above that includes a first and second light source and a first and second patterned image layer, the first light source and the second light source may be optically coupled. By having the first and the second OLEDs optically coupled (such that at least some of the light that is emitted from one of the OLEDs may also pass through a section of the other OLED), a viewer may look at one side of the device to perceive multiple images simultaneously (or a single image that comprises the two images created by the first and the second light source). Exemplary embodiments illustrating the first and second light sources optically coupled are shown in FIGS. 26(a) and (b)

and described in detail above. Even though the images may be generated from the same panel, the images may be physically separated in two different layers of the device. Thus, in some embodiments, by tuning the thickness of different layers, a three dimensional (3D) visual effect may be achieved owing to the physical distance between the first and second image layers.

In some embodiments, in the first device as described above that includes a first and second light source and a first and second patterned image layer, the second electrode of the first light source and the third electrode of the second light source may be the same electrode. In some embodiments, the second and third electrodes may be transparent or semi-transparent. By having the second/third conductive layers comprise transparent or semi-transparent materials, embodiments may thereby enable the first and the second OLEDs to be optically coupled (as was noted above). In some embodiments the second and third electrodes may be reflective. While in general it may not be a preferred embodiment to have the second/third conductive layer comprise a reflective material, this may be beneficial in some embodiments such as where the device may have a first image when looked at from one side, and a second image when looked at from a different side. For example, a billboard or other advertising material may comprise two different images for two different advertisements on either side, such that a person on one side of the advertisement may see the first image, and a person on the opposite side may see a second image.

In some embodiments, in the first device as described above that includes a first and second light source and a first and second patterned image layer, the first light source and the second light source may be individually addressable. In this way, some embodiments may enable either one or both of the first and second light sources (comprising one or more OLEDs each) to be in the on-state at a given time. Embodiments of the device may thereby display either one or both of the images associated with each OLED device. Embodiments may include not only configurations where the first and second light sources are optically coupled (e.g. the first light source is disposed over the second light source, or vice versa), but also designs where the first and second light sources may be adjacent to one another. Examples of this embodiment are shown in FIGS. 27(a) and (b) and described above. In some embodiments, the first light source and the second light source may be commonly addressable. That is, in some embodiments, the first light source and the second light source may both either be in the on-state or the off-state, and the images associated with each may not be displayed separately.

In some embodiments, in the first device as described above that includes a first and second light source and a first and second patterned image layer, the first organic layer and the second organic layer comprise the same organic EL material. An example of this is shown and described with respect to FIGS. 27(a) and (b). As shown therein, embodiments may provide for side-by-side devices, such that different images may be displayed on different parts of the device. This may provide advantages for certain embodiments, such as enabling (with additional circuitry that may address and/or control each of the portions of the device) dynamic images that may appear to move across the device as different devices are energized and de-energized.

In some embodiments, the patterning of electrodes to display multiple images (e.g. as depicted in FIGS. 27(a) and (b)) may be combined with the integration of multiple patterned image layers (e.g. as depicted in FIGS. 26(a) and (b)), to create richer display content and visual effect, including motion effect and/or 3D effect.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

A recitation of "a", "an" or "the" is intended to mean "one or more" unless specifically indicated to the contrary.

What is claimed is:

1. A method comprising:
   depositing a first conductive layer over a substrate;
   depositing a first organic layer comprising electroluminescent material over the first conductive layer;
   depositing a first patterned image layer over some but not all of the first conductive layer,
   wherein the first patterned image layer comprises at least one of: a down conversion material and an emissive material, and
   wherein the first patterned image layer locally alters the emissive properties of the first organic layer, and wherein the shape of the first patterned image layer is based on a non-uniform visual image; and
   depositing a second conductive layer over the first organic layer.

2. The method of claim 1, wherein depositing the first patterned image layer comprises any one of: vacuum thermal evaporation (VTE), ink jet printing. e-beam evaporation, plasma enhanced chemical vapor deposition (PECVD), low pressure chemical vapor deposition (LPCVD), photolithography, or laser etching.

3. The method of claim 1, further comprising the step of obtaining the non-uniform visual image in a digitized form.

4. The method of claim 3, wherein the step of obtaining the non-uniform visual image comprises:
   obtaining a continuous-tone image; and
   simulating the continuous-tone image through digitized dots varying in size, geometric shape, and/or spacing.

5. The method of claim 3, further comprising the step of obtaining a patterned mask layout based on the digitized image;
   wherein depositing the first patterned image layer comprises depositing the first patterned image layer through the patterned mask layout.

6. The method of claim 1, wherein the first organic layer is deposited so as to define a plurality of pixels;
   wherein each of the plurality of pixels comprises at least two sub-pixels: a first sub-pixel and a second sub-pixel;
   wherein each sub-pixel comprises an emitting material having an emissive spectrum with a peak wavelength; and
   wherein, for at least one of the plurality of pixels, the peak wavelength of the emissive spectrum of the emitting material of each sub-pixel is different.

7. The method of claim 6, wherein each of the plurality of pixels further comprises a third sub-pixel;
   wherein the first sub-pixel comprises an emitting material having an emissive spectrum with a peak wavelength between approximately 400 and 500 nm;
   wherein the second sub-pixel comprises an emitting material having an emissive spectrum with a peak wavelength between approximately 500 and 580 nm; and wherein the third sub-pixel comprises an emitting material having an emissive spectrum with a peak wavelength between approximately 580 and 750 nm;
wherein the first, the second, and the third sub-pixels of each of the plurality of pixels each has a modified emitting area;
wherein the modified emitting areas of the first sub-pixel of at least two of the pixels are different;
wherein the modified emitting area of the second sub-pixel of at least two of the pixels are different; and
wherein the modified emitting areas of the third sub-pixel of at least two of the pixels are different.

8. The method of claim 6,
wherein each of the plurality of pixels further comprises a third sub-pixel;
wherein the first sub-pixel comprises an emitting material having an emissive spectrum with a peak wavelength between approximately 400 and 500 nm;
wherein the second sub-pixel comprises an emitting material having an emissive spectrum with a peak wavelength between approximately 500 and 580 nm;
wherein the third sub-pixel comprises an emitting material having an emissive spectrum with a peak wavelength between approximately 580 and 750 nm;
wherein each of the first, the second, and the third sub-pixel has a device footprint;
wherein the device footprint of the first sub-pixel of each of the plurality of pixels is substantially the same;
wherein the device footprint of the second sub-pixel of each of the plurality of pixels is substantially the same; and
wherein the device footprint of the third sub-pixel of each of the plurality of pixels is substantially the same.

9. The method of claim 6,
wherein each of the plurality of pixels further comprises a third sub-pixel;
wherein the first sub-pixel comprises an emitting material having an emissive spectrum with a peak wavelength between approximately 400 and 500 nm;
wherein the second sub-pixel comprises an emitting material having an emissive spectrum with a peak wavelength between approximately 500 and 580 nm;
wherein the third sub-pixel comprises an emitting material having an emissive spectrum with a peak wavelength between approximately 580 and 750 nm;
wherein the first, the second, and the third sub-pixels each has a modified emitting area; and
wherein for at least one of the plurality of pixels:
the modified emitting area of the first sub pixel is different from the modified emitting area of each of the second sub-pixel and the third sub-pixel; and
the modified emitting area of the second sub-pixel is different from the modified emitting area of the third sub-pixel.

10. The method of claim 6,
wherein each of the plurality of pixels further comprises a third sub-pixel;
wherein the first sub-pixel comprises an emitting material having an emissive spectrum with a peak wavelength between approximately 400 and 500 nm;
wherein the second sub-pixel comprises an emitting material having an emissive spectrum with a peak wavelength between approximately 500 and 580 nm;
wherein the third sub-pixel comprises an emitting material having an emissive spectrum with a peak wavelength between approximately 580 and 750 nm;
wherein the first, the second, and the third sub-pixels each has a modified emitting area;
wherein each pixel comprises a total modified emitting area that comprises the modified emitting areas of the first, the second, and the third sub-pixels of the pixel, and
wherein the total modified emitting area of at least one pixel is different than the total modified emitting area of at least one other pixel.

11. The method of claim 6, further comprising the steps of:
determining a working condition of the first device;
obtaining CIE coordinates and voltage-luminance relationships at the determined working condition of the first and the second sub-pixels; and
determining a target white point for the first device.

12. The method of claim 1, further comprising the steps of:
depositing a third conductive layer;
depositing a second organic layer comprising electroluminescent material over the third conductive layer;
depositing a second patterned image layer over some but not all of the third conductive layer, wherein the second patterned image layer locally alters the emissive properties of the second organic layer, and wherein the shape of the second patterned image layer is based on a non-uniform visual image; and
depositing a fourth conductive layer over the second organic layer.

13. The method of claim 12, wherein the steps of depositing the second conductive layer and depositing the third conductive layer comprise the same step.

14. The method of claim 12, wherein at least one of the first and the fourth conductive layers is transparent or semi-transparent.

15. The method of claim 1, wherein the first patterned image layer comprises a plurality of portions; and wherein each portion is isolated from each of the other portions.

16. The method of claim 15,
wherein the plurality of portions of the first patterned image layer are any one of the following:
regularly shaped and irregularly spaced;
irregularly shaped and regularly spaced; or
irregularly shaped and irregularly spaced.

17. The method of claim 1, wherein the shape of the first patterned image layer is deposited so that it has a shape such that light emissions from the first organic layer generate an image;
wherein the image is perceivable by an observer at distance of greater than 10 cm; and
wherein the image is not perceivable by a viewer at distance of less than 1 cm.

18. A first device, comprising:
a substrate;
a first light source disposed on the substrate, wherein the first light source comprises:
a first electrode;
a second electrode disposed over the first electrode; and
a first organic layer comprising an organic electroluminescent (EL) material disposed between the first and the second electrodes;
a first patterned image layer disposed between the first and the second electrode,
a second light source disposed on the substrate and in optical communication with the first light source, wherein the second light source comprises:
a third electrode;
a fourth electrode disposed over the third electrode; and
a second organic layer comprising an EL material disposed between the third and the fourth electrodes; and a second patterned image layer disposed between the third and the fourth electrode;

wherein the first patterned image layer comprises a material such that it locally alters the emissive properties of the first organic EL material, wherein the second patterned image layer comprises a material such that it locally alters the emissive properties of the second organic EL material, wherein the first patterned image layer has a first shape generated from a first non-uniform visual image, and wherein the second patterned image layer has a second shape generated from a second non-uniform visual image.

19. The first device of claim 18, wherein the first device comprises a plurality of equally sized regions; wherein the first patterned image layer comprises a plurality of N different portions;

wherein each of the N different patterns fits within one of the equally sized wherein each of the N different patterns correspond to one of N different luminous intensities; and wherein one of the N different patterns is present in each region.

* * * * *